US012707656B2

(12) United States Patent
Frougier et al.

(10) Patent No.: US 12,707,656 B2
(45) Date of Patent: Aug. 11, 2026

(54) CO-INTEGRATION OF GATE-ALL-AROUND NANOSHEET LOGIC DEVICE AND PRECISION MOL RESISTOR

(71) Applicant: International Business Machines Corporation, Armonk, NY (US)

(72) Inventors: Julien Frougier, Albany, NY (US); Sagarika Mukesh, Albany, NY (US); Anthony I. Chou, Guilderland, NY (US); Andrew M. Greene, Slingerlands, NY (US); Ruilong Xie, Niskayuna, NY (US); Nicolas Jean Loubet, Guilderland, NY (US); Veeraraghavan S. Basker, Fremont, CA (US); Junli Wang, Slingerlands, NY (US); Effendi Leobandung, Stormville, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 631 days.

(21) Appl. No.: 17/853,293

(22) Filed: Jun. 29, 2022

(65) Prior Publication Data

US 2024/0006467 A1 Jan. 4, 2024

(51) Int. Cl.

| | |
|---|---|
| ***H10D 1/47*** | (2025.01) |
| ***H10D 30/67*** | (2025.01) |

(Continued)

(52) U.S. Cl.

CPC ......... *H10D 1/474* (2025.01); *H10D 30/6735* (2025.01); *H10D 30/6757* (2025.01); *H10D 62/118* (2025.01); *H10D 84/811* (2025.01)

(58) Field of Classification Search

CPC ............... H10D 1/474; H10D 30/6735; H10D 30/6757; H10D 62/118; H10D 84/811;

(Continued)

(56) References Cited

U.S. PATENT DOCUMENTS

| | | | |
|---|---|---|---|
| 6,700,161 | B2 | 3/2004 | Hsu et al. |
| 7,183,593 | B2 | 2/2007 | Yeo et al. |

(Continued)

OTHER PUBLICATIONS

Kumari and Prithvi (2022), Device and circuit-level performance comparison of GAA nanosheet FET with varied geometrical parameters, Microelectronics Journal, vol. 125, 2022, 105432, ISSN 1879-2391, https://doi.org/10.1016/j.mejo.2022.105432 (Year: 2022).*

*Primary Examiner* — William B Partridge
*Assistant Examiner* — Ilker Ozden
(74) *Attorney, Agent, or Firm* — Scully, Scott, Murphy & Presser, P.C.; L. Jeffrey Kelly, Esq.

(57) ABSTRACT

A semiconductor structure that includes a nanosheet logic device (i.e., nFET and/or pFET) co-integrated with a precision middle-of-the-line (MOL) resistor is provided. The precision MOL resistor is located over a nanosheet device and is present in at least one resistor device region of a semiconductor substrate. The at least one resistor device region can include a first resistor device region in which the MOL resistor is optimized for low capacitance and/or a second resistor device region in which the MOL resistor is optimized for low self-heating.

18 Claims, 65 Drawing Sheets

102

Y2 Y3
Fin
GS2
GS2
GS2
X2
X2
Fin
Y2 Y3

(51) Int. Cl.
*H10D 62/10* (2025.01)
*H10D 84/80* (2025.01)

(58) Field of Classification Search
CPC ...... H10D 62/822; H10D 1/47; H10D 30/014; H10D 30/43; H10D 62/121; H10D 62/371; H10D 64/017; B82Y 10/00
See application file for complete search history.

(56) References Cited

U.S. PATENT DOCUMENTS 8,124,490 B2 2/2012 Lin et al.
8,555,216 B2 10/2013 Iben et al.
8,796,772 B2 8/2014 Yeh et al.
9,685,434 B2 6/2017 Cheng et al.
9,793,263 B1 10/2017 Balakrishnan et al.
9,991,328 B2 6/2018 Bi et al.
10,629,589 B2 4/2020 Bi et al.
11,201,152 B2 12/2021 Xie et al.
11,217,578 B2 1/2022 Shin et al.
2009/0051008 A1* 2/2009 Shin ..................... H10D 1/47 257/536
2016/0020148 A1* 1/2016 Song ..................... H10D 84/0149 438/238
2016/0307887 A1* 10/2016 Song ..................... H10D 84/811
2018/0211952 A1* 7/2018 Shin ..................... H01L 23/5226
2019/0326286 A1 10/2019 Xie et al.
2021/0066193 A1* 3/2021 Hu ..................... H10W 20/498
2021/0288137 A1* 9/2021 Lin ..................... H10D 89/10
2021/0296254 A1* 9/2021 Shin ..................... H10D 84/83
2022/0208790 A1* 6/2022 Yoon ..................... H10D 62/121

* cited by examiner

CO-INTEGRATION OF GATE-ALL-AROUND NANOSHEET LOGIC DEVICE AND PRECISION MOL RESISTOR

BACKGROUND

The present application relates to semiconductor technology, and more particularly to a semiconductor structure including a nanosheet logic device and at least one precision middle-of-the-line (MOL) resistor co-integrated on a same semiconductor substrate.

A resistor, which is a passive two-terminal electrical component that implements electrical resistance as a circuit element, is one of the most common electrical components present in almost every electrical device. Several types of resistors are known including for example, back-end-of-the-line (BEOL) metal resistors, front-end-of-the-line (FEOL) metal resistors, and MOL resistors. In electronic circuits, resistors can be used to limit current flow, to adjust signal levels, bias active elements, and terminate transition lines.

In recent years, there has been a need for precision MOL resistors that have low capacitance and/or low self-heating. Low capacitance MOL resistors are desired for high speed circuits, while low self-heating is desired for high DC currents. In general, prior MOL resistors exhibit a trade-off between low capacitance and low self-heating. Notably, prior MOL resistors that have low capacitance exhibit high self-heating, while prior MOL resistors that have low self-heating have high capacitance.

SUMMARY

A semiconductor structure that includes a nanosheet logic device (i.e., nFET and/or pFET) co-integrated with a precision MOL resistor is provided. The precision MOL resistor is located over a nanosheet device and is present in at least one resistor device region of a semiconductor substrate. The at least one resistor device region can include a first resistor device region in which the MOL resistor is optimized for low capacitance and/or a second resistor device region in which the MOL resistor is optimized for low self-heating.

In one aspect of the present application, a semiconductor structure is provided. In one embodiment, the semiconductor structure includes a logic device region located in a first portion of a semiconductor substrate, the logic device region including a first gate structure wrapped around a first vertical nanosheet stack of semiconductor channel material nanosheets that is present in the logic device region, a source/drain region extending from sidewalls of each of the semiconductor channel material nanosheets of the first vertical nanosheet stack, and a bottom dielectric isolation layer separating the first gate structure and the source/drain region from the first portion of the semiconductor substrate. The semiconductor structure further includes a first resistor device region located in a second portion of the semiconductor substrate, the first resistor device region including a second gate structure wrapped around a second vertical nanosheet stack of semiconductor channel material nanosheets that is present in the first resistor device region, a bottom dielectric isolation layer separating the second gate structure from the second portion of the semiconductor substrate, and a first metal resistor located above the second gate structure, wherein the second gate structure is a component of a non-functional nanosheet device.

In some embodiments, the semiconductor structure further includes a second resistor device region located in a third portion of the semiconductor substrate, the second resistor device region including a third gate structure wrapped around a third vertical nanosheet stack of semiconductor channel material nanosheets that is present in the second resistor device region, and a second metal resistor located above the third gate structure, wherein the third gate structure includes a source/drain region located beneath the second metal resistor that is present in the second resistor device region and extending outward from sidewalls of each semiconductor channel material nanosheets of the third vertical nanosheet stack.

In embodiments, the source/drain region of the third gate structure extends upward from, and is in direct physical contact with, a surface of a semiconductor sub-fin that is located beneath the third gate structure and the third vertical nanosheet stack. In the present application, the source/drain region present in the second resistor device region drains heat generated by the second metal resistor into the semiconductor substrate that is connected to the semiconductor sub-fin. In the present application, the third gate structure is spaced apart from the semiconductor sub-fin by a discontinuous bottom dielectric isolation layer that is present in the second resistor device region.

In another embodiment, the semiconductor structure includes a logic device region located in a first portion of a semiconductor substrate, the logic device region including a first gate structure wrapped around a first vertical nanosheet stack of semiconductor channel material nanosheets that is present in the logic device region, a source/drain region extending from sidewalls of each of the semiconductor nanosheets of the first vertical nano sheet stack, and a bottom dielectric isolation layer separating the first gate structure and the source/drain region from the first portion of the semiconductor substrate. In this embodiment the semiconductor structure further includes a resistor device region located in a second portion of the semiconductor substrate, the resistor device region including a second gate structure wrapped around a second vertical nanosheet stack of semiconductor channel material nanosheets that is present in the resistor device region, and a metal resistor located above the second gate structure, wherein the second gate structure includes a source/drain region located beneath the metal resistor that is present in the resistor device region and extending outward from sidewalls of each semiconductor channel material nanosheets of the second vertical nanosheet stack.

In embodiments, the source/drain region of the second gate structure extends upward from, and is in direct physical contact with, a surface of a semiconductor sub-fin that is located beneath the second gate structure and the second vertical nanosheet stack. In the present application, the source/drain region present in the resistor device region drains heat generated by the metal resistor into the semiconductor substrate that is connected to the semiconductor sub-fin. In the present application, the second gate structure is spaced apart from the semiconductor sub-fin by a discontinuous bottom dielectric isolation layer that is present in the second resistor device region.

In another aspect of the present application, methods of forming a semiconductor structure are provided. The methods of the present application will be described in greater detail hereinbelow.

DETAILED DESCRIPTION

Figures 1A, 1B, 1C:
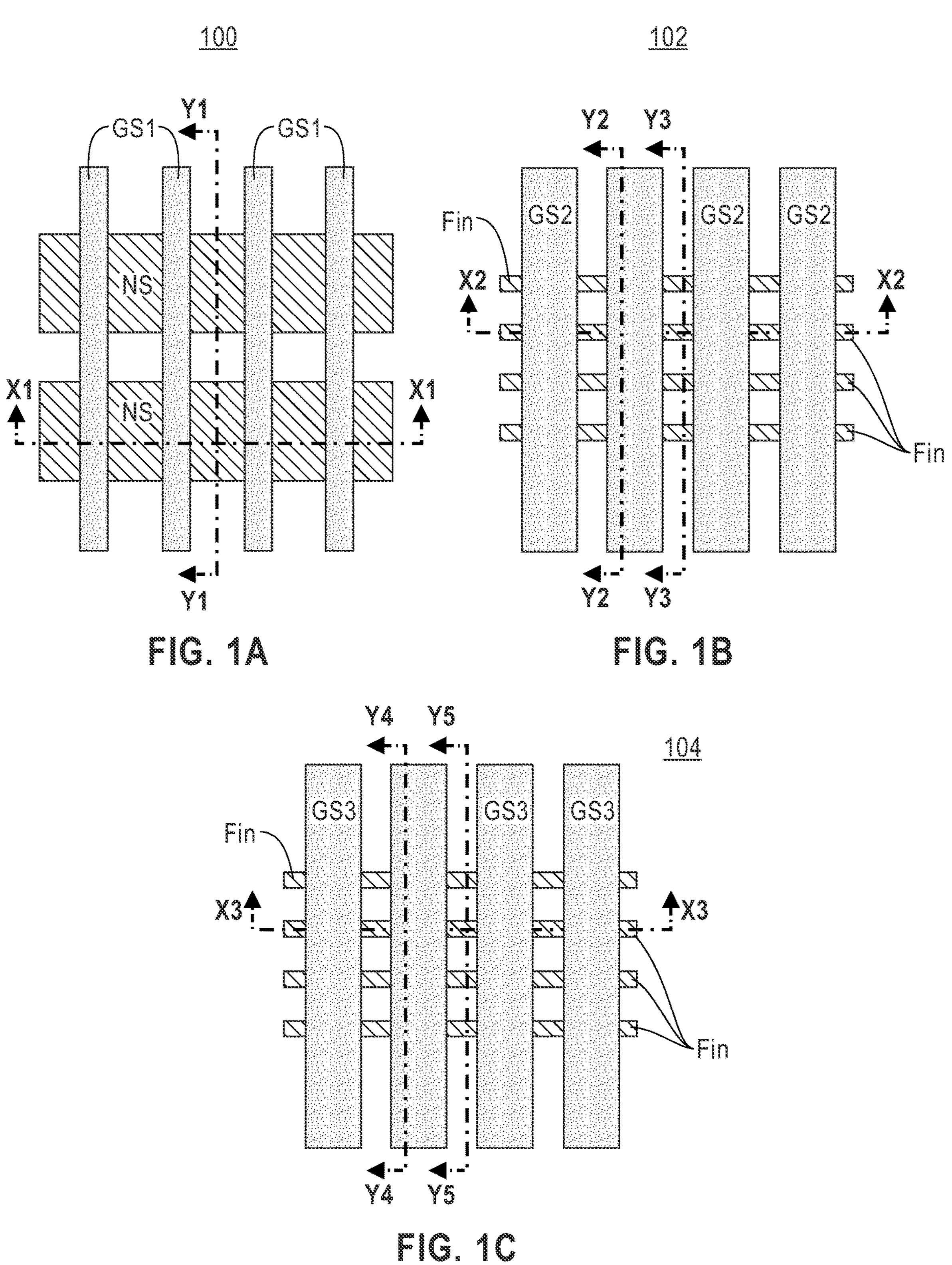
FIG. 1A is a top down view of an exemplary semiconductor device layout in a logic device region of a semiconductor substrate, the semiconductor device layout in the logic device region includes a plurality of first vertically stacked semiconductor channel material nanosheets oriented along a first direction, and a plurality of first gate structures that are oriented in a second direction which is perpendicular to the first direction.
FIG. 1B is a top down view of an exemplary semiconductor device layout in a first resistor device region of the semiconductor substrate, the semiconductor device layout in the first resistor device region includes a plurality of semiconductor sub-fins oriented along a first direction, and a plurality of second gate structures that are oriented in a second direction which is perpendicular to the first direction.
FIG. 1C is a top down view of an exemplary semiconductor device layout in a second resistor device region of the semiconductor substrate, the semiconductor device layout in the second resistor device region includes a plurality of semiconductor sub-fins oriented along a first direction, and a plurality of third gate structures that are oriented in a second direction which is perpendicular to the first direction.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The present application provides a semiconductor structure including a nanosheet logic device located in a logic device region of a semiconductor substrate and a precision MOL resistor located over a nanosheet device and in at least one resistor device region of the semiconductor substrate. In embodiments of the present application, the at least one resistor device region can include a first resistor device region in which the MOL resistor is optimized for low capacitance, a second resistor device region in which the MOL resistor is optimized for low self-heating, or a combination of the first resistor device region and the second resistor device region. The low capacitance MOL resistor that can be formed in the first resistor device region is located over a first nanosheet device that is devoid of any S/D region; the first nanosheet device is present on a semiconductor sub-fin that is present in the first resistor device region. The low self-heating MOL resistor that can be formed in the second resistor device region is located over a second nanosheet device that has a S/D region; the second nanosheet device and the S/D region are both located on a semiconductor sub-fin that is present in the second resistor device region.

Before discussing the semiconductor structure of the present application in greater detail, reference is first made to FIGS. 1A, 1B and 1C which are top down views of an exemplary semiconductor device layout in a logic device region 100, an exemplary semiconductor device layout in a first resistor device region 102, and an exemplary semiconductor device layout in a second resistor device region 104, respectively, that will be used in the present application to describe the semiconductor structure in each of logic device region 100, the first resistor device region 102 and the second resistor device region 104 during various processing steps of the present application. It is noted that the semiconductor structure includes the logic device region 100 and at least one of the resistor device regions shown in FIGS. 1B and 1C, i.e., the first resistor device region 102 shown in FIG. 1B, the second resistor device region 104 shown in FIG. 1C, or both the first resistor device region 102 shown in FIG. 1B and the second resistor device region 104 shown in FIG. 1C. The various device regions, i.e., the logic device region 100, the first resistor device region 102 and the second resistor device region 104, can be located adjacent to each other and can be separated from each other by one or more dielectric isolation structures. The various device regions, i.e., the logic device region 100, the first resistor device region 102 and the second resistor device region 104, can be arranged in any sequence not just the sequence illustrated in FIGS. 1A, 1B and 1C in which the logic device region 100 is located to the left of the first resistor device region 102, and the second resistor device region 104 is located to the right of the first resistor device region 102.

Referring to the semiconductor device layout in the logic device region 100 illustrated in FIG. 1A, this illustrated device layout includes a plurality of first vertically stacked semiconductor channel material nanosheets, NS, oriented along a first direction, and a plurality of first gate structures, GS1, that are oriented in a second direction which is perpendicular to the first direction. FIG. 1A illustrates cut X1-X1 which is a cross gate cut through one of the vertically stacked nanosheets (NS) present in the logic device region 100, and cut Y1-Y1 which is a cross semiconductor sub-fin cut in one of the source/drain regions present in the logic device region 100.

Referring to the semiconductor device layout in the first resistor device region 102 illustrated in FIG. 1B, this illustrated device layout includes a plurality of semiconductor sub-fins, Fin, oriented along a first direction, and a plurality of second gate structures, GS2, that are oriented in a second direction which is perpendicular to the first direction. FIG. 1B illustrates cut X2-X2 which is a cross gate cut through one of the semiconductor sub-fins, Fin, present in the first resistor device region 102, cut Y2-Y2 which is a cross semiconductor sub-fin cut through one of the second gate structures, GS2, present in the first resistor device region 102, and cut Y3-Y3 which is a cross semiconductor sub-fin cut through one of the S/D regions present in the first resistor device region 102.

Referring to the semiconductor device layout in the second resistor device region 104 illustrated in FIG. 1C, this illustrated device layout includes a plurality of semiconductor sub-fins, Fin, oriented along a first direction, and a plurality of third gate structures, GS3, that are oriented in a second direction which is perpendicular to the first direction. FIG. 1C illustrates cut X3-X3 which is a cross gate cut through one of the semiconductor sub-fins, Fin, present in the second resistor device region 104, cut Y4-Y4 which is a cross semiconductor sub-fin cut through one of the third gate structures, GS3, present in the second resistor device region 104, and cut Y5-Y5 which is a cross semiconductor sub-fin cut through one of the S/D regions present in the second resistor device region 104.

Regarding the remaining drawings of the present application, and by way of reference, each of FIGS. 2A, 3A, 4A, 5A, . . . 17A is along cut X1-X1 shown in FIG. 1A, each of FIGS. 2B, 3B, 4B, 5B, . . . 17B is along cut Y1-Y1 shown in FIG. 1A, each of FIGS. 2C, 3C, 4C, 5C, . . . 17C is along cut Y3-Y3 shown in FIG. 1B, each of FIGS. 2D, 3D, 4D, 5D, . . . 17D is along cut X2-X2 shown in FIG. 1B, each of FIGS. 2E, 3E, 4E, 5E, . . . 17E is along cut Y2-Y2 shown in FIG. 1B, each of FIGS. 2F, 3F, 4F, 5F, . . . 17F is along cut Y5-Y5 shown in FIG. 1C, each of FIGS. 2G, 3G, 4G, 5G, . . . 17G is along cut X3-X3 shown in FIG. 1C, and each of FIGS. 2H, 3H, 4H, 5H, . . . 17H is along cut Y4-Y4 shown in FIG. 1C. It is again emphasized that the present application is not limited to a structure that includes the first resistor device region 102 and the second resistor device region 104, but instead the structure must contain at least one of those resistor device regions co-integrated with the logic device region 100 on a same semiconductor substrate.

Figure 2B:
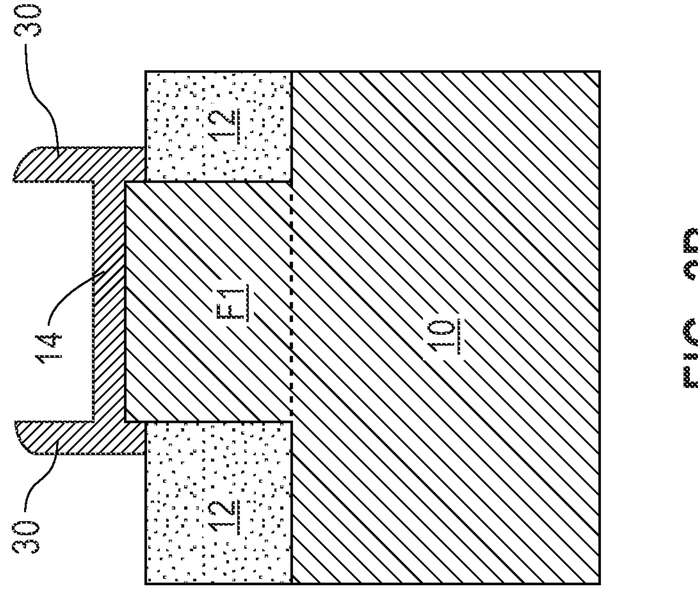
FIGS. 2A and 2B are cross sectional views of an exemplary structure in the logic device region along X1-X1 and Y1-Y1 shown in FIG. 1A, respectively, that can be employed in the present application, the exemplary structure in the logic device region includes a plurality of material stacks including alternating sacrificial semiconductor material nanosheets and semiconductor channel material nanosheets stacked one atop the other and located on a bottom dielectric isolation layer, a hard mask capped sacrificial gate structure located on each material stack, a dielectric spacer located laterally adjacent to the sacrificial gate structure, and an inner spacer located laterally adjacent to each sacrificial semiconductor material nanosheet.
Figure 2A:
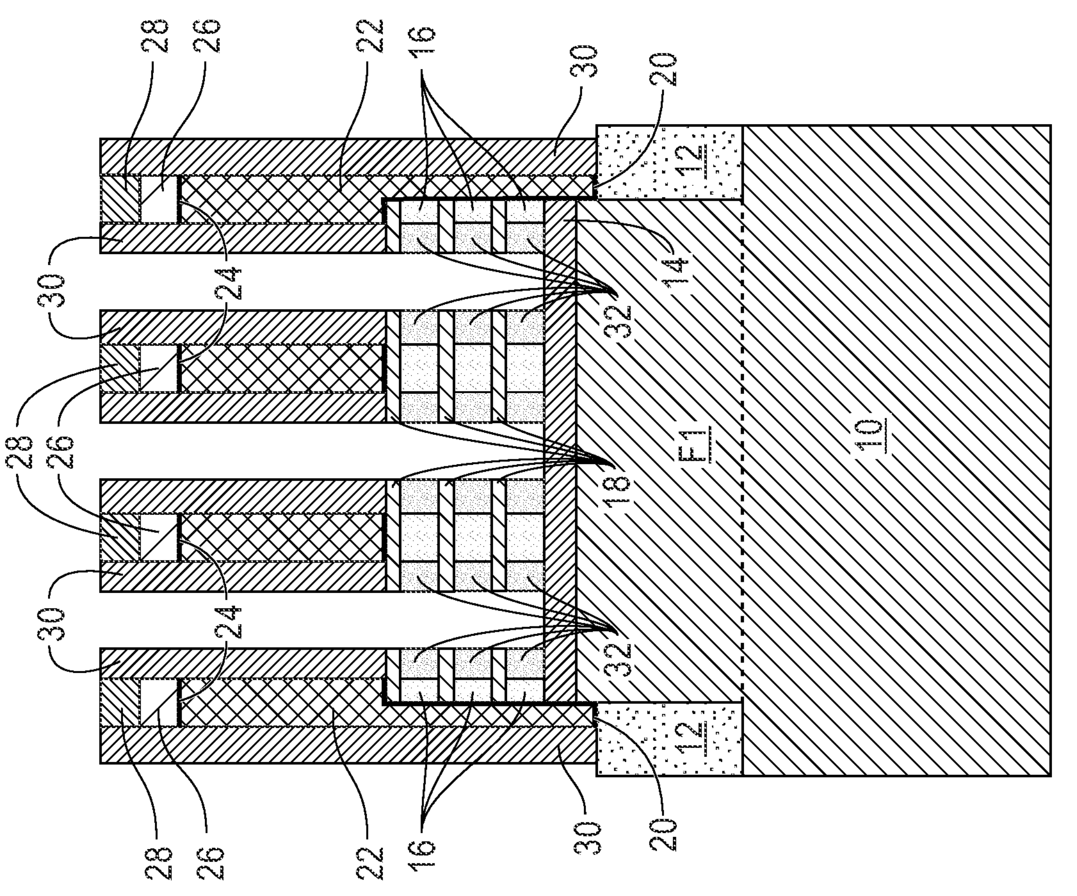

Referring first to FIGS. 2A and 2B, there are illustrated an exemplary structure in the logic device region 100 along X1-X1 and Y1-Y1 shown in FIG. 1A, respectively, that can be employed in accordance with an embodiment of the present application. The exemplary structure in the logic device region 100 includes a plurality of material stacks including alternating sacrificial semiconductor material nanosheets 16 and semiconductor channel material nanosheets 18 stacked one atop the other and located on a bottom dielectric isolation layer 14. The bottom dielectric isolation layer 14 that is present in the logic device region 100 is located on a first semiconductor sub-fin, F1, which is laterally surrounded by a trench dielectric isolation structure 12. The term "semiconductor sub-fin" is used throughout the present application to denote a mesa portion of the semiconductor substrate 10 that is formed during the etching of the trench that houses the trench dielectric isolation structure 12; the semiconductor sub-fin is a vertical extension of the semiconductor substrate 10. Typically, a plurality of first semiconductor sub-fins, F1, are present in the logic device region 100. The first semiconductor sub-fin, F1, extends upward from a surface of a semiconductor substrate 10. In FIGS. 2A-2B, a dotted line is shown to mark the bottom of the trench dielectric isolation structure 12 and to illustrate the height of the first semiconductor sub-fin, F1; in subsequent processing steps, and for clarity, this dotted line is omitted from the drawings.

The exemplary structure shown in the logic device region 100 and as is further illustrated in FIGS. 2A-2B, further includes a hard mask capped sacrificial gate structure (i.e., a sacrificial gate structure that is capped with a hard mask cap) located on each material stack. The hard mask capped sacrificial gate structure can include a sacrificial gate dielectric material layer 20, a sacrificial gate material layer 22, and a hard mask cap. In the drawings, the hard mask cap is illustrated as containing a first hard mask material layer 24, a second hard mask material layer 26, and a third hard mask material layer 28. While three hard mask material layers are described and illustrated, the present application is not limited to utilizing a hard mask cap that contains three hard mask material layers. Instead, the hard mask cap can include one hard mask material layer, two hard mask material layers, or greater than three hard mask material layers. In some embodiments, the hard mask cap can be omitted from atop the sacrificial gate structure.

The exemplary structure shown in the logic device region 100 and as is further illustrated in FIGS. 2A-2B, further includes a dielectric spacer 30 located laterally adjacent to the sacrificial gate structure, and an inner spacer 32 located laterally adjacent to each sacrificial semiconductor material nanosheet 16. Note, and is illustrated in FIG. 2B, the dielectric spacer 30 extends upward from each of the ends of the bottom dielectric isolation layer 14.

Figure 2C:
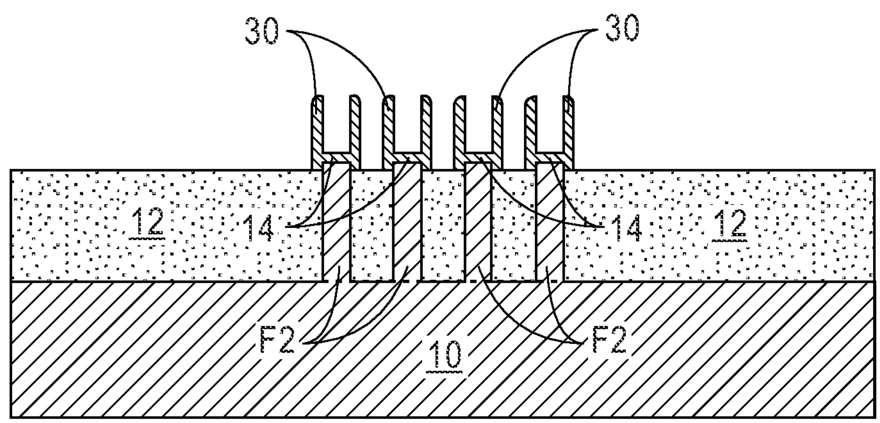
FIGS. 2C, 2D and 2E are cross sectional views of an exemplary structure in the first resistor device region along Y3-Y3, X2-X2 and Y2-Y2 shown in FIG. 1B respectively, that can be employed in the present application, the exemplary structure in the first resistor device region includes a plurality of material stacks including alternating sacrificial semiconductor material nanosheets and semiconductor channel material nanosheets stacked one atop the other and located on a bottom dielectric isolation layer, a hard mask capped sacrificial gate structure located on each material stack, a dielectric spacer located laterally adjacent to the sacrificial gate structure, and an inner spacer located laterally adjacent to each sacrificial semiconductor material nanosheet.
Figure 2D:
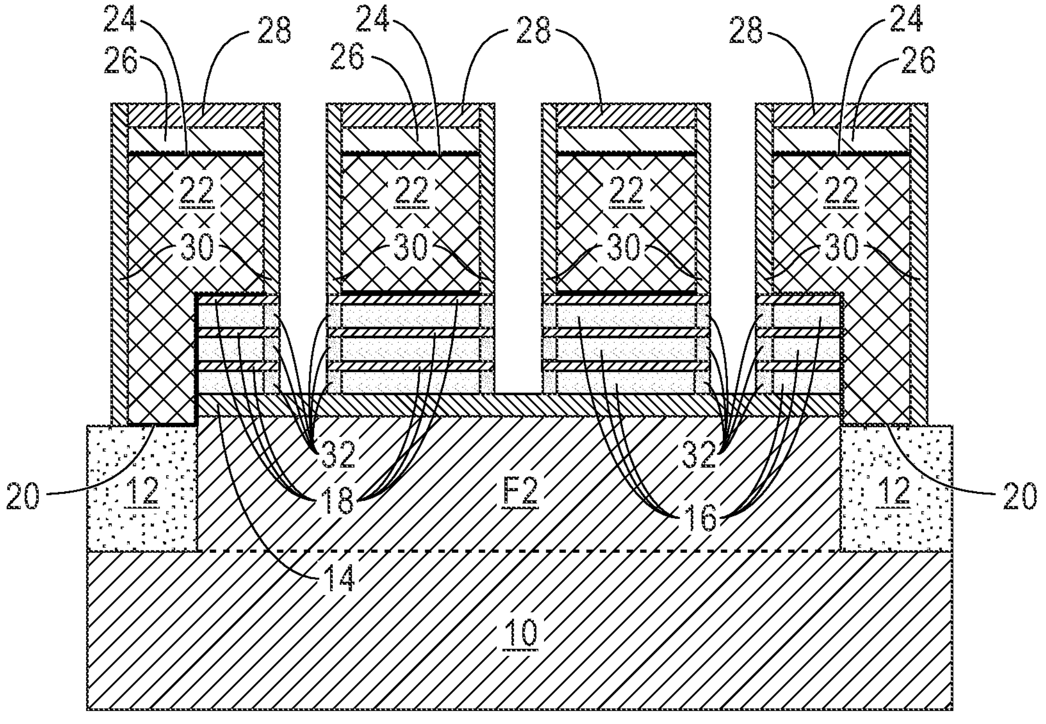
Figure 2E:
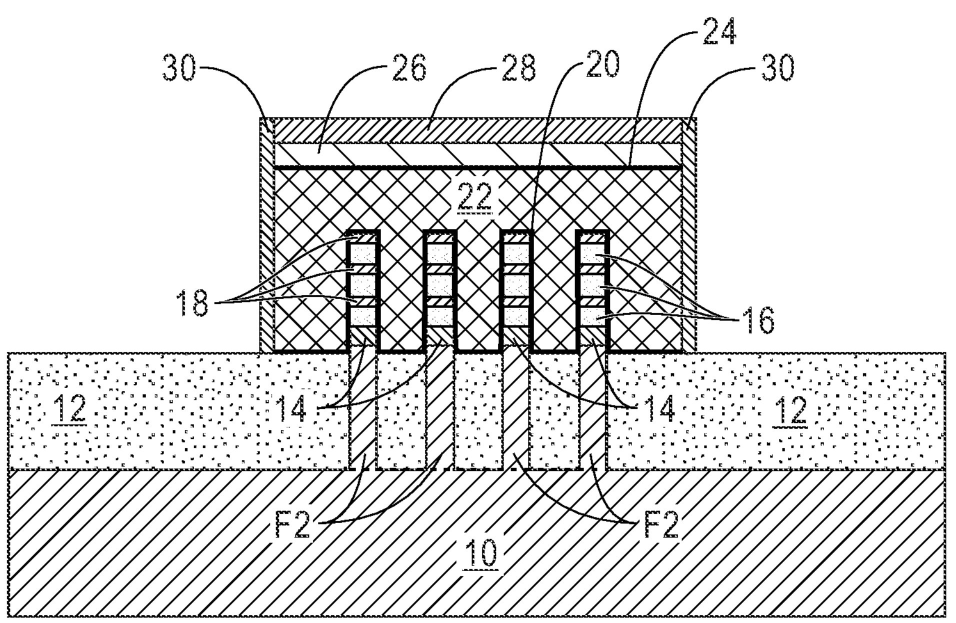

Referring now to FIGS. 2C, 2D and 2E, there are illustrated an exemplary structure in the first resistor device region 102 along Y3-Y3, X2-X2 and Y2-Y2, respectively, that can be used in the present application. In some embodiments, this first resistor device region 102 can be omitted. In such an embodiment, the logic device region 100 and the second resistor device region 104 are present without this first resistor device region 102 being present.

The exemplary structure in the first resistor device region 102 includes a plurality of material stacks including alternating sacrificial semiconductor material nanosheets 16 and semiconductor channel material nanosheets 18 stacked one atop the other and located on a bottom dielectric isolation layer 14. The bottom dielectric isolation layer 14 that is present in the first resistor device region 102 is located on a second semiconductor sub-fin, F2, which is laterally surrounded by a trench dielectric isolation structure 12. Typically, a plurality of second semiconductor sub-fins, F2, are present in the first resistor device region 102. The second semiconductor sub-fin, F2, extends upward from semiconductor substrate 10. In FIGS. 2C-2E, a dotted line is shown to mark the bottom of the trench dielectric isolation structure 12 and to illustrate the height of the second semiconductor sub-fin, F2; in subsequent processing steps, and for clarity, this dotted line is omitted from the drawings.

The exemplary structure shown in the first resistor device region 102 and as is further illustrated in FIGS. 2C, 2D and 2E, further includes a hard mask capped sacrificial gate structure located on each material stack. The hard mask capped sacrificial gate structure can include a sacrificial gate dielectric material layer 20, a sacrificial gate material layer 22, and a hard mask cap. In the drawings, the hard mask cap is illustrated as containing a first hard mask material layer 24, a second hard mask material layer 26, and a third hard mask material layer 28. While three hard mask material layers are described and illustrated, the present application is not limited to utilizing a hard mask cap that contains three hard mask material layers. Instead, the hard mask cap can include one hard mask material layer, two hard mask material layers, or greater than three hard mask material layers. In some embodiments, a hard mask cap can be omitted from atop the sacrificial gate structure.

The exemplary structure shown in the first resistor device region 102 and as is further illustrated in FIGS. 2C, 2D and 2E, further includes a dielectric spacer 30 located laterally adjacent to the sacrificial gate structure, and an inner spacer 32 located laterally adjacent to each sacrificial semiconductor material nanosheet 16. Note, and is illustrated in FIG. 2C, the dielectric spacer 30 extends upward from each of the ends of the bottom dielectric isolation layer 14.

Figure 2F:
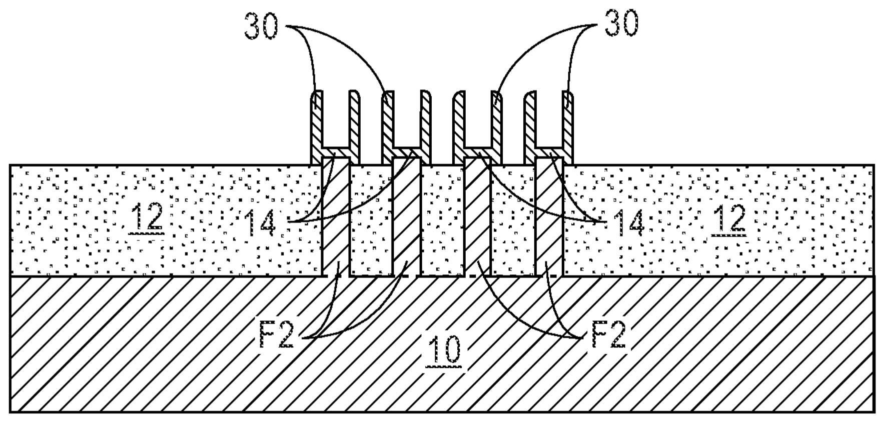
FIGS. 2F, 2G and 2H are cross sectional views of an exemplary structure in the second resistor device region along Y5-Y5, X3-X3 and Y4-Y4 shown in FIG. 1C respectively, that can be employed in the present application, the exemplary structure in the second resistor device region includes a plurality of material stacks including alternating sacrificial semiconductor material nanosheets and semiconductor channel material nanosheets stacked one atop the other and located on a bottom dielectric isolation layer, a hard mask capped sacrificial gate structure located on each material stack, a dielectric spacer located laterally adjacent to the sacrificial gate structure, and an inner spacer located laterally adjacent to each sacrificial semiconductor material nanosheet.
Figure 2G:
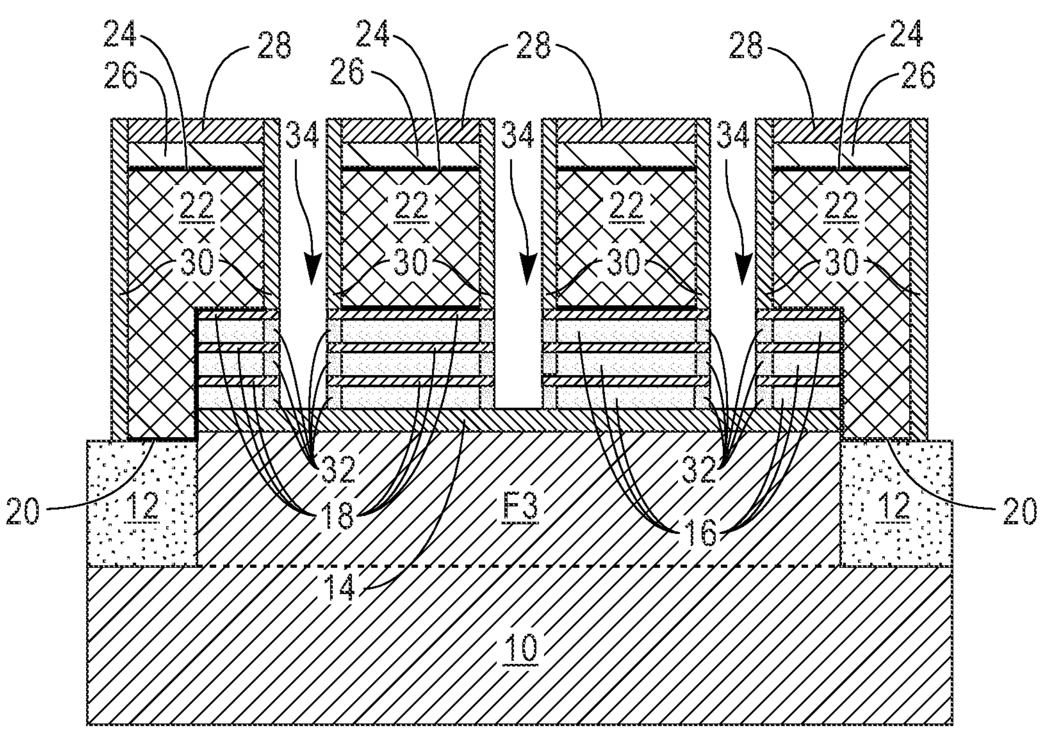
Figure 2H:
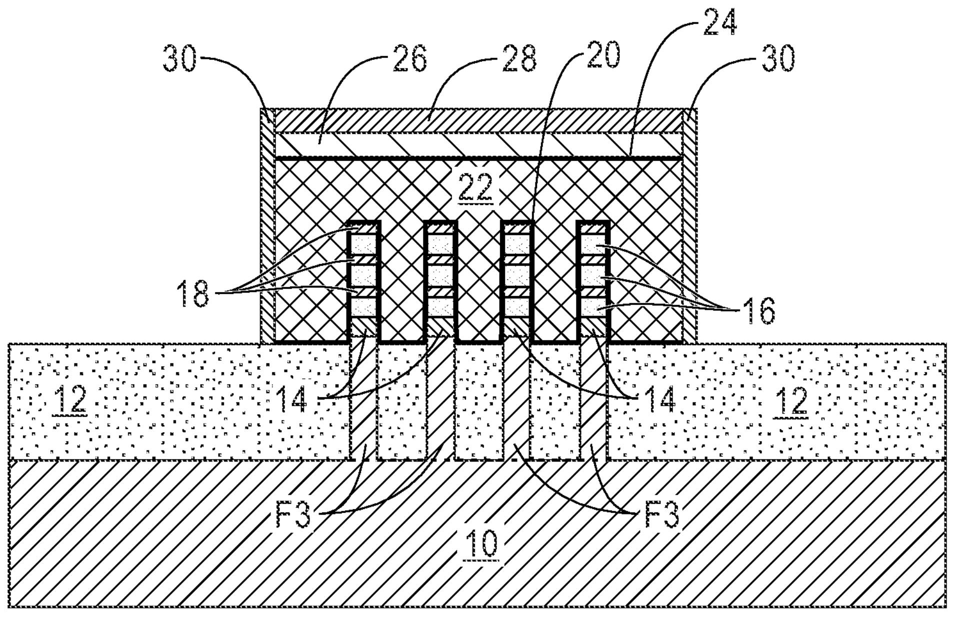
Figure 3B:
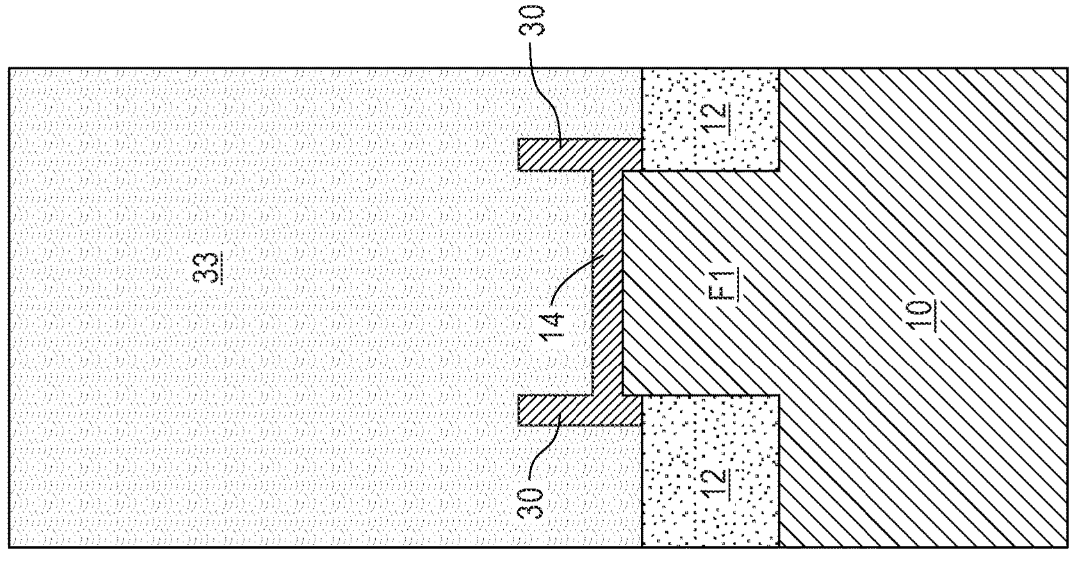
FIGS. 3A-3H are cross sectional views of the exemplary structures shown in FIGS. 2A-2H, respectively, after forming a mask protecting the exemplary structure in the logic device region and the exemplary structure in the first resistor device region, and removing exposed portions of the bottom dielectric isolation layer in the second resistor device region to provide a punch through region, note no mask is formed in the second resistor device region.
Figure 3A:
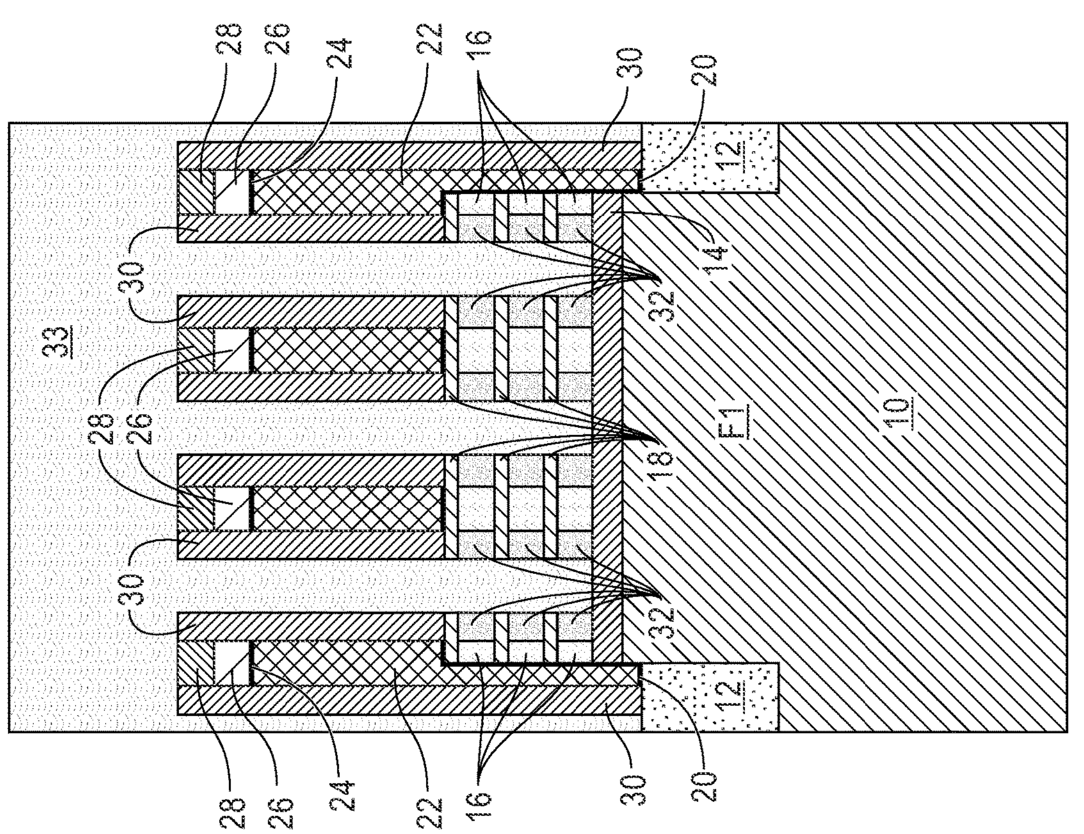
Figure 3C:
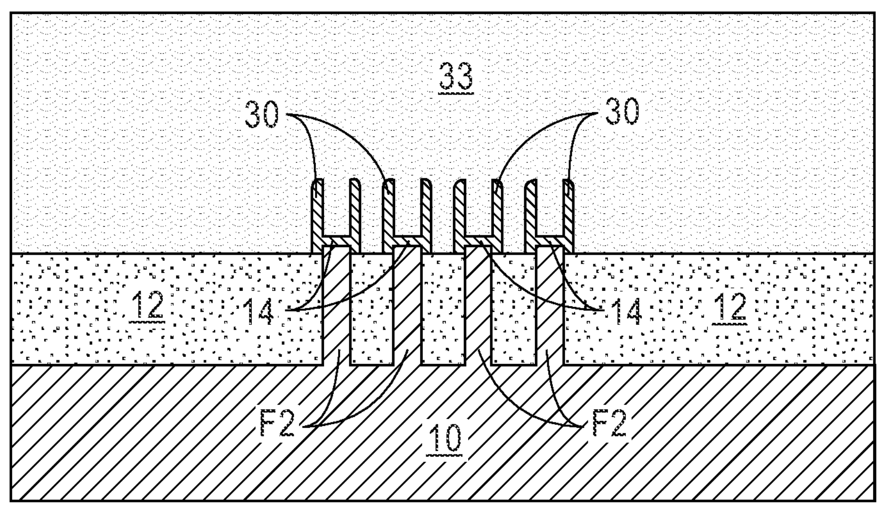
Figure 3D:
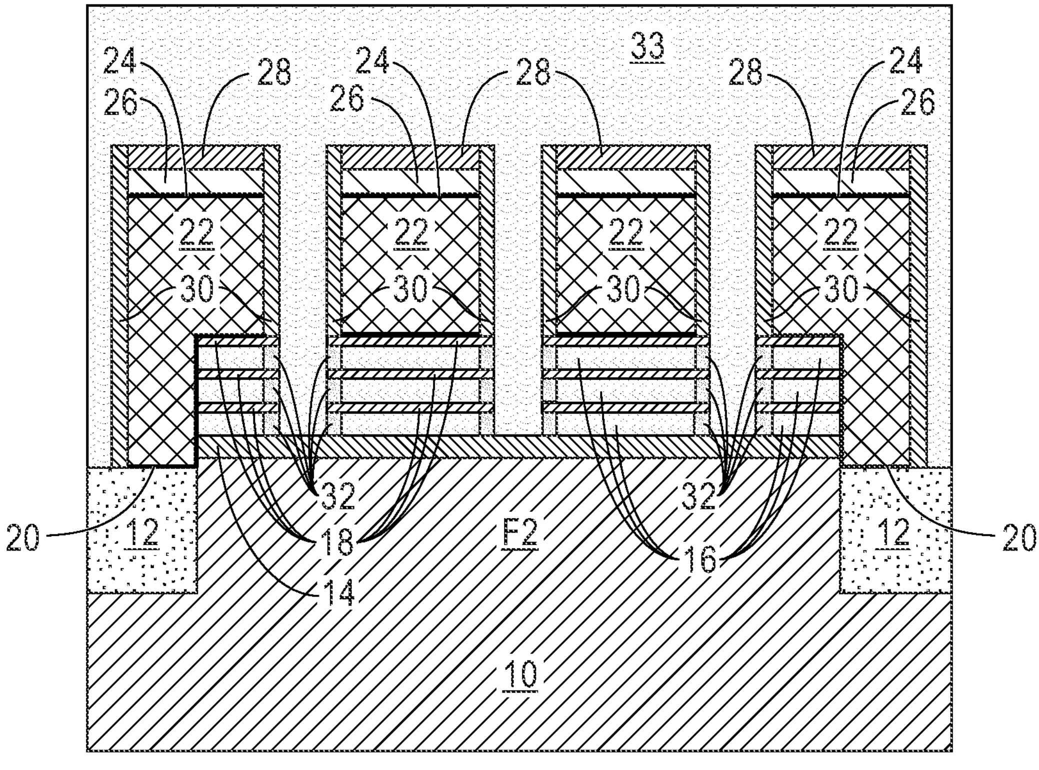
Figure 3E:
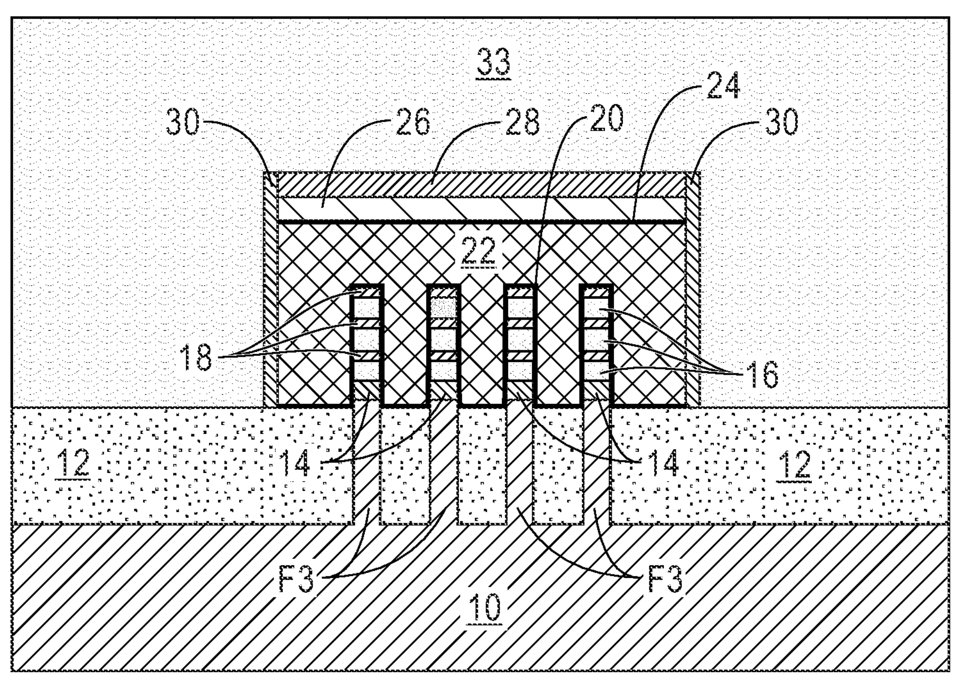
Figure 3F:
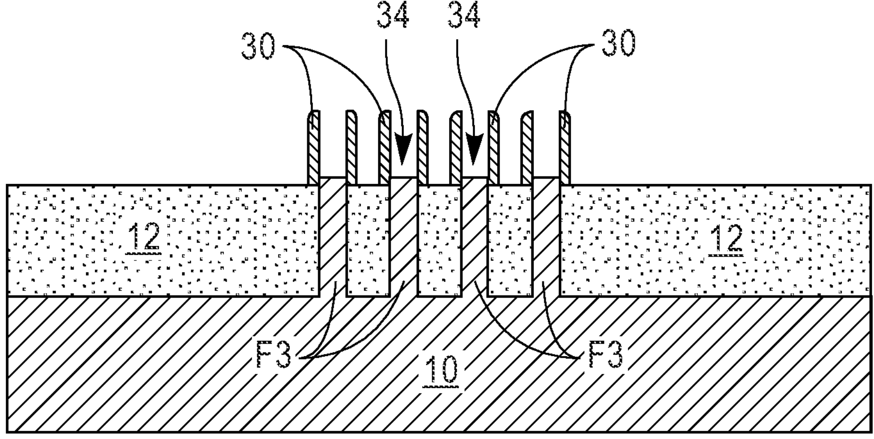
Figure 3G:
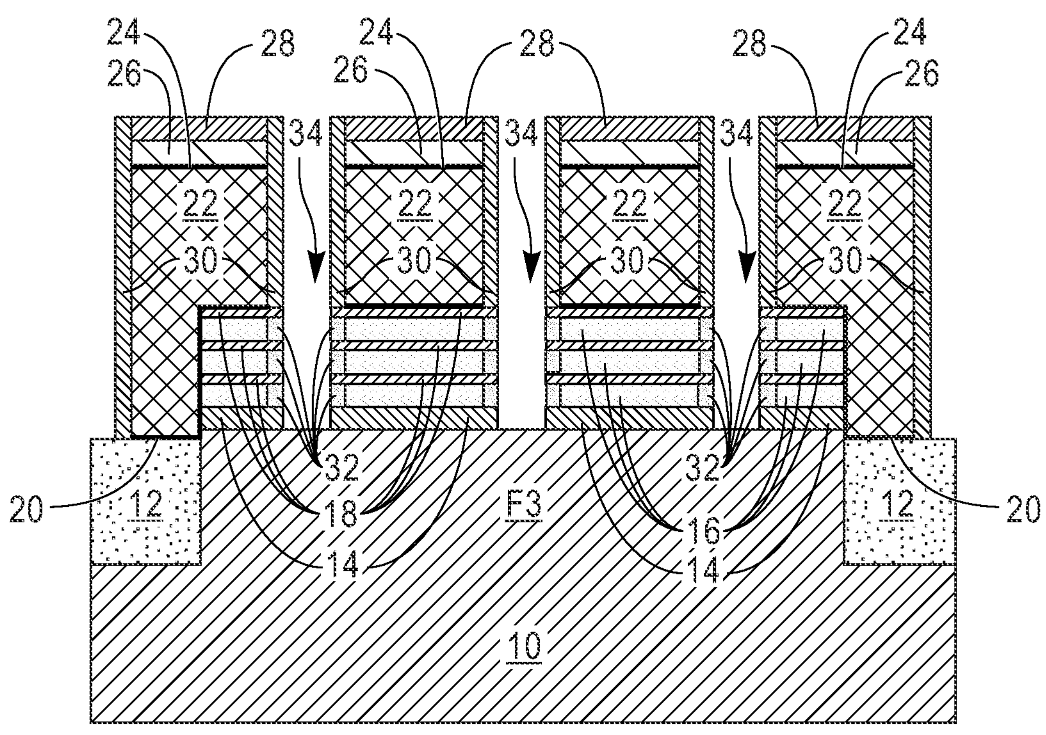
Figure 3H:
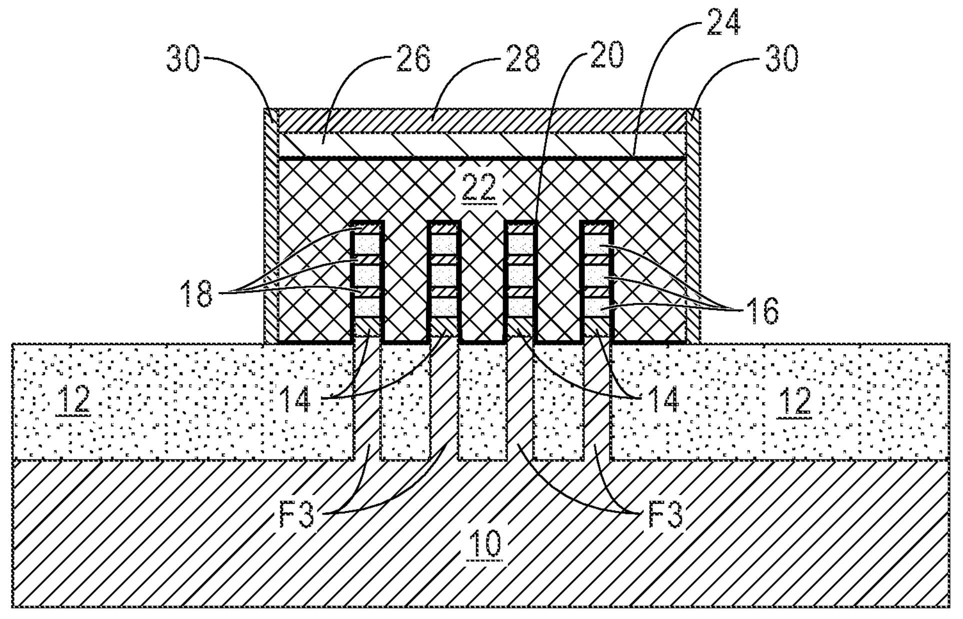
Figure 4B:
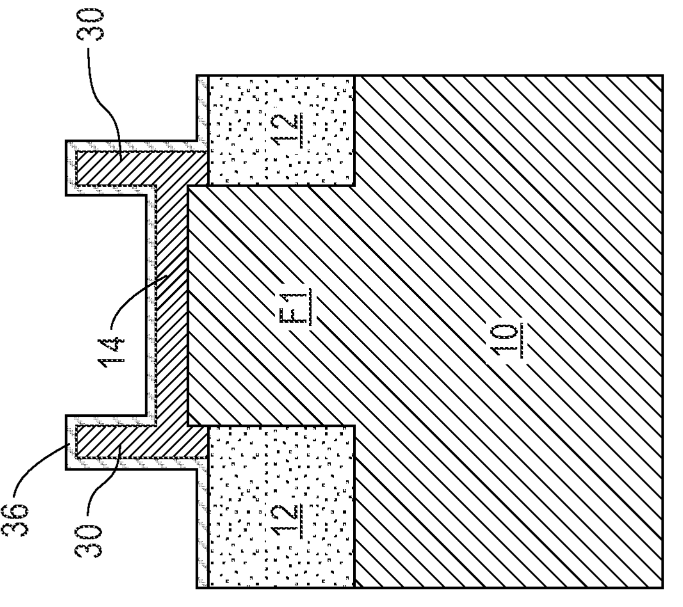
FIGS. 4A-4H are cross sectional views of the exemplary structures shown in FIGS. 3A-3H, respectively, after removing the mask from both the logic device region and the first resistor device region, and forming a conformal dielectric material liner for patterning of a pFET device in each of the device regions.
Figure 4A:
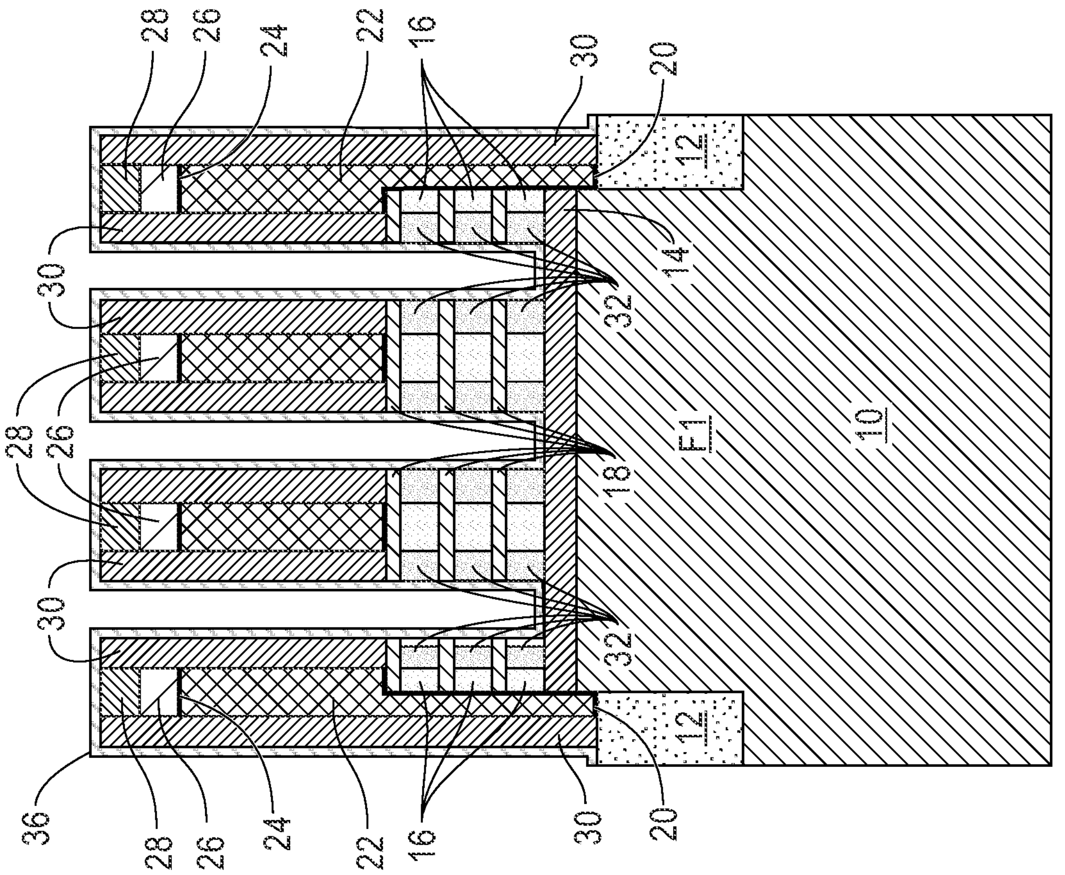
Figure 4C:
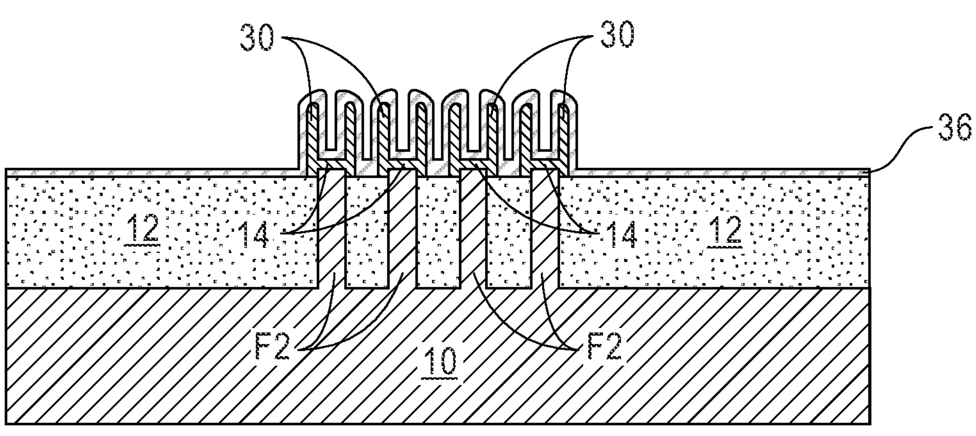
Figure 4D:
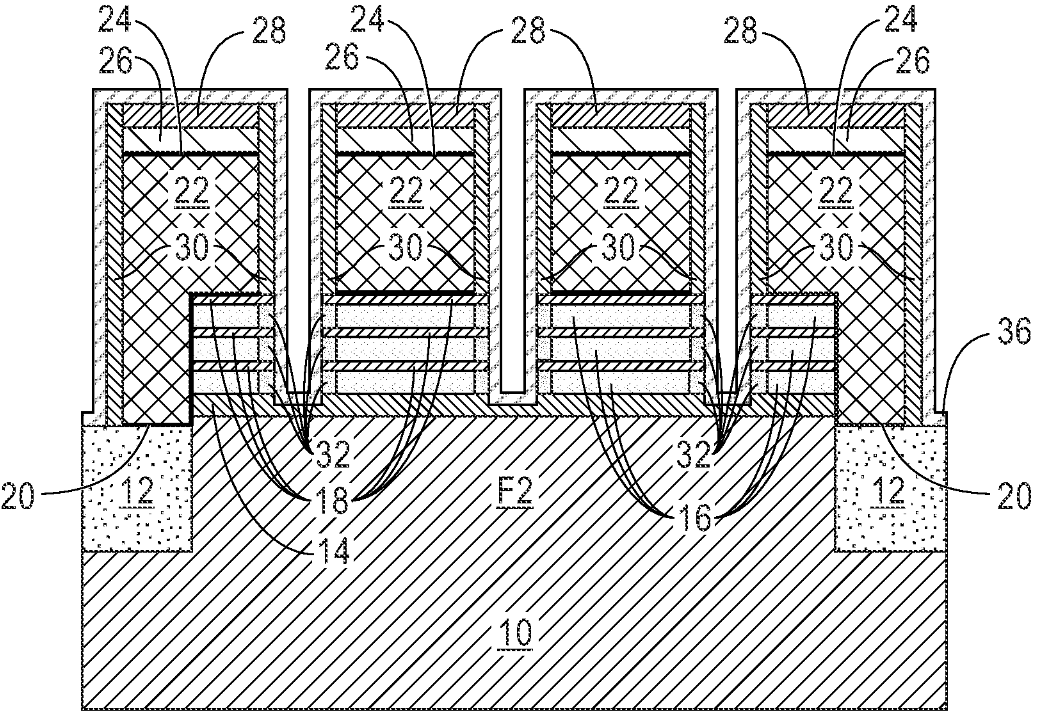
Figure 4E:
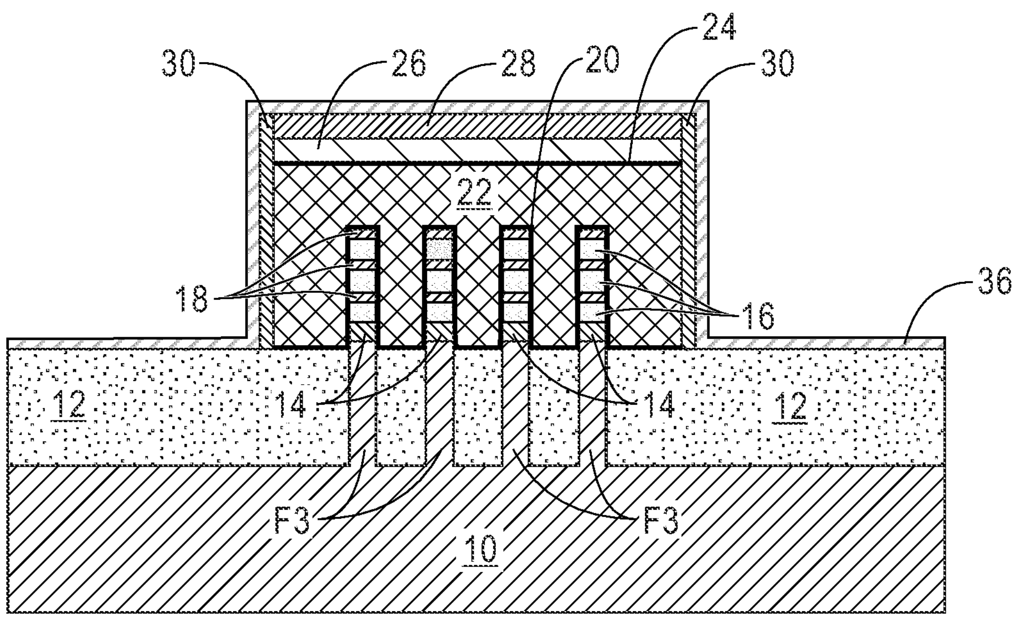
Figure 4F:
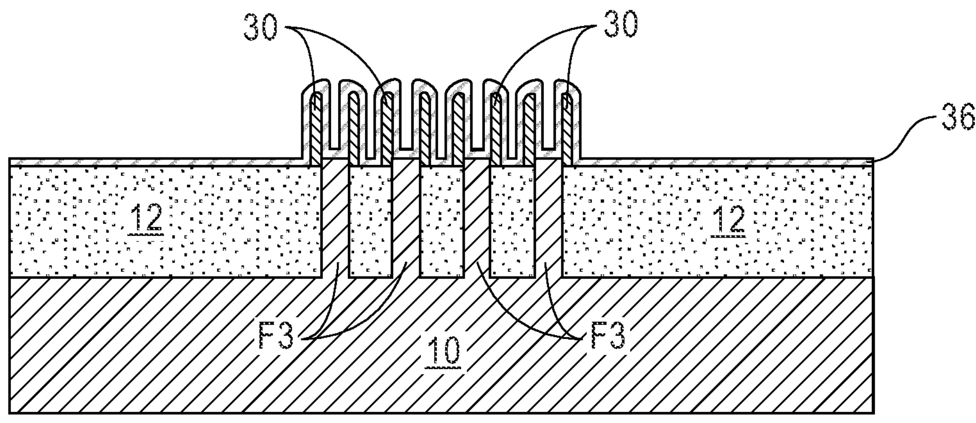
Figure 4G:
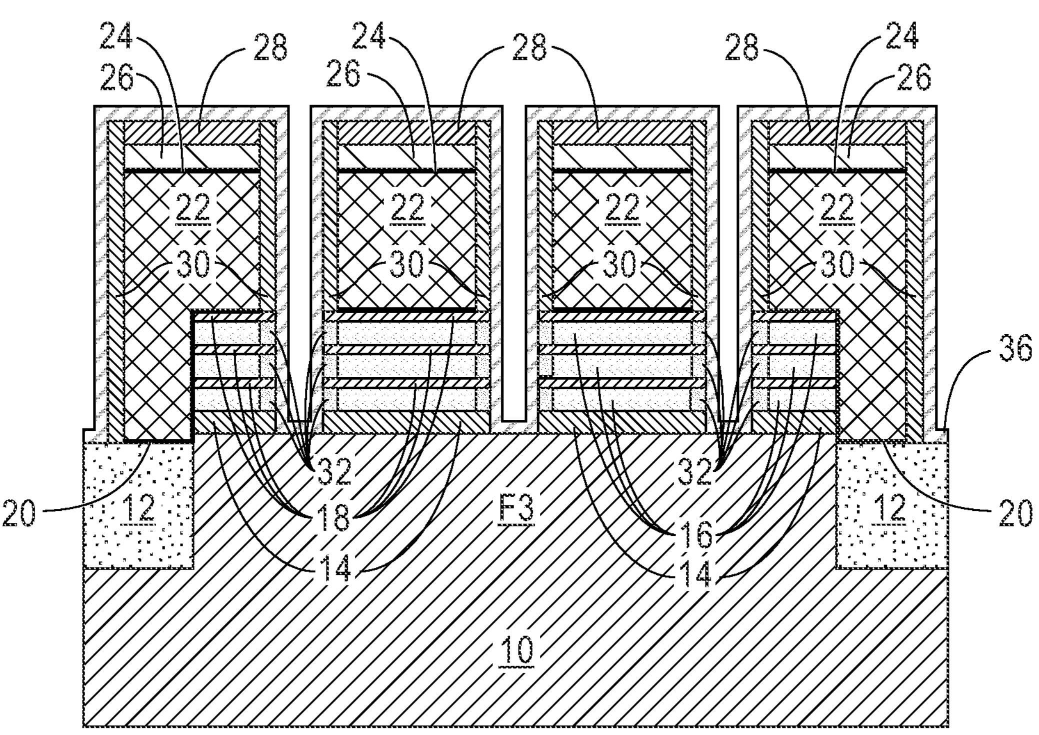
Figure 4H:
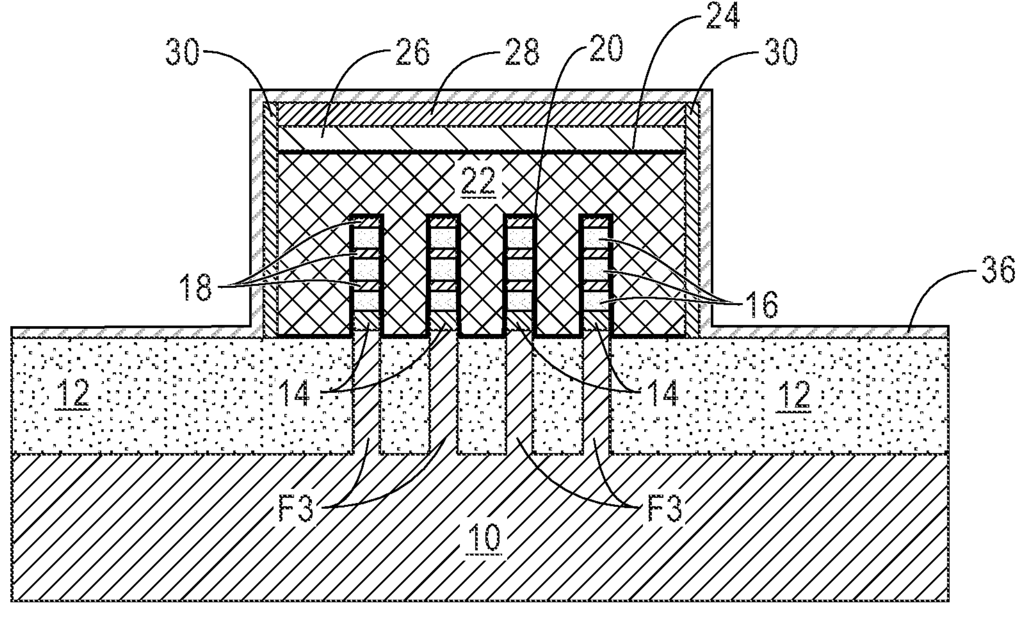
Figure 5B:
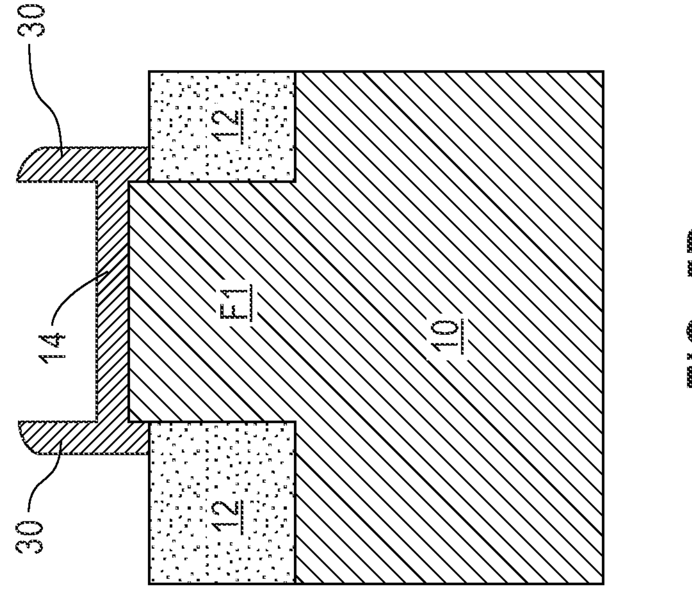
FIGS. 5A-5H are cross sectional views of the exemplary structures shown in FIGS. 4A-4H, respectively, after performing pFET S/D lithography and removing the conformal dielectric material liner in the logic device region; note a mask is formed in the first resistor device region and second resistor device region during the processing of the logic device region.
Figure 5A:
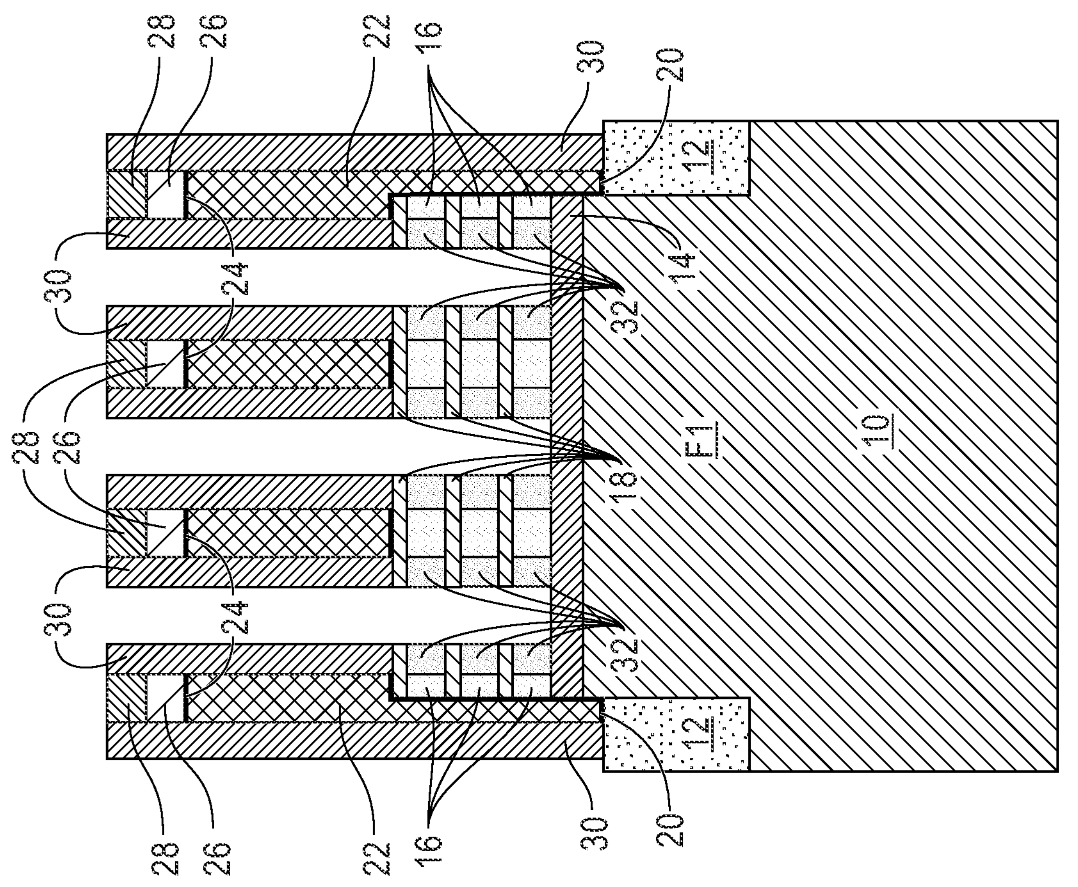
Figure 5C:
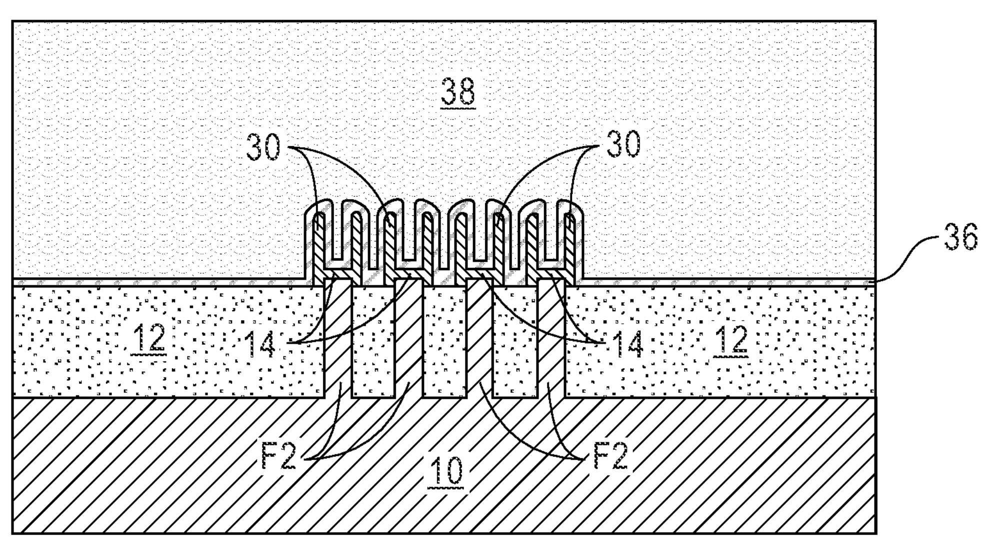
Figure 5D:
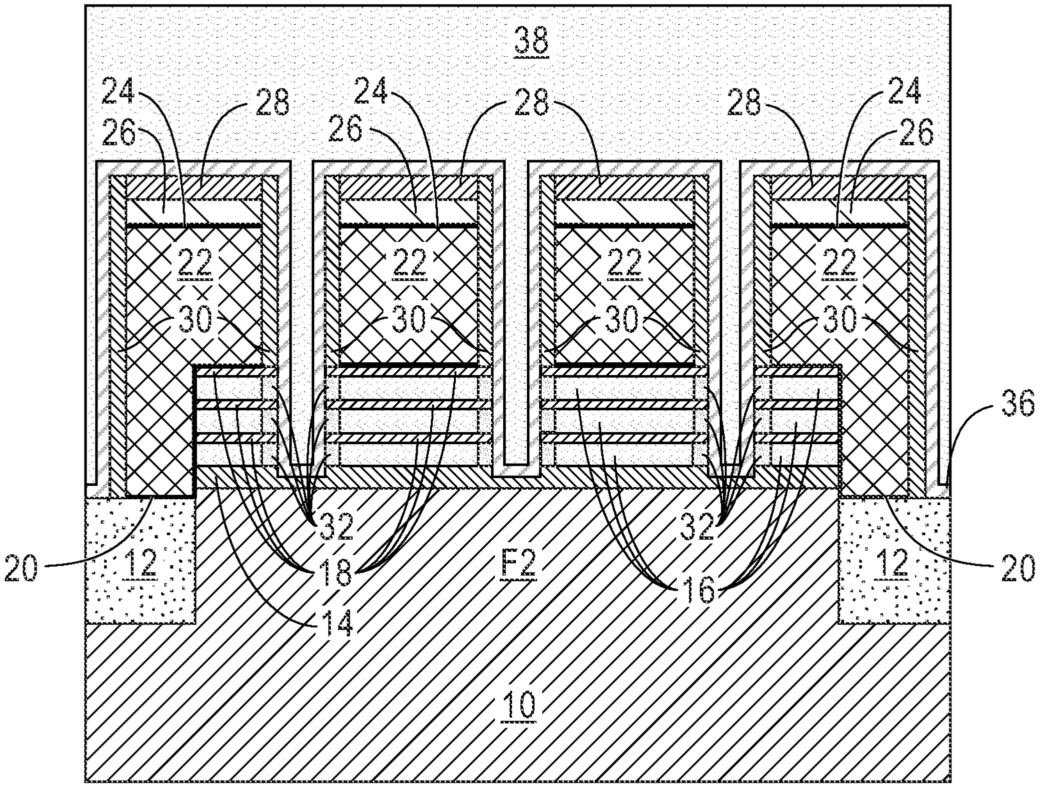
Figure 5E:
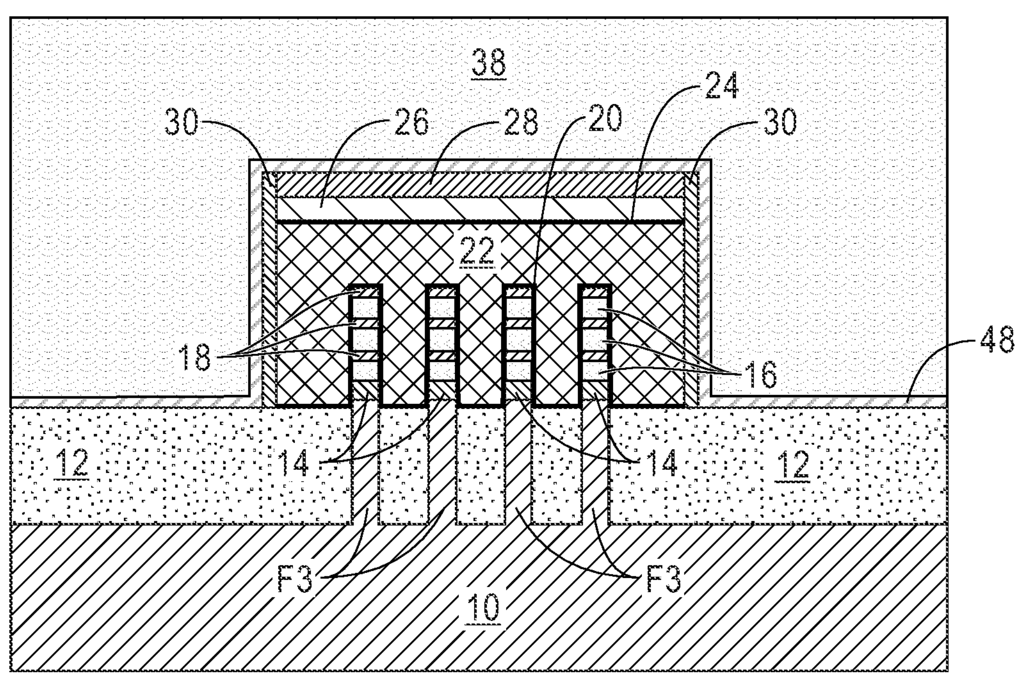
Figure 5F:
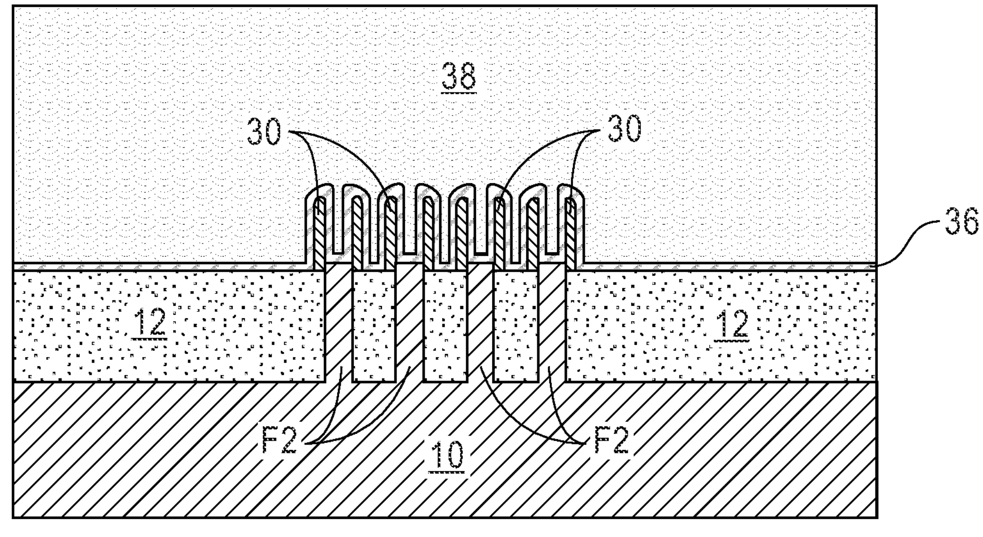
Figure 5G:
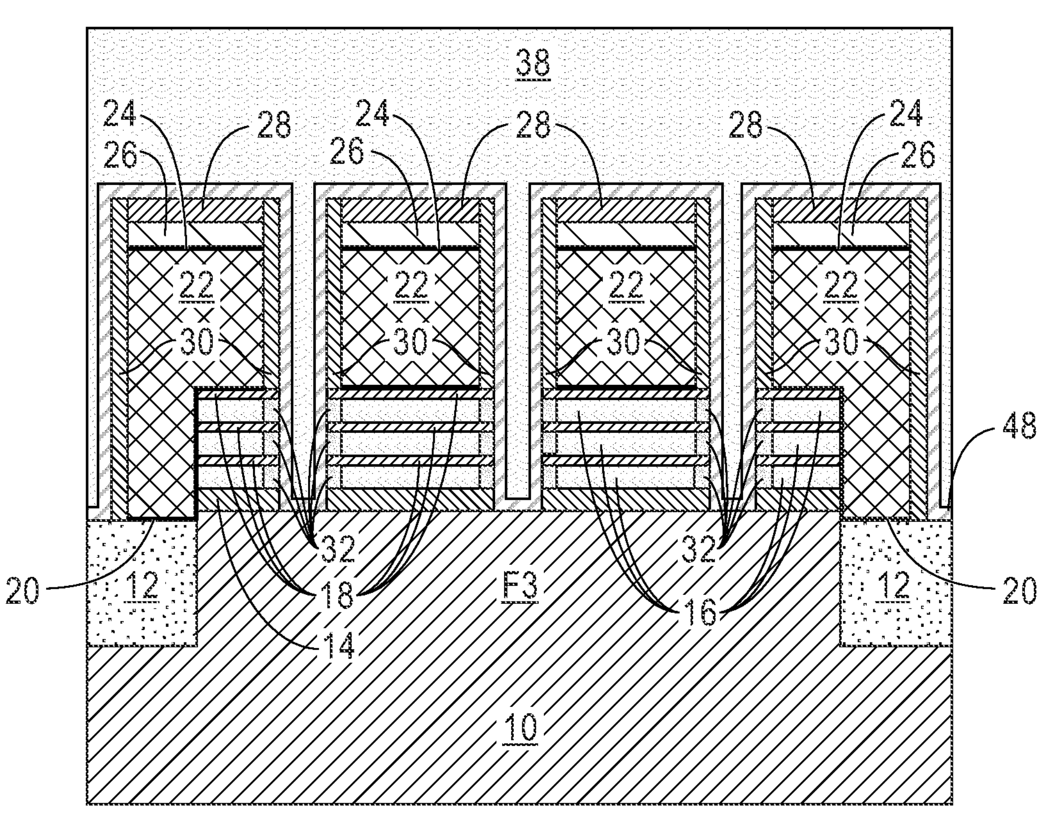
Figure 5H:
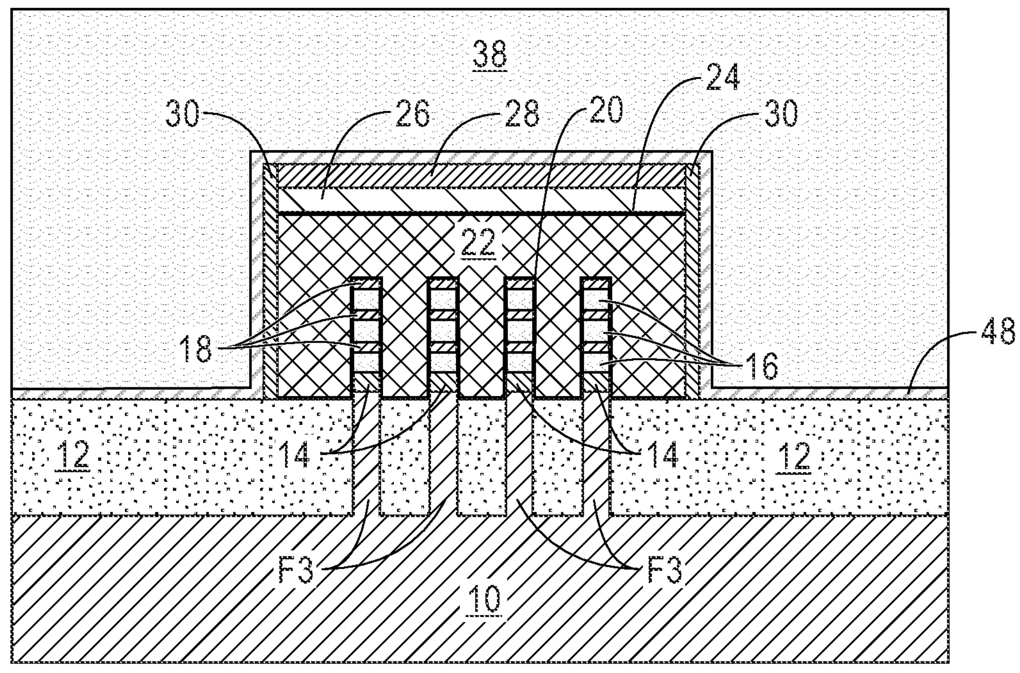

Referring now to FIGS. 2F, 2G and 2H, there are illustrated an exemplary structure in the second resistor device region 104 along Y5-Y5, X3-X3 and Y4-Y4, respectively, that can be used in the present application. In some embodiments, this second resistor device region 104 can be omitted. In such an embodiment, the logic device region 100 and the first resistor device region 102 are present without the second resistor device region 104 being present. In some embodiments, all three of the illustrated device regions, i.e., logic device region 100, first resistor device region 102 and second resistor device region 104, are present. The drawings and description that follow assumes that all three device regions are present.

The exemplary structure in the second resistor device region 104 includes a plurality of material stacks including alternating sacrificial semiconductor material nanosheets 16 and semiconductor channel material nanosheets 18 stacked one atop the other and located on a bottom dielectric isolation layer 14. The bottom dielectric isolation layer 14 that is present in the second resistor device region 104 is located on a third semiconductor sub-fin, F3, which is laterally surrounded by a trench dielectric isolation structure 12. Typically, a plurality of third semiconductor sub-fins, F3, are present in the second resistor device region 104. The third semiconductor sub-fin, F3, extends upward from semiconductor substrate 10. In FIGS. 2F-2H, a dotted line is shown to mark the bottom of the trench dielectric isolation structure 12 and to illustrate the height of the third semiconductor sub-fin, F3; in subsequent processing steps, and for clarity, this dotted line is omitted from the drawings The exemplary structure shown in the second resistor device region 104 and as is further illustrated in FIGS. 2F, 2G and 2H, further includes a hard mask capped sacrificial gate structure located on each material stack. The hard mask capped sacrificial gate structure can include a sacrificial gate dielectric material layer 20, a sacrificial gate material layer 22, and a hard mask cap. In the drawings, the hard mask cap is illustrated as containing a first hard mask material layer 24, a second hard mask material layer 26, and a third hard mask material layer 28. While three hard mask material layers are described and illustrated, the present application is not limited to utilizing a hard mask cap that contains three hard mask material layers. Instead, the hard mask cap that is present top the sacrificial gate structure can include one hard mask material layer, two hard mask material layers, or greater than three hard mask material layers. In some embodiments, a hard mask cap can be omitted from atop the sacrificial gate structure.

The exemplary structure shown in the second resistor device region 104 and as is further illustrated in FIGS. 2F, 2G and 2H, further includes a dielectric spacer 30 located laterally adjacent to the sacrificial gate structure, and an inner spacer 32 located laterally adjacent to each sacrificial semiconductor material nanosheet 16. Note, and is illustrated in FIG. 2F, the dielectric spacer 30 is located at the end of the bottom dielectric isolation layer 14.

The various elements shown FIGS. 2A, 2B, . . . 2H are now described in more detail. The semiconductor substrate 10 is composed of a semiconductor material that has semiconducting properties (i.e., a semiconductor material). Illustrative examples of semiconductor materials that can be used as the semiconductor substrate 10 include, but are not limited to, silicon (Si), germanium (Ge), a silicon germanium (SiGe) alloy, silicon carbide (SiC), silicon germanium carbide (SiGeC), a ill-V compound semiconductor or an II-VI compound semiconductor. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. Semiconductor substrate 10 is typically a bulk semiconductor substrate that is composed entirely of at least one of the semiconductor materials (typically, silicon) mentioned above.

The first semiconductor sub-fin, F1, the second semiconductor sub-fin, F2 and the third semiconductor sub-fin, F3, are composed of one of the semiconductor materials mentioned above for the semiconductor substrate 10. In one embodiment, the semiconductor material that provides each of the first semiconductor sub-fin, F1, the second semiconductor sub-fin, F2 and the third semiconductor sub-fin, F3, is a compositionally same semiconductor material as an upper portion of the semiconductor substrate 10. In another embodiment, the semiconductor material that provides each of the first semiconductor sub-fin, F1, the second semiconductor sub-fin, F2 and the third semiconductor sub-fin, F3, is a compositionally different semiconductor material than an upper portion of the semiconductor substrate 10.

The trench dielectric isolation structure 12 is composed of a trench dielectric material including, for example, silicon dioxide. The trench dielectric isolation structure 12 can be formed by filling a trench located laterally adjacent to each of the semiconductor sub-fins, i.e., the first semiconductor sub-fin, F1, the second semiconductor sub-fin, F2 and the third semiconductor sub-fin, F3, with a trench dielectric material. A planarization process such, as for example, chemical mechanical polishing (CMP), and/or an etch back process can be used to expose a topmost surface of each of the first semiconductor sub-fin, F1, the second semiconductor sub-fin, F2 and the third semiconductor sub-fin, F3. The trench dielectric isolation structure 12 has a topmost surface that is coplanar with, or located beneath, a topmost surface of each of the semiconductor sub-fins, i.e., the first semiconductor sub-fin, F1, the second semiconductor sub-fin, F2 and the third semiconductor sub-fin, F3.

The bottom dielectric isolation layer 14, which is present in each of the logic device region 100, the first resistor device region 102 and the second resistor device region 104, is located between the semiconductor sub-fin and each material stack of the alternating sacrificial semiconductor material nanosheets 16 and semiconductor channel material nanosheets 18 that is present in each of the logic device region 100, the first resistor device region 102 and the second resistor device region 104. The bottom dielectric isolation layer 14 is composed of any dielectric material having electrical insulating properties; the dielectric material that provides the bottom dielectric isolation layer 14 can be compositionally the same as, or compositionally different than, the dielectric material that provides the dielectric spacer 30. Illustrative examples of dielectric materials that can be used as the bottom dielectric isolation layer 14 include, but are not limited to, low k dielectric materials such as, for example SiO, SiN, SiON, SiOCN or SiBCN, that have a dielectric constant of less than 4.0. The bottom dielectric isolation layer 14 can have a thickness from 5 nm to 50 nm; although other thicknesses are contemplated and can be used as the thickness of the bottom dielectric isolation layer 14.

As mentioned above, each material stack that is present in the respective device region includes alternating sacrificial semiconductor material nanosheets 16 and semiconductor channel material nanosheets 18 stacked one atop the other. In the present application, each material stack includes 'n' or "n+1" number of sacrificial semiconductor material nanosheets 16 and 'n' number of semiconductor channel material nanosheets 18, wherein 'n' is an integer starting at one; the "n+1 embodiment is not illustrated in the drawings. By way of one example, and as is illustrated in the drawings, each material stack in the respective device region includes three sacrificial semiconductor material nanosheets 16 and three semiconductor channel material nanosheets 18. In embodiments, a material stack in one of the device regions can have a greater number of sacrificial semiconductor material nanosheets 16 and semiconductor channel material nanosheets 18 than in another of the device regions; however such an embodiment might cause unwanted topography issues. The number of material stacks that are present in the respective device regions can vary and is not limited to the number of material stacks shown in drawings.

Each sacrificial semiconductor material nanosheet 16 is composed of a first semiconductor material, while each semiconductor channel material nanosheet 18 is composed of a second semiconductor material that is compositionally different from the first semiconductor material. In some embodiments, the second semiconductor material that provides each semiconductor channel material nanosheet 18 is a semiconductor material that is capable of providing high channel mobility for n-type FET devices. In other embodiments, the second semiconductor material that provides each semiconductor channel material nanosheet 18 is a semiconductor material that is capable of providing high channel mobility for p-type FET devices. In embodiments, some material stacks in the logic device region 100 can contain semiconductor channel material nanosheets 18 composed of a semiconductor material that is capable of providing high channel mobility for n-type FET devices, while other material stacks in the logic device region can contain semiconductor channel material nanosheets 18 composed of a semiconductor material that is capable of providing high channel mobility for p-type FET devices.

The first semiconductor material that provides each sacrificial semiconductor material nanosheet 16, and the second semiconductor material that provides each semiconductor channel material nanosheet 18 can include one of the semiconductor materials mentioned above for the semiconductor substrate 10. In the present application, the first semiconductor material that provides each sacrificial semiconductor material nanosheet 16 can be compositionally the same as, or compositionally different from, the semiconductor substrate 10. Typically, the second semiconductor material that provides each semiconductor channel material nanosheet 18 is compositionally the same as the semiconductor substrate 10. In one example, the semiconductor substrate 10 (and each semiconductor sub-fin) is composed of silicon, the first semiconductor material that provides each sacrificial semiconductor material nanosheet 16 is composed of a silicon germanium alloy, and the second semiconductor material that provides each semiconductor channel material nanosheet 18 is composed of silicon. Other combinations of semiconductor materials are possible as long as the first semiconductor material that provides each sacrificial semiconductor material nanosheet 16 is compositionally different from the second semiconductor material that provides each semiconductor channel material nanosheet 18. Typically, each semiconductor channel material nanosheet 18 has a length that is wider than a length of each of the sacrificial semiconductor material nanosheets 16 since the sacrificial semiconductor material nanosheets 16 have undergone a lateral etch which provides a gap for forming the inner spacers 32.

Each sacrificial gate structure that is present in each of the device regions is located on, and straddles over, at least one material stack. Each sacrificial gate structure includes a sacrificial gate dielectric layer 20 and a sacrificial gate material layer 22. In some embodiments, the sacrificial gate dielectric layer 20 can be omitted. When present, the sacrificial gate dielectric layer 20 is composed of a sacrificial gate dielectric material such as, for example, silicon dioxide. The sacrificial gate material layer 22 includes a sacrificial gate material such as, for example, amorphous-silicon or poly-silicon. In embodiments, a hard mask cap can be located atop the sacrificial gate structure. The hard mask cap includes one or more hard mask material layers composed of a hard mask material such as, for example, silicon dioxide, silicon nitride, silicon oxynitride and combinations thereof. The drawings illustrate an embodiment in which each sacrificial gate structure in the logic device region 100, the first resistor device region 102 and the second resistor device region 104 includes the first hard mask material layer 24, which is composed of a first hard mask material, the second hard mask material layer 26, which is composed of a second hard mask material that is compositionally different from the first hard mask material, and the third hard mask material layer 28, which is composed of a third hard material which is compositionally different from the second hard mask material; the third hard mask material can be compositionally the same as, or compositionally different from, the first hard mask material. In one example, the first hard mask material that provides the first hard mask layer 24 is composed of silicon dioxide, the second hard mask material that provides the second hard mask layer 26 is composed of silicon nitride, and the third hard mask material that provides the third hard mask layer 28 is composed of silicon dioxide.

The dielectric spacer 30 which is located laterally adjacent to each of the hard mask capped sacrificial gate structures is composed of a first dielectric spacer material such as, for example, one of the low k dielectric materials as mentioned above for the bottom dielectric isolation layer 14. The dielectric spacer 30 has a topmost surface that is typically coplanar with a topmost surface of the hard mask capped sacrificial gate structure that the dielectric spacer 30 surrounds.

The inner spacer 32 which is located laterally adjacent to, and at each end of, each sacrificial semiconductor material nanosheet 16 is composed of a second dielectric spacer material which can be compositionally the same as, or compositionally different from the first dielectric spacer material that provides the dielectric spacer 30. Each inner spacer 32 has a first sidewall in direct physical contact with an end of one of the sacrificial semiconductor material nanosheets 16 and a second sidewall opposite the first sidewall that is vertically aligned to an outermost sidewall of the dielectric spacer 30.

The semiconductor structures that are illustrated in FIGS. 2A-2H can be formed utilizing nanosheet device processing steps that are well known to those skilled in the art. For example, a layered stack (not shown) of alternating layers of sacrificial semiconductor material (used to provide the sacrificial semiconductor material nanosheets 16) and semiconductor channel material (used to provide the semiconductor channel material nanosheets 18) can be formed on a surface of a placeholder material layer (not shown). The placeholder material layer is typically composed of a semiconductor material that is compositionally different from the sacrificial semiconductor material, the semiconductor channel material and the semiconductor substrate, and is subsequently replaced with a dielectric material to provide the bottom dielectric isolation layer 14. The placeholder material layer, and the alternating layers of sacrificial semiconductor material and semiconductor channel material can be formed utilizing epitaxial growth, as defined herein below in this application. The alternating layers of sacrificial semiconductor material and semiconductor channel material, and the as deposited placeholder material layer are then patterned by lithography and etching to form a patterned sacrificial placeholder material layer (not shown) and the layered stack (not shown). The etch goes through the alternating layers of sacrificial semiconductor material and semiconductor channel material and the placeholder material layer, and into a top portion of the semiconductor substrate 10 forming the semiconductor sub-fins and a shallow trench isolation (STI) trench (not shown) between the different device regions. The STI trench can then be processed to include an STI dielectric material so as to provide the shallow trench isolation structure 12. Next, the sacrificial gate structures are formed by depositing the optional sacrificial gate dielectric material, the sacrificial gate material, and the optional hard mask material layer[s], and those layers are then patterned by lithography and etching. The depositing can include, but is not limited to, chemical vapor deposition (CVD), plasma enhanced chemical vapor deposition (PECVD), physical vapor deposition (PVD), atomic layer deposition (ALD) or any combination of such deposition processes. After forming the sacrificial gate structures, dielectric spacer 30 can be formed by deposition of the first dielectric spacer material, followed by a spacer etch. At this point of the present application, the placeholder material layer is replaced with a dielectric material to provide the bottom dielectric isolation layer 14. The replacing of the placeholder material layer includes etching, deposition of a dielectric material, and thereafter performing an etch back process. Next, each layered stack (not shown) is etched utilizing the sacrificial gate structure and dielectric spacer as a combined etch mask to provide the material stacks of alternating sacrificial semiconductor material nanosheets 16 and semiconductor channel material nanosheets 18. Next, each sacrificial semiconductor material nanosheet 16 is recessed to form inner spacer gaps (not shown). Each inner spacer gap is formed above and below one of the semiconductor channel material nanosheets 18. After this recessing step, inner spacer 32 is formed into each of the inner spacer gaps by conformal deposition of the second dielectric spacer material, followed by an isotropic etching. The above describes one possible nanosheet processing flow that can be used to provide the structures shown in FIGS. 2A-2H. Other nanosheet processing flows are possible and can be used to provide the structures shown in FIGS. 2A-2H.

Referring now to FIGS. 3A-3H, there are illustrated the exemplary structures shown in FIGS. 2A-2H, respectively, after forming a mask 33 protecting the exemplary structure in the logic device region 100 and the exemplary structure in the first resistor device region 102, and after removing exposed portions of the bottom dielectric isolation layer 14 in the second resistor device region 104 to provide a punch through region 34, note no mask 33 is formed in the second resistor device region 104. The step of the present application can be omitted if no second resistor device region 104 is present. Mask 33 includes an organic dielectric masking material such as, for example, an organic planarization layer (OPL). Mask 33 can be formed by depositing (e.g., CVD, PECVD, or PVD) the organic dielectric masking material and then patterning the as deposited organic dielectric masking material. The exposed portions of the bottom dielectric isolation layer 14 in the second resistor device region 104 is removed by utilizing a punch-through anisotropic reactive-ion etch (RIE). This etch provides a punch through region 34 in the bottom dielectric isolation layer 14 that physically exposes a portion of the third semiconductor sub-fin F3; the bottom dielectric isolation layer 14 that is located beneath the material stack in the second resistor device region 104 remains after this etch (See, for example, FIGS. 3G and 3H). In the second resistor device region 104, a discontinuous bottom dielectric isolation layer 14 is thus provided.

Referring now to FIGS. 4A-4H, there are illustrated the exemplary structures shown in FIGS. 3A-3H, respectively, after removing the mask 33 protecting the exemplary structure in the logic device region 100 and the exemplary structure in the first resistor device region 102, and forming a conformal dielectric material liner 36 for patterning of a pFET device. Mask 33 can be removed from the logic device region 100 and the first resistor device region 102 utilizing any conventional material removal process. The conformal dielectric material liner 36 is formed in each of the logic device region 100, the first resistor device region 102 and the second resistor device region 104. The term "conformal" is used throughout the present application to denote a material layer such as, for example, the dielectric material liner 36, that has a same thickness along vertical surfaces as along horizontal surfaces. The conformal dielectric material liner 36 is composed of a dielectric material including, but not limited to, silicon oxide, silicon nitride, silicon oxynitride or aluminum oxide. The conformal dielectric material liner 36 can be compositionally the same as, or compositionally different from, the dielectric spacer material that provides inner spacer 32 and/or dielectric spacer 30. The conformal dielectric material liner 36 can be formed by deposition (e.g., CVD, PECVD, PVD or ALD). The conformal dielectric material liner 36 can have a thickness from 2 nm to 10 nm; however other thicknesses are contemplated and can be used is the present application as the thickness of the conformal dielectric material liner 36.

Referring now to FIGS. 5A-5H, there are illustrated the exemplary structures shown in FIGS. 4A-4H, respectively, after performing pFET S/D lithography and removing the conformal dielectric material liner 36 in the logic device region 100; note a mask is formed in the first resistor device region 102 and the second resistor device region 104 protecting those structures from the processing occurring in the logic device region 100. The pFET S/D lithography includes forming mask 38 in the first resistor device region 102 and the second resistor device region 104. Mask 38 includes an organic dielectric material as mentioned above for mask 33. Mask 38 can be formed utilizing one of the deposition processes mentioned above for forming mask 33. The conformal dielectric material liner 36 is removed from the logic device region 100 by utilizing an etching process that is selective in removing the dielectric material that provides the conformal dielectric material liner 36. In one example, diluted HF combined with HCl can be used to remove the conformal dielectric material liner 36 from the logic device region 100.

Referring now to FIGS. 6A-6H, there are illustrated the exemplary structures shown in FIGS. 5A-5H, respectively, after forming a p-type source/drain (S/D) region 40 for the pFET in the logic device region 100; no p-type S/D region 40 is formed in either the first resistor device region 102 or the second resistor device region 104 since the conformal dielectric material liner 36 remains in those two resistor device regions. Note that mask 38 is typically removed from the first resistor device region 102 and the second resistor device region 104 prior to forming the p-type source/drain region 40. Mask 38 can be removed utilizing any material removal that removes the organic dielectric material that provides mask 38.

Figure 6B:
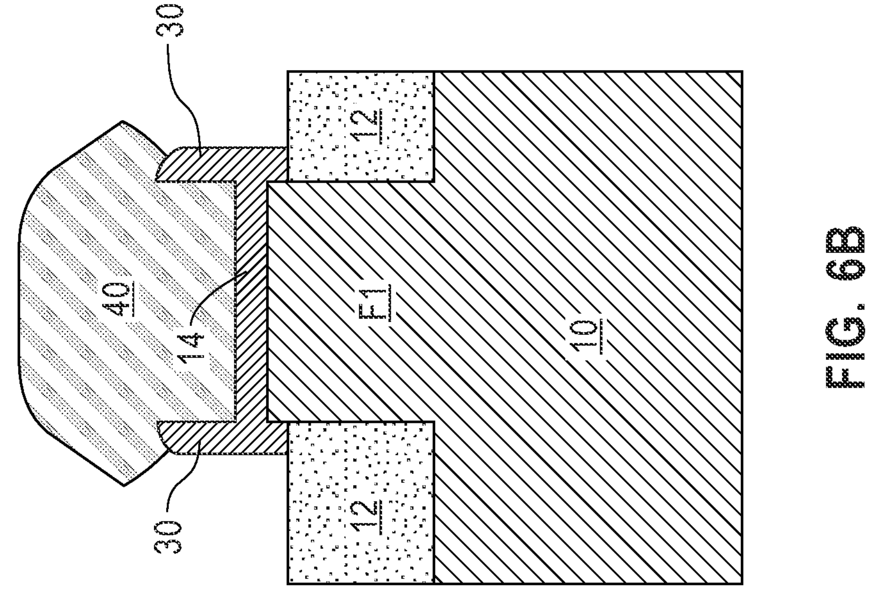
FIGS. 6A-6H are cross sectional views of the exemplary structures shown in FIGS. 5A-5H, respectively, after forming a p-type source/drain (S/D) region for the pFET in the logic device region; note that the mask is typically removed from the first resistor device region and the second resistor device region prior to forming the p-type source/drain region.
Figure 6A:
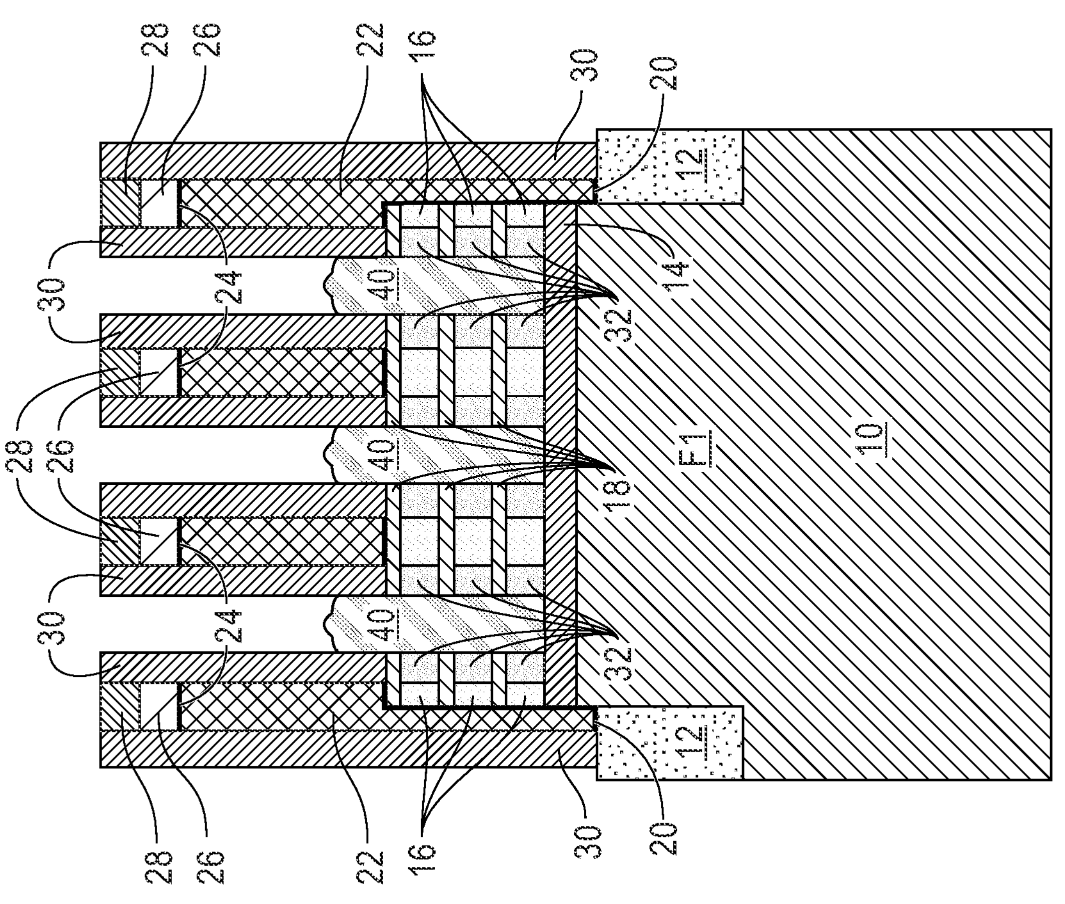
Figure 6C:
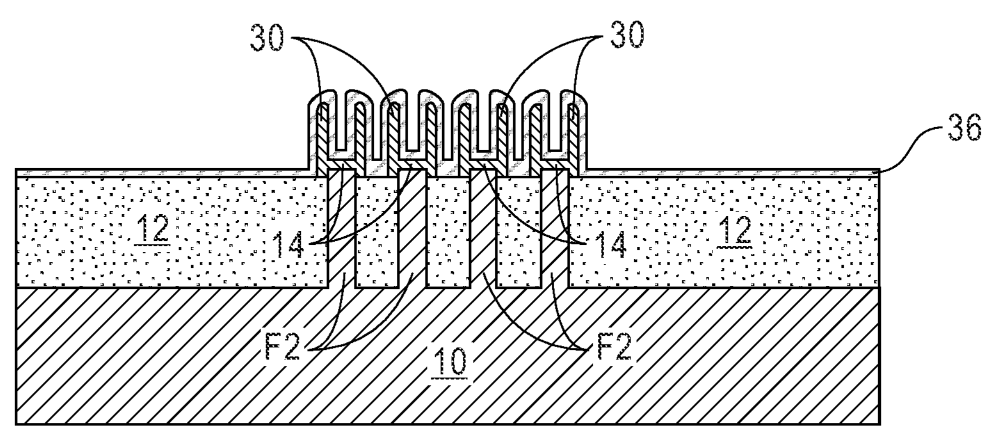
Figure 6D:
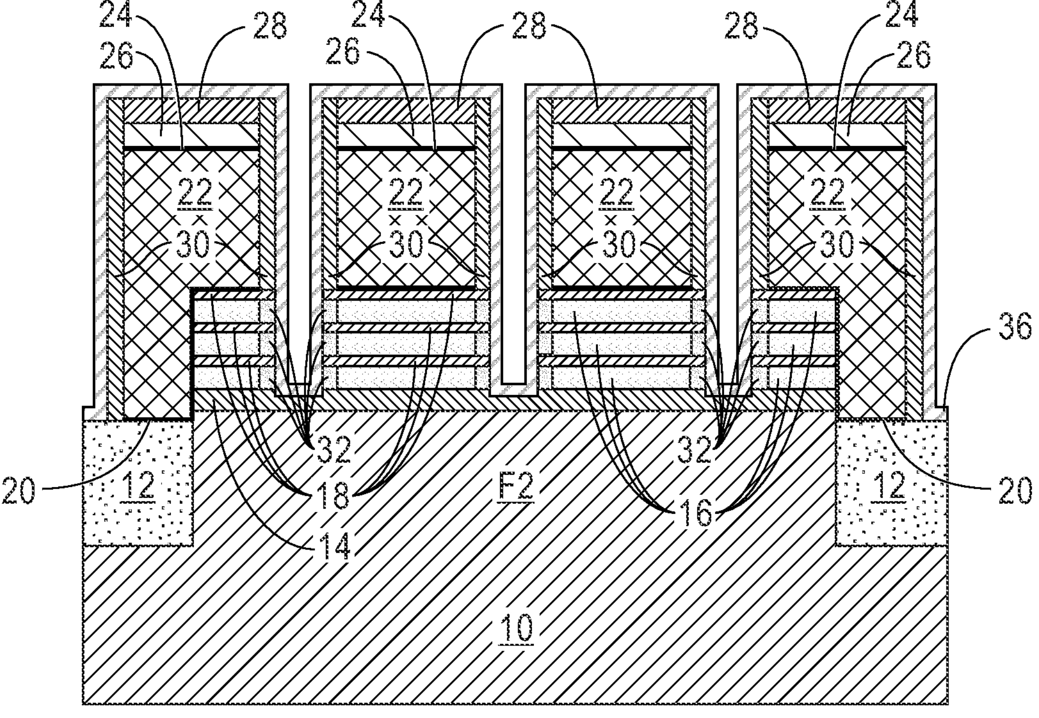
Figure 6E:
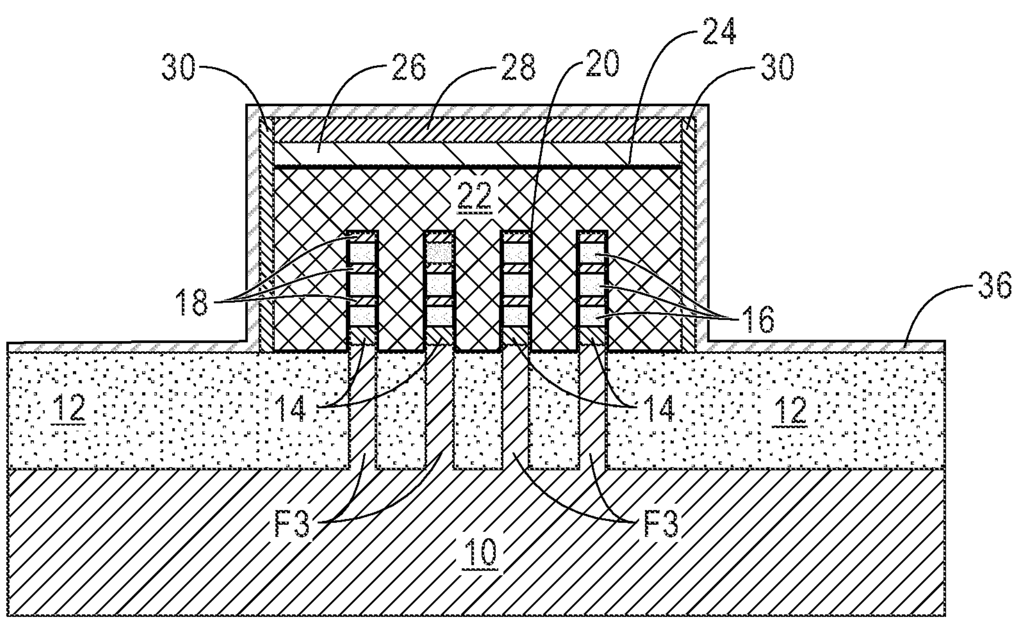
Figure 6F:
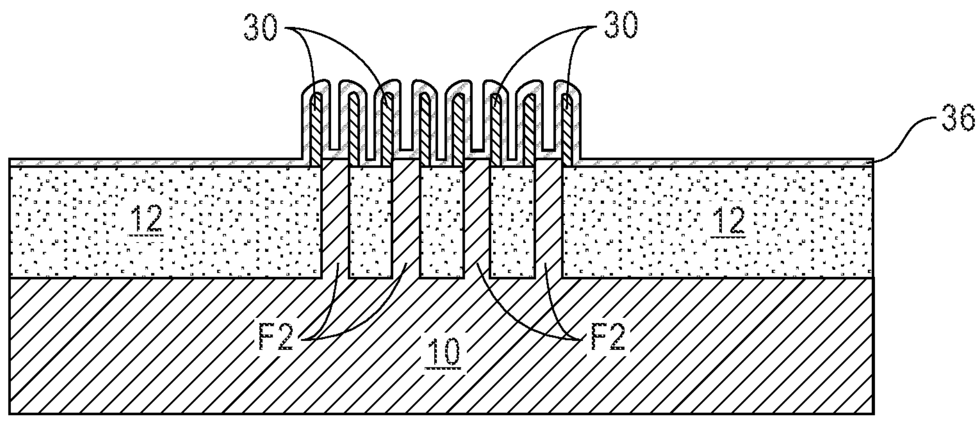
Figure 6G:
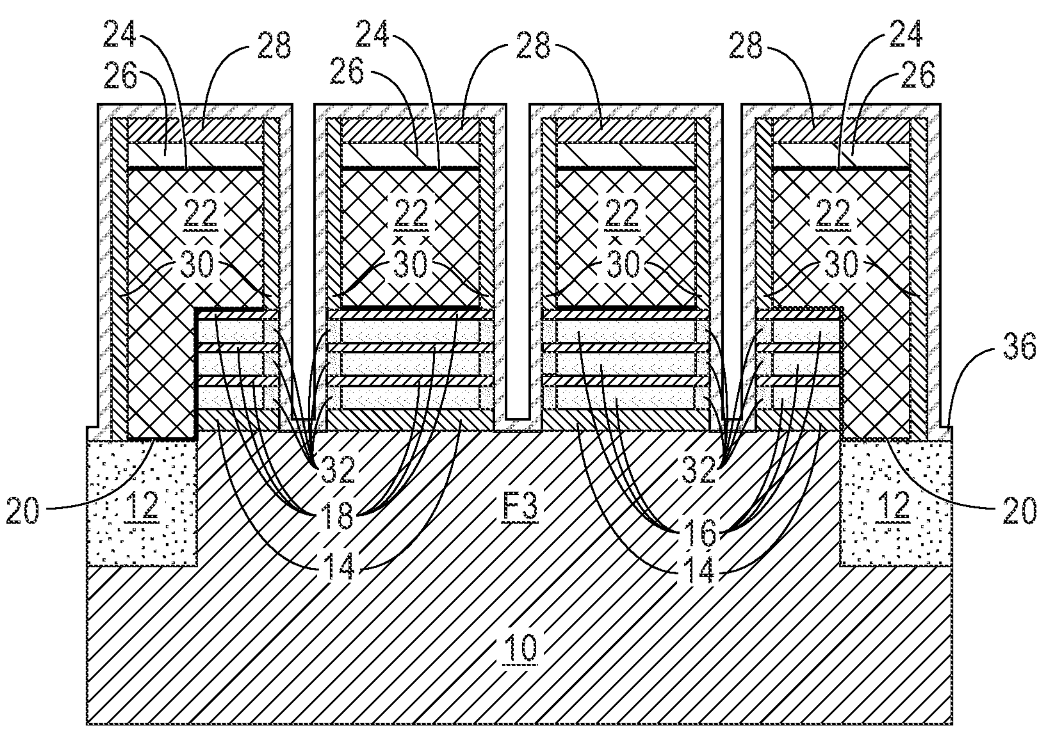
Figure 6H:
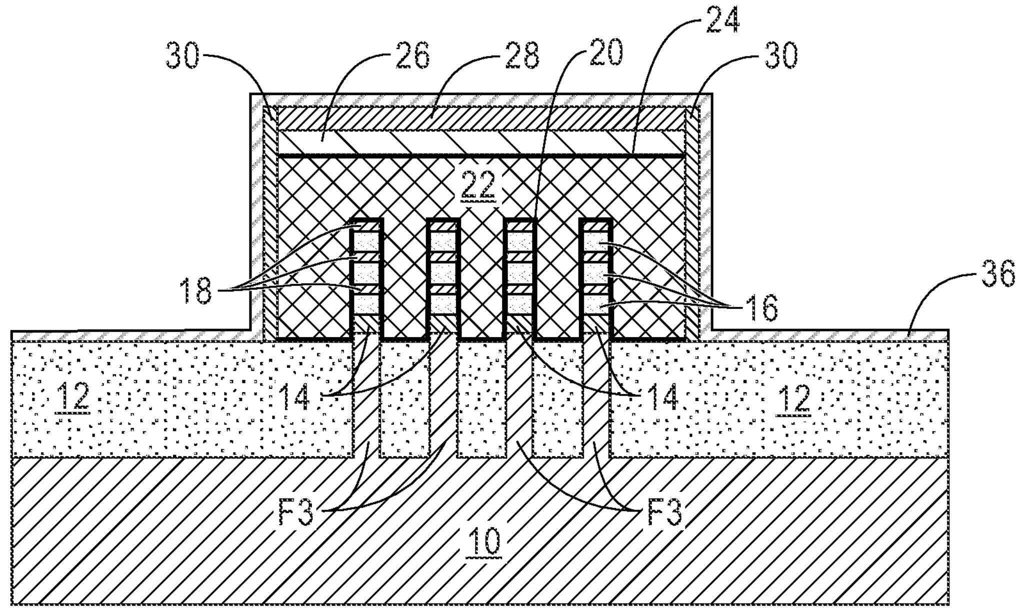

The p-type source/drain region 40 is formed outwards from each semiconductor channel material nanosheet 18 sidewall and atop the bottom dielectric isolation layer 14 by utilizing an epitaxial growth process; a bottom portion of the p-type source/drain region 40 is formed between portions of dielectric spacer 30 as is shown in FIG. 6B. The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

As used herein, a "source/drain" region can be a source region or a drain region depending on subsequent wiring and application of voltages during operation of the FET. The p-type source/drain region 40 comprises a semiconductor material and a p-type dopant. The semiconductor material that provides the p-type source/drain region 40 can include one of the semiconductor materials mentioned above for the semiconductor substrate 10. The semiconductor material that provides the p-type source/drain region 40 can be compositionally the same as, or compositionally different from, the semiconductor channel material nanosheets 18 of the pFET that is present in the logic device region 100. The semiconductor material that provides the p-type source/drain region 40 is however compositionally different from each sacrificial semiconductor material nanosheet 16. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. In one example, the p-type source/drain region 40 can have a dopant concentration of from $1\times10^{20}$ atoms/$cm^3$ to $3\times10^{21}$ atoms/$cm^3$. In one example, the p-type source/drain region 40 is composed of boron doped silicon.

Figure 7B:
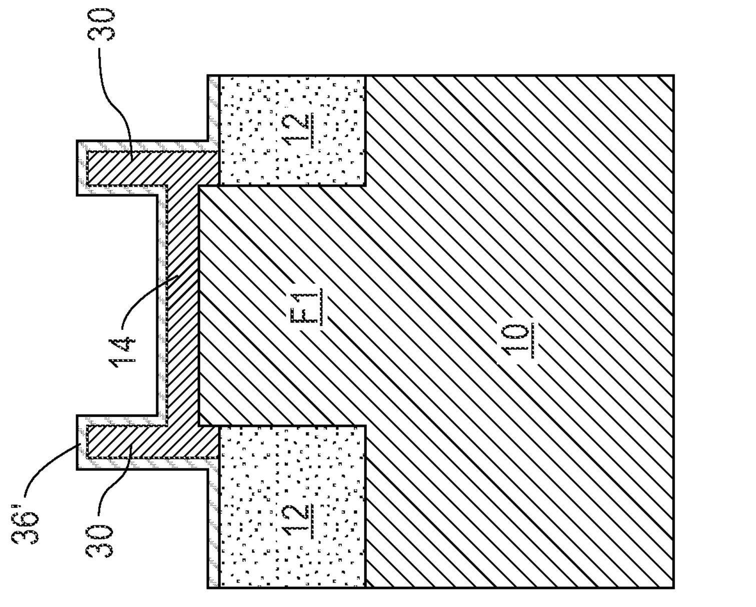
FIGS. 7A-7H are cross sectional views of the exemplary structures shown in FIGS. 6A-6H, respectively, after forming a second conformal dielectric material liner for patterning of an nFET device.
Figure 7A:
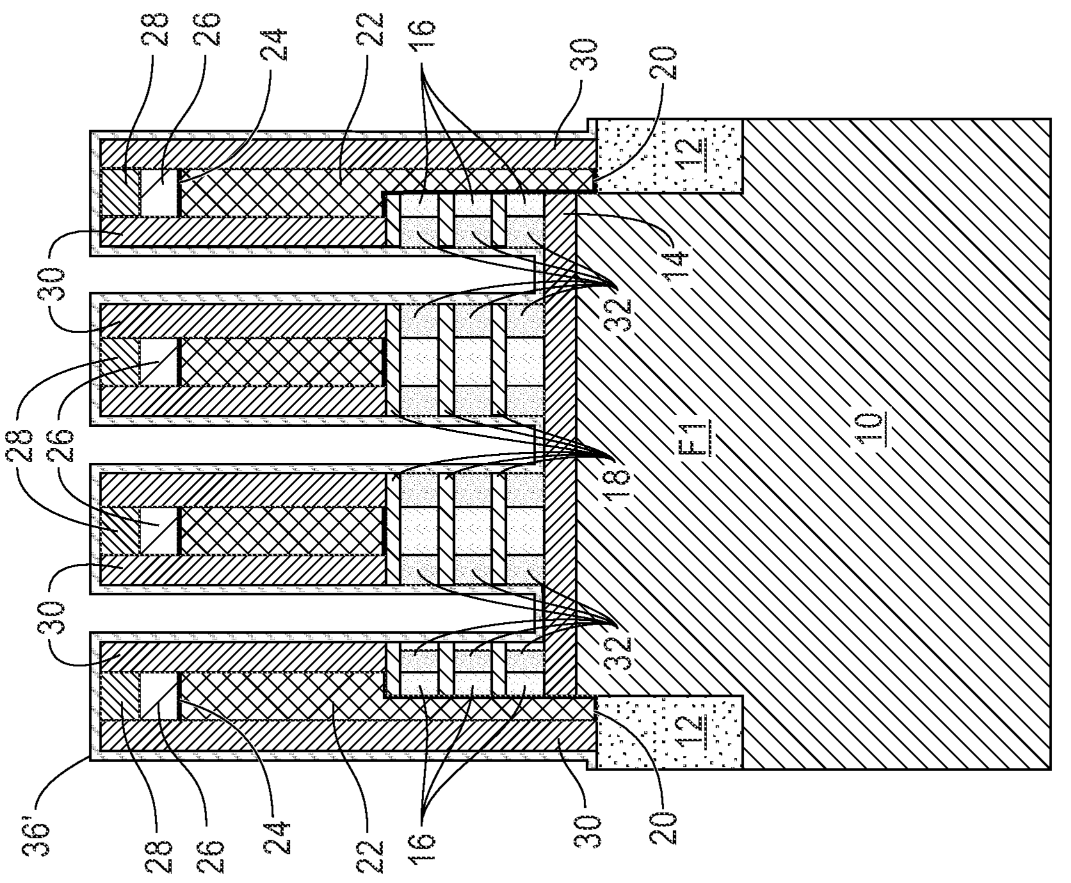
Figure 7C:
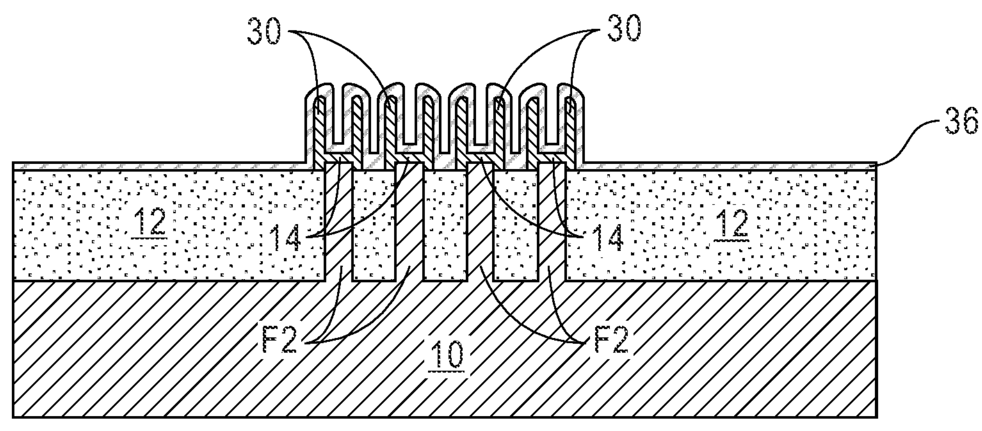
Figure 7D:
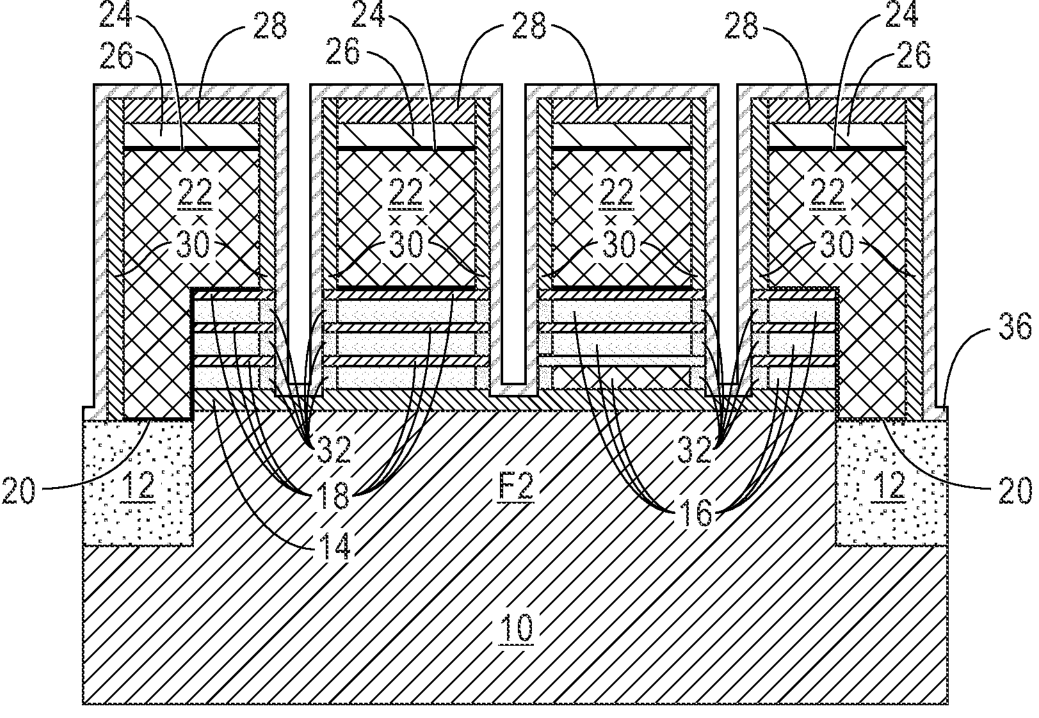
Figure 7E:
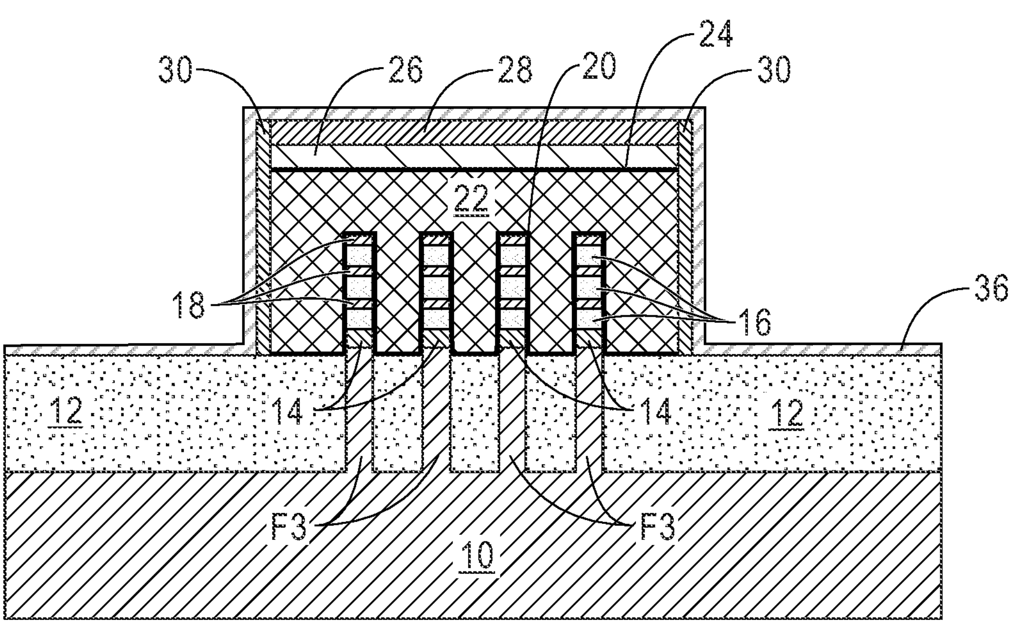
Figure 7F:
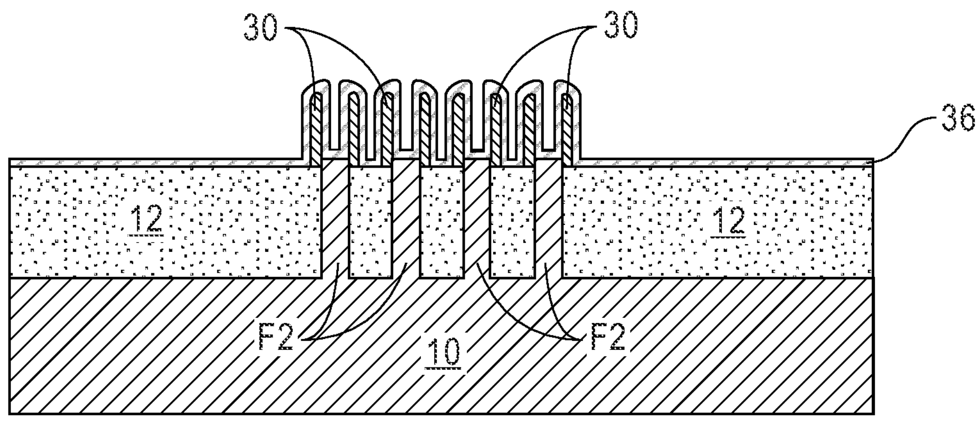
Figure 7G:
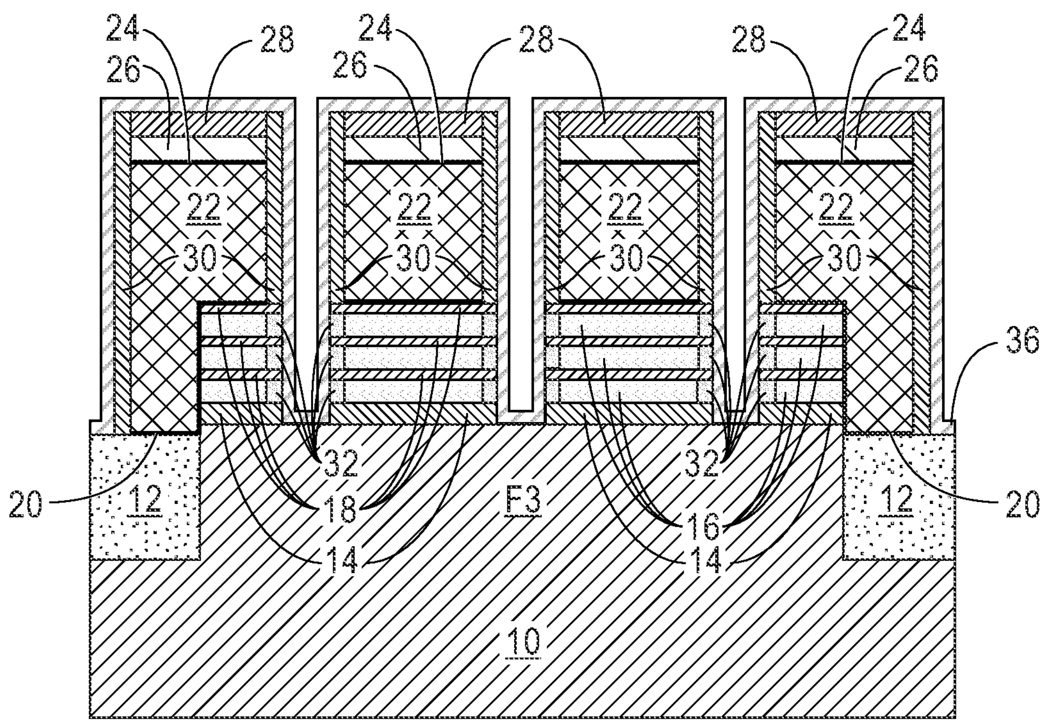
Figure 7H:
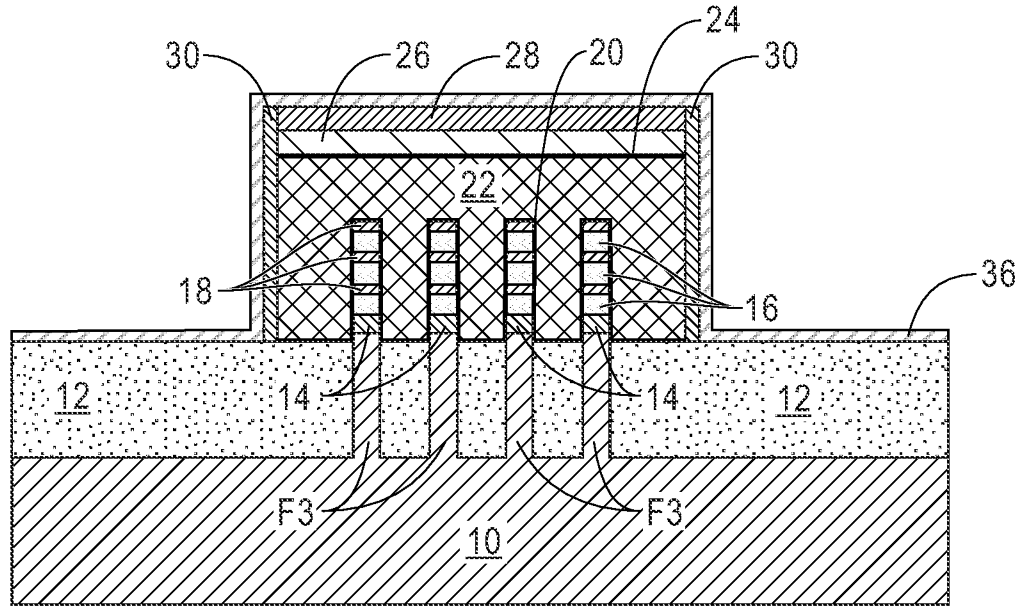
Figure 8B:
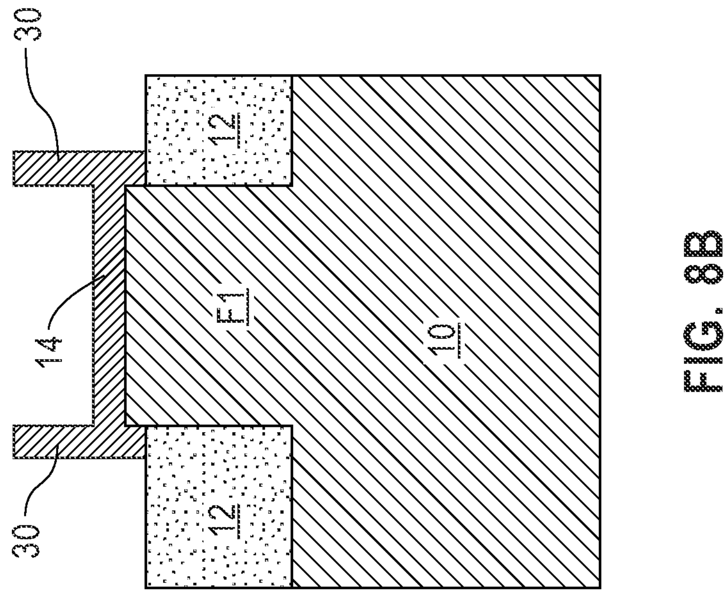
FIGS. 8A-8H are cross sectional views of the exemplary structures shown in FIGS. 7A-7H after performing nFET S/D lithography and removing the second conformal dielectric material liner in the logic device region and the conformal dielectric material liner from the second resistor device region; note a mask is formed in the first resistor device region, but not the second resistor device region, during this processing step.
Figure 8A:
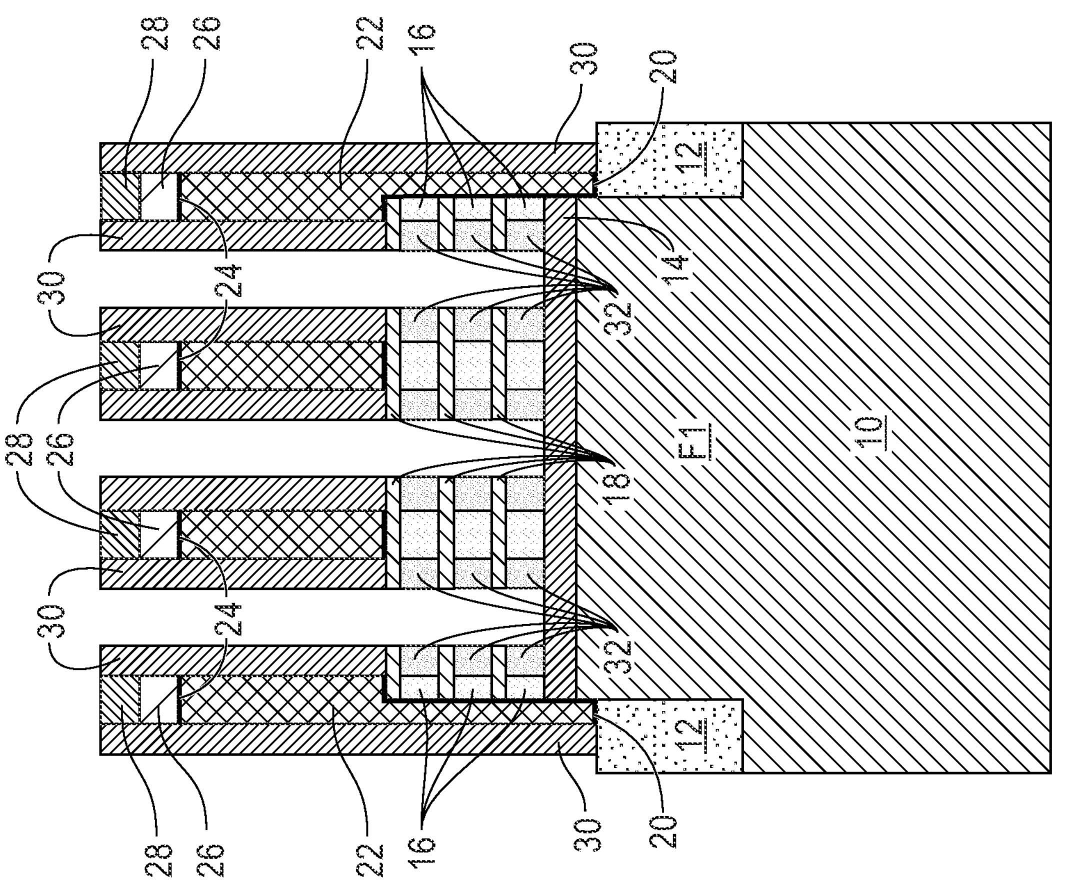
Figure 8C:
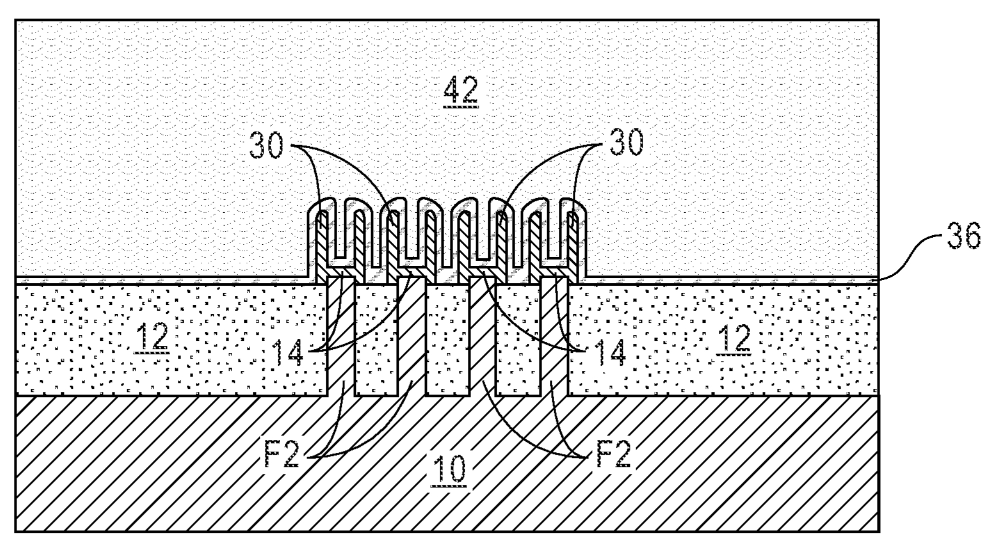
Figure 8D:
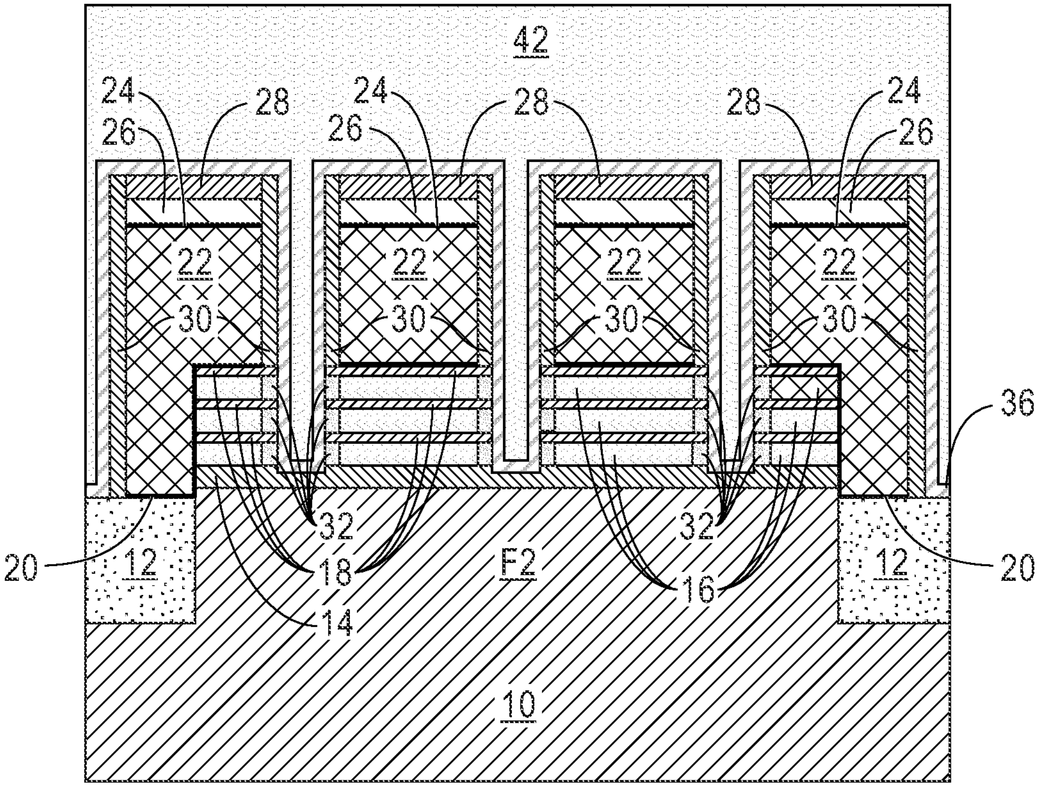
Figure 8E:
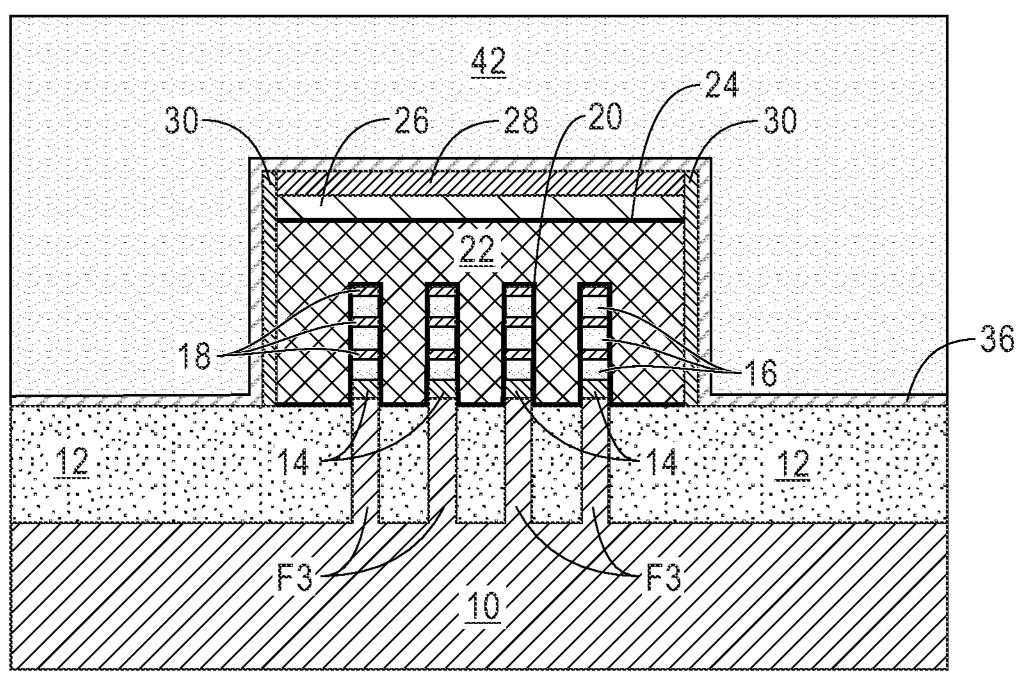
Figure 8F:
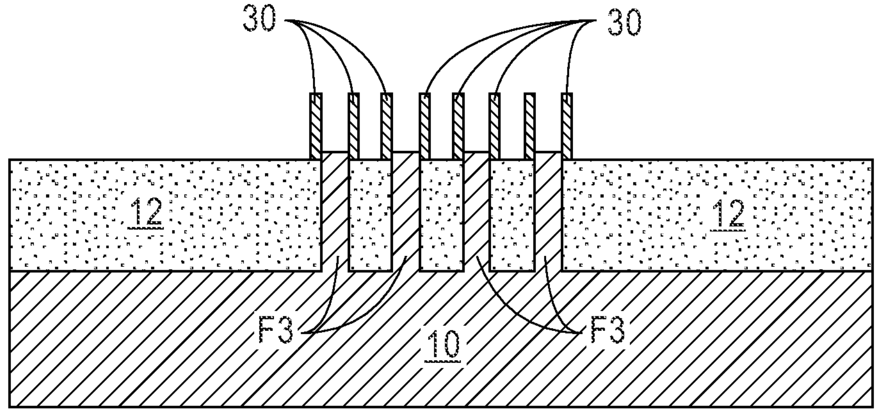
Figure 8G:
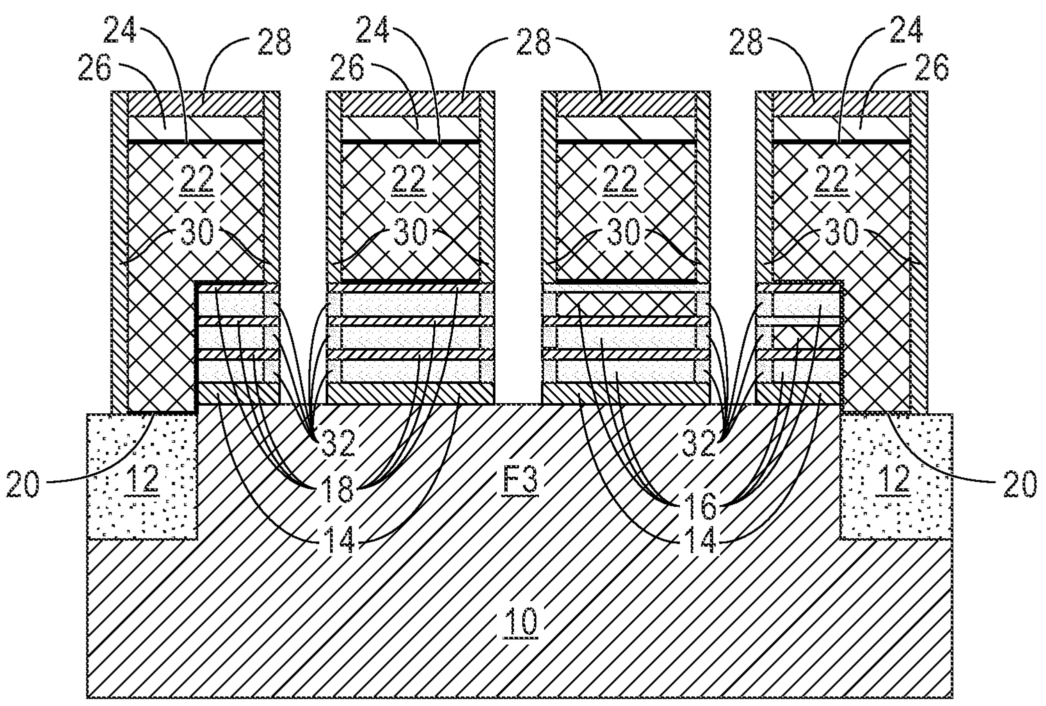
Figure 8H:
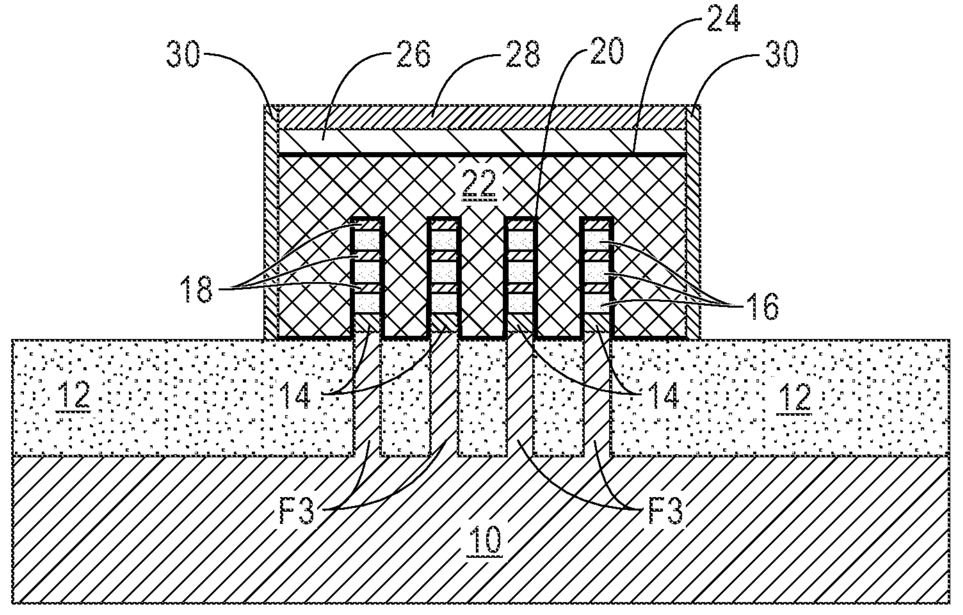
Figure 9B:
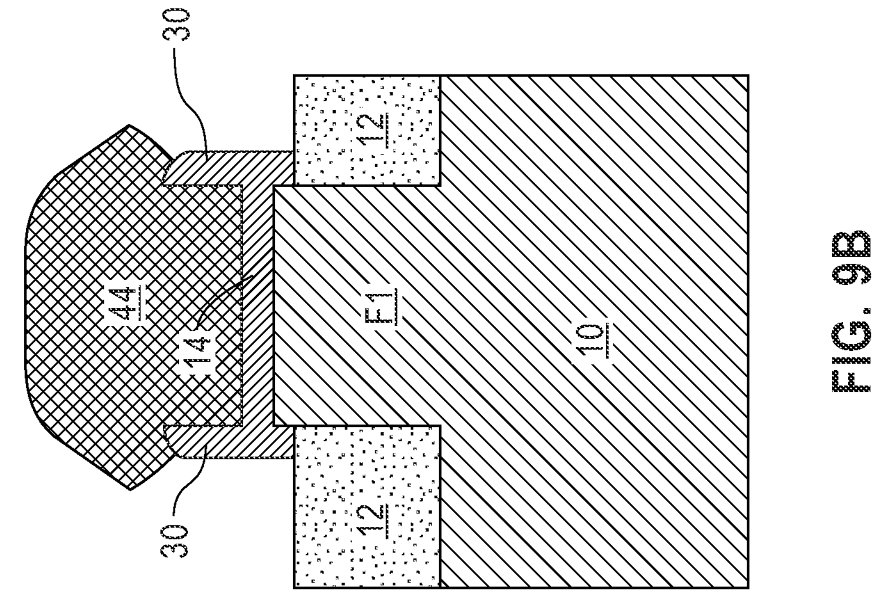
FIGS. 9A-9H are cross sectional views of the exemplary structures shown in FIGS. 8A-8H, respectively, after forming an n-type source/drain (S/D) region for the nFET in the logic device region and an n-type source/drain region in the second resistor device region; note that the mask is typically removed from the first resistor device region prior to forming the n-type source/drain regions.
Figure 9A:
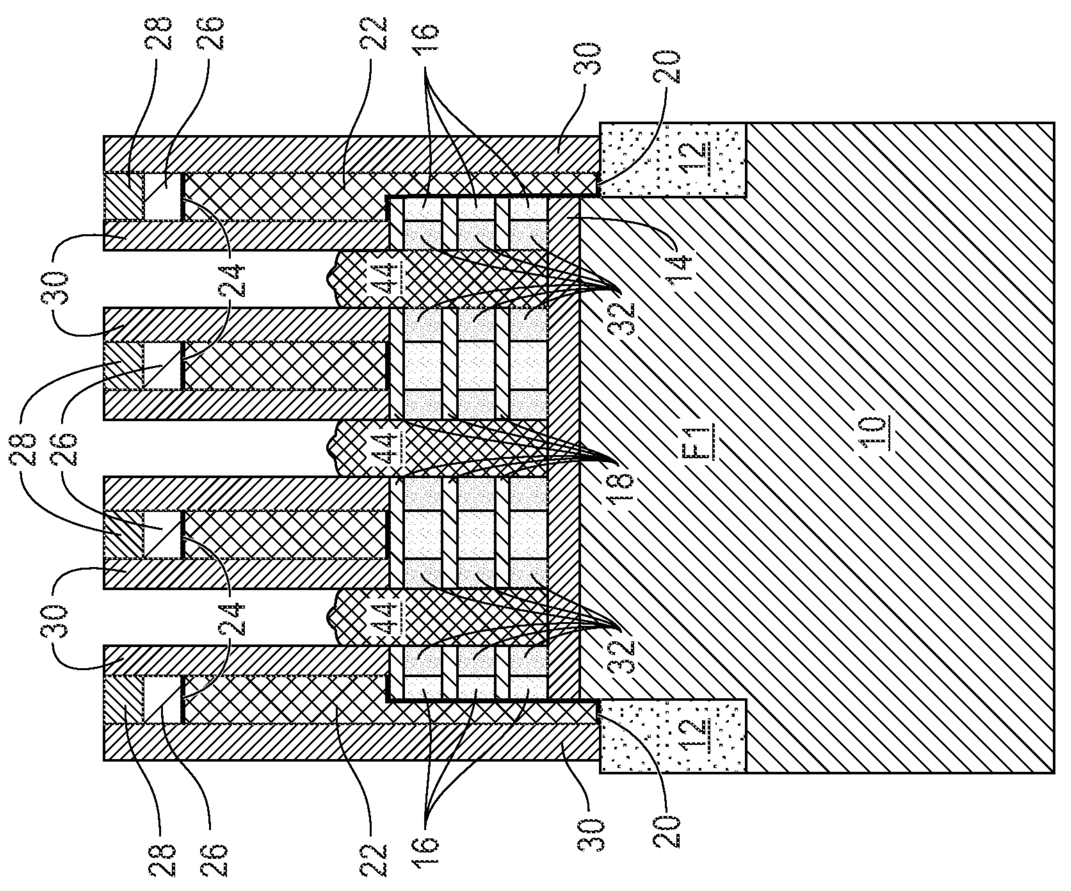
Figure 9C:
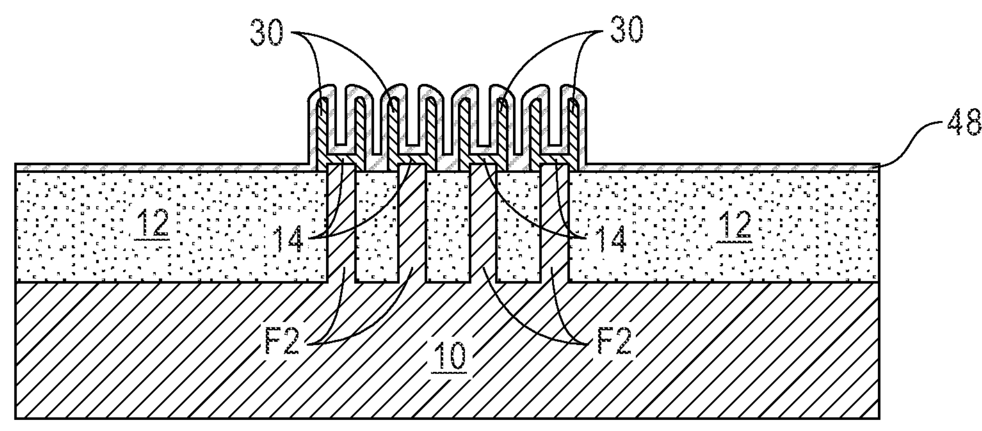
Figure 9D:
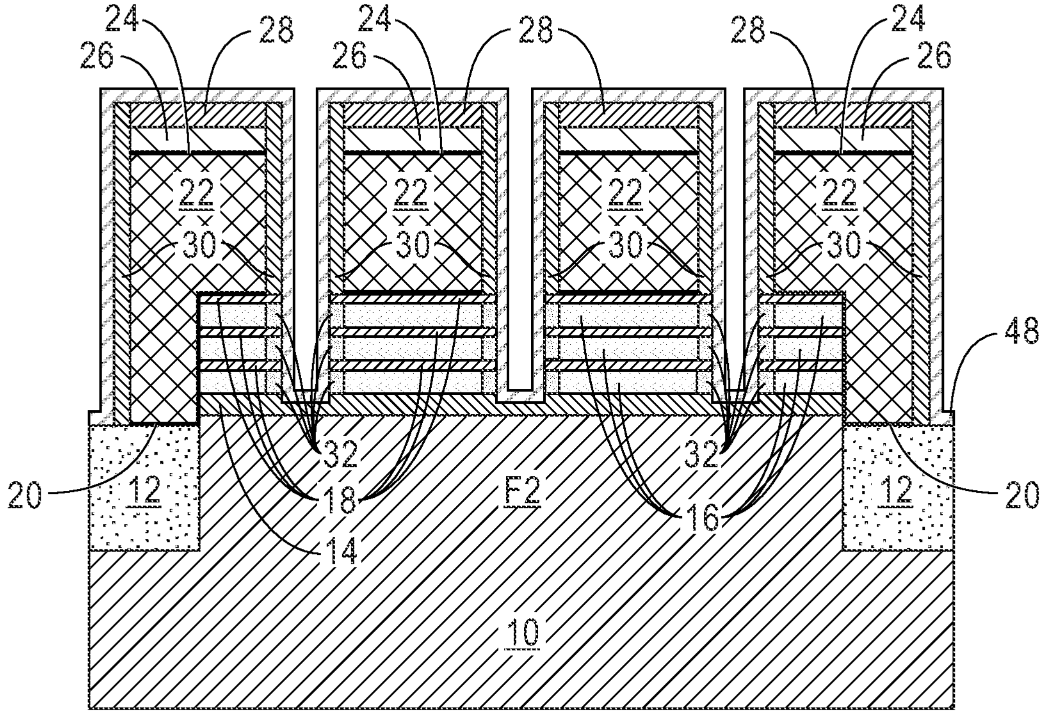
Figure 9E:
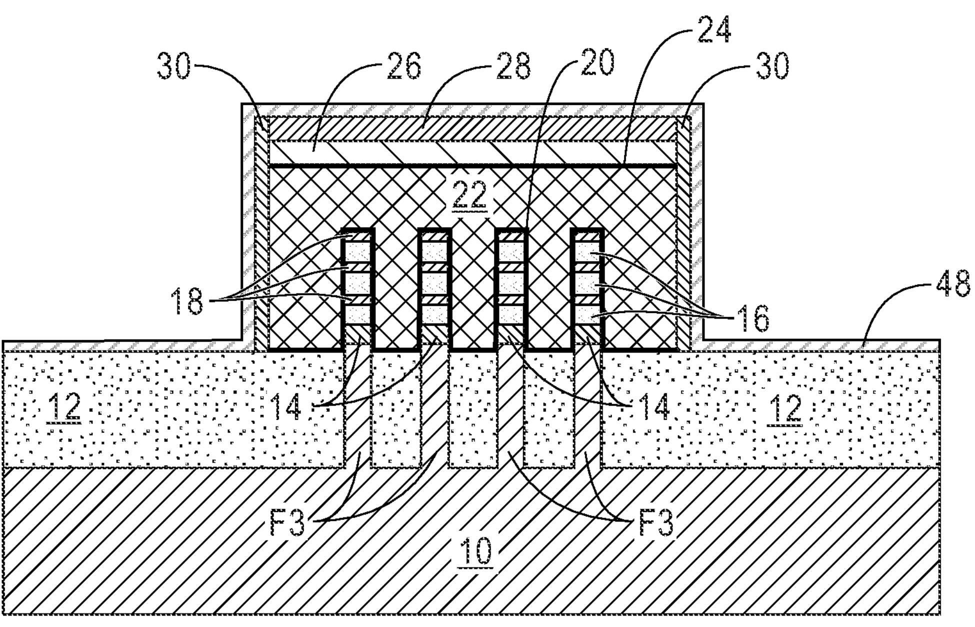
Figure 9F:
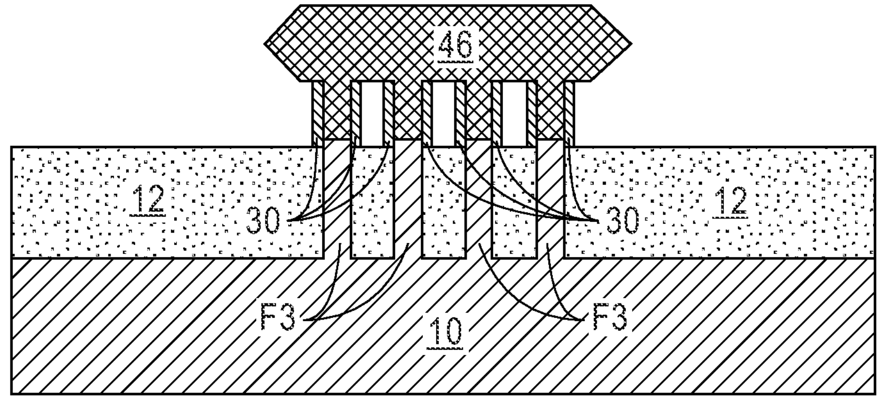
Figure 9G:
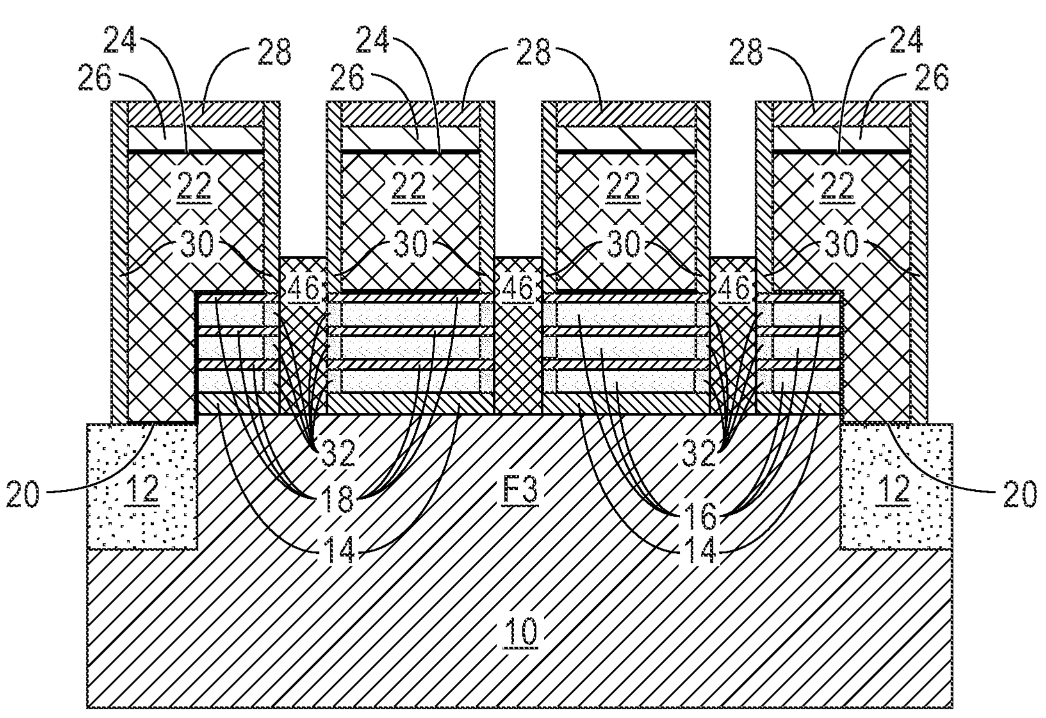
Figure 9H:
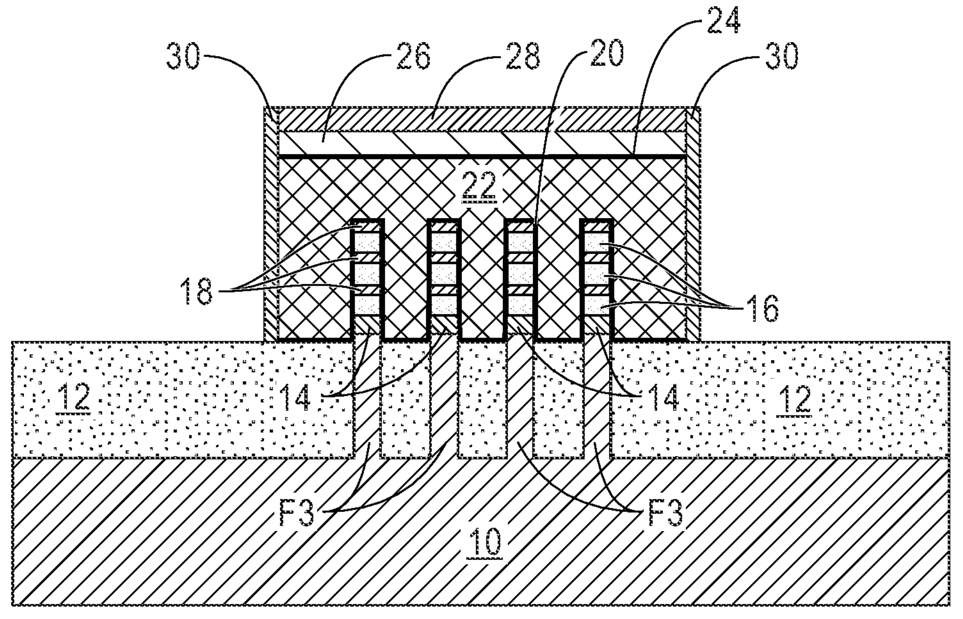
Figure 10B:
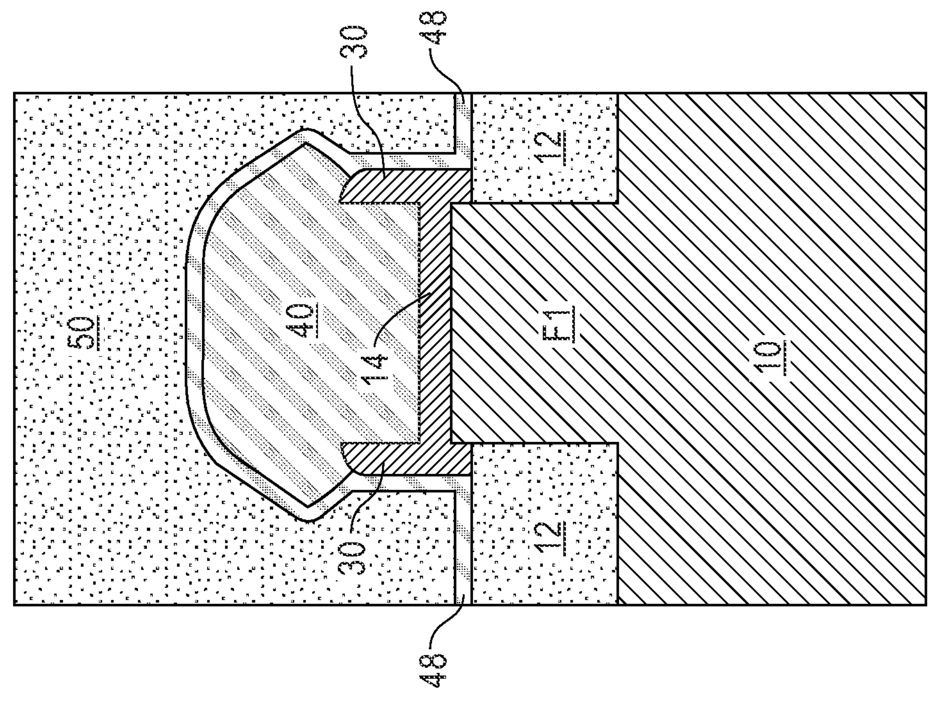
FIGS. 10A-10H are cross sectional views of the exemplary structures shown in FIGS. 9A-9H, respectively, after forming an etch stop liner and forming an interlayer dielectric (ILD) material layer in each of the device regions.
Figure 10A:
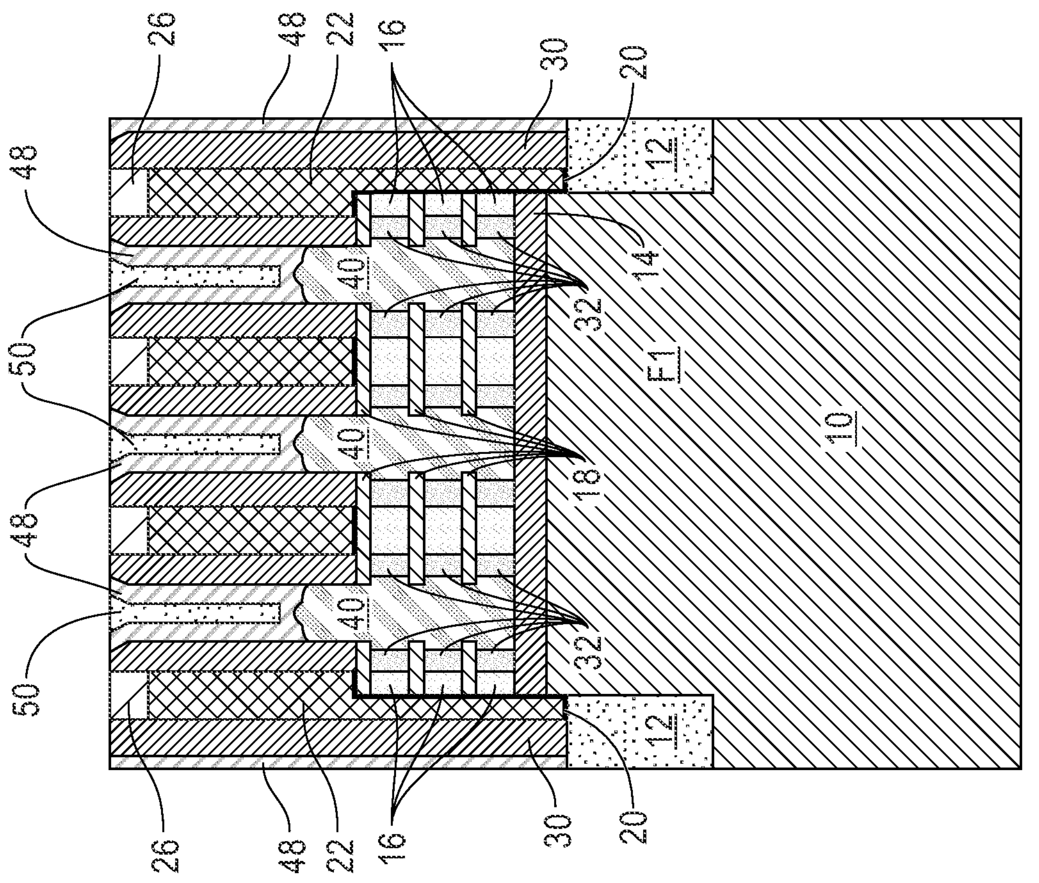
Figure 10C:
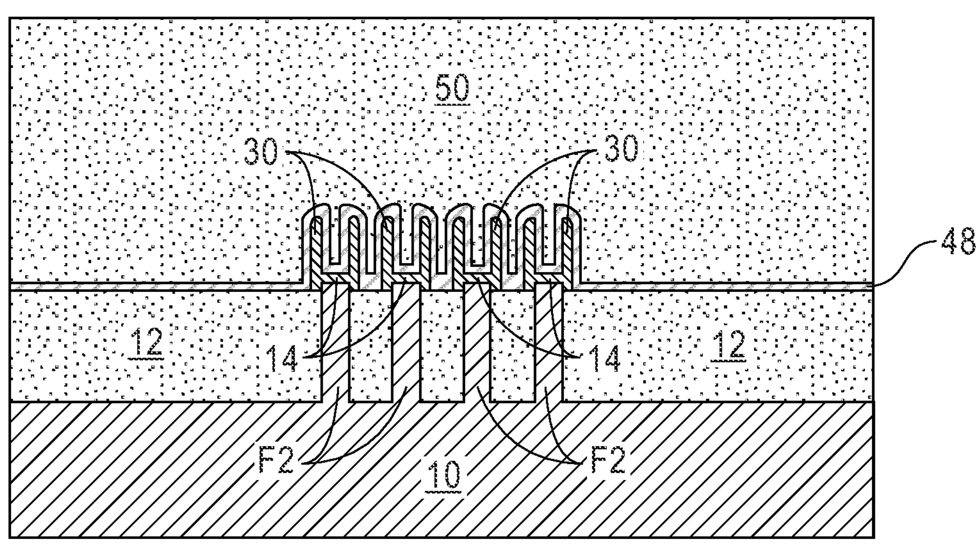
Figure 10D:
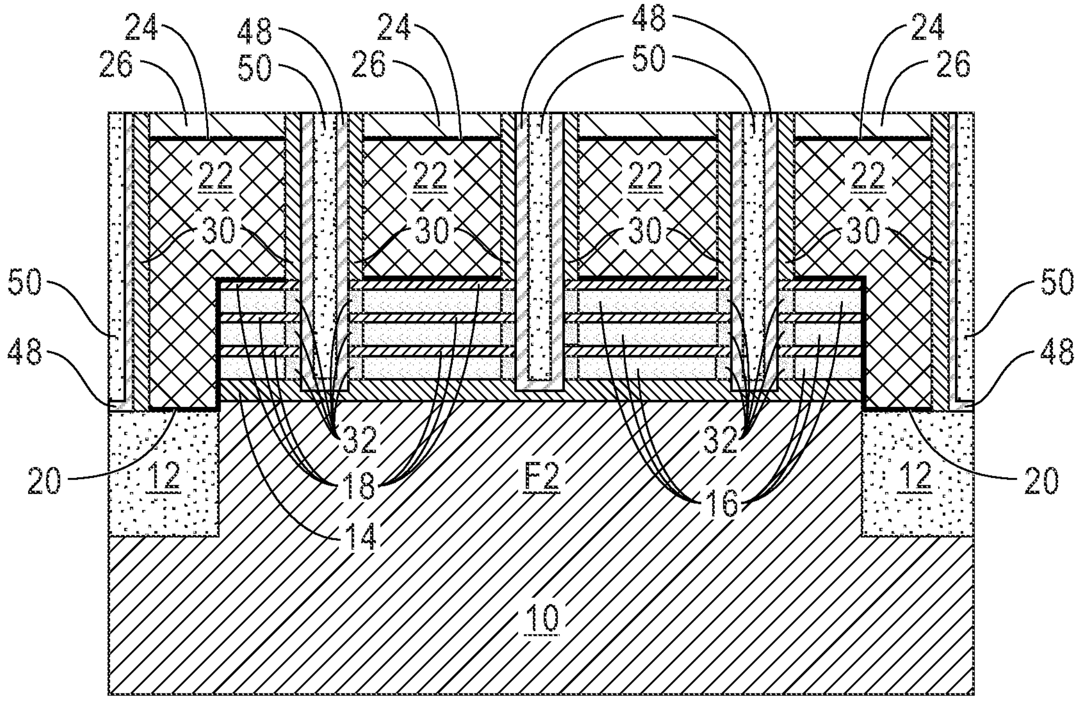
Figure 10E:
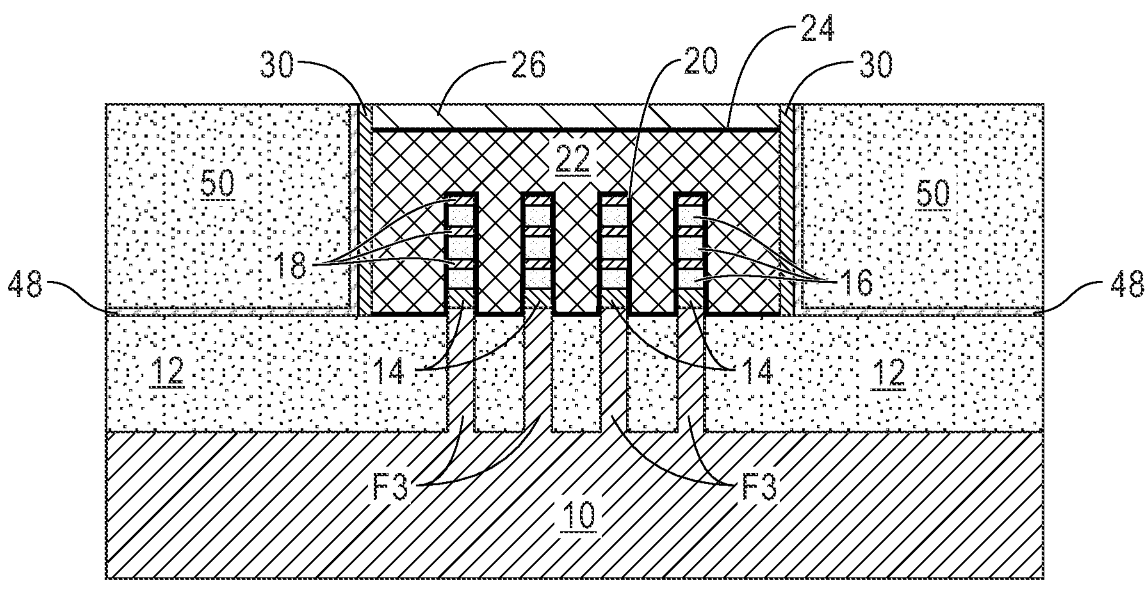
Figure 10F:
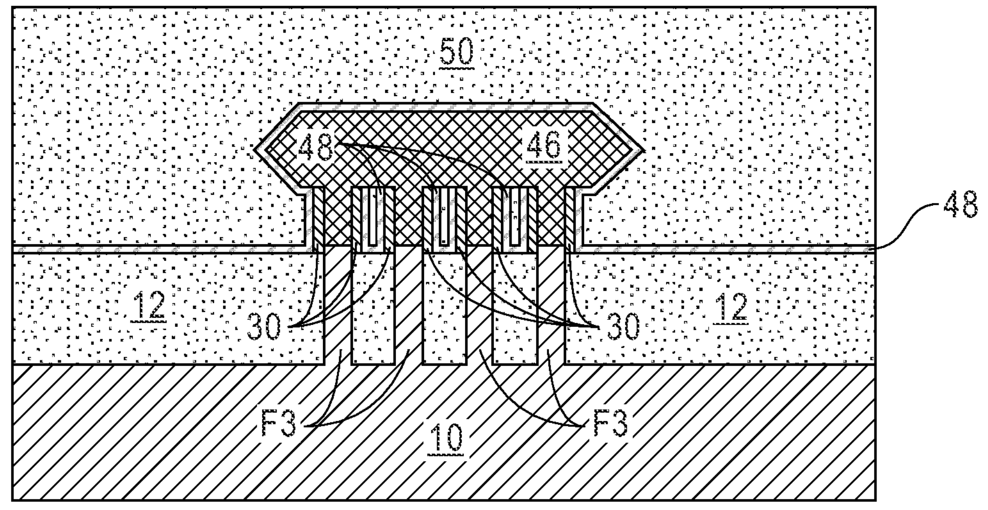
Figure 10G:
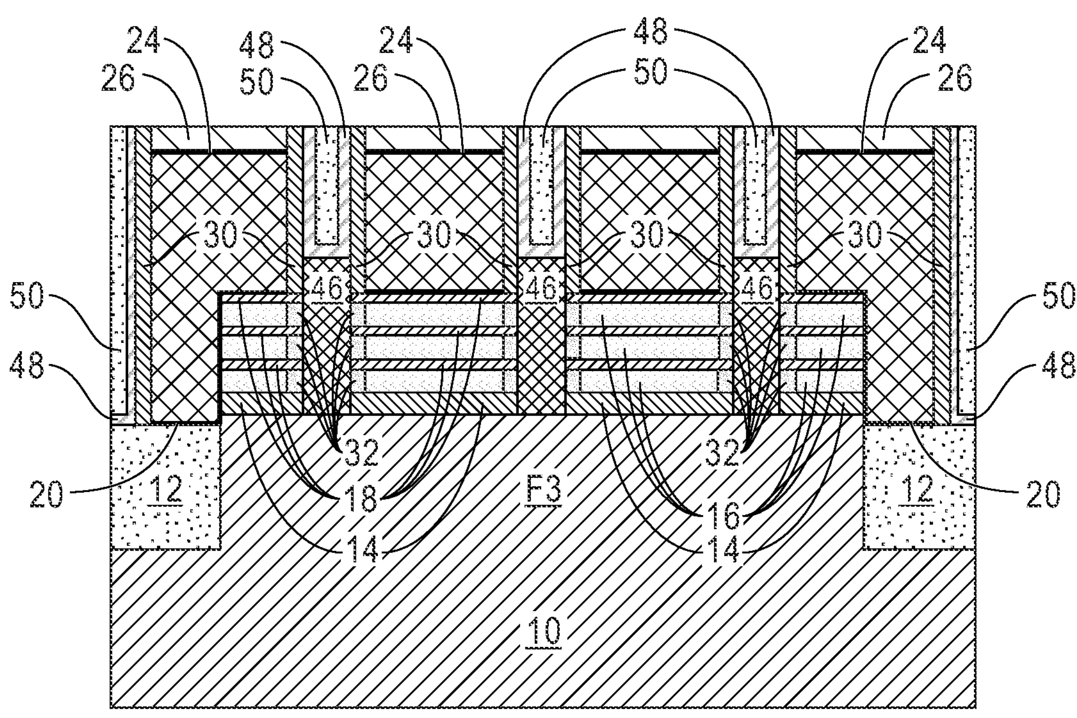
Figure 10H:
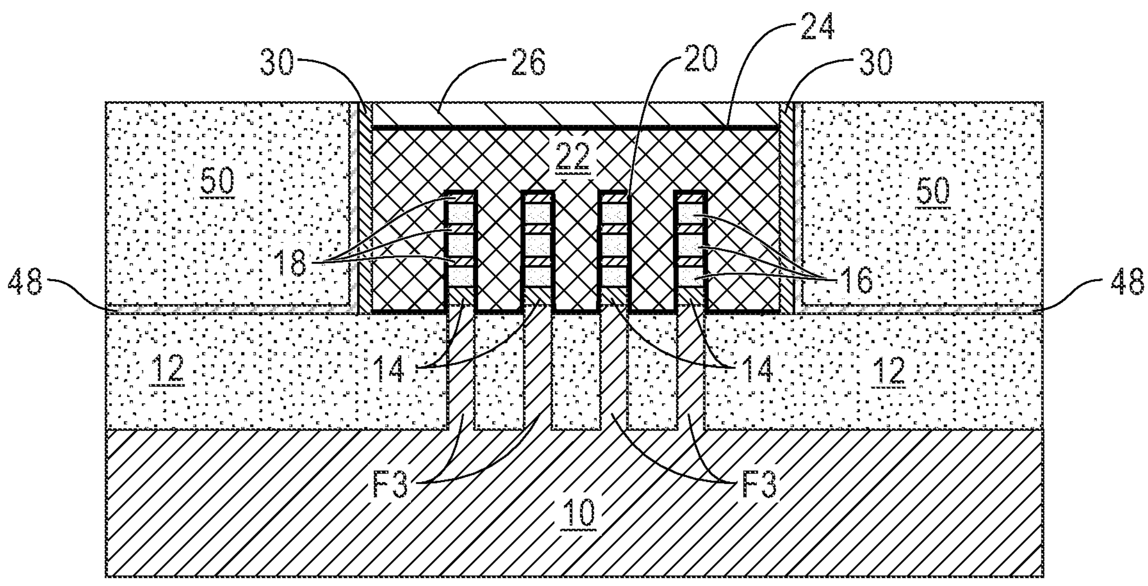
Figure 11B:
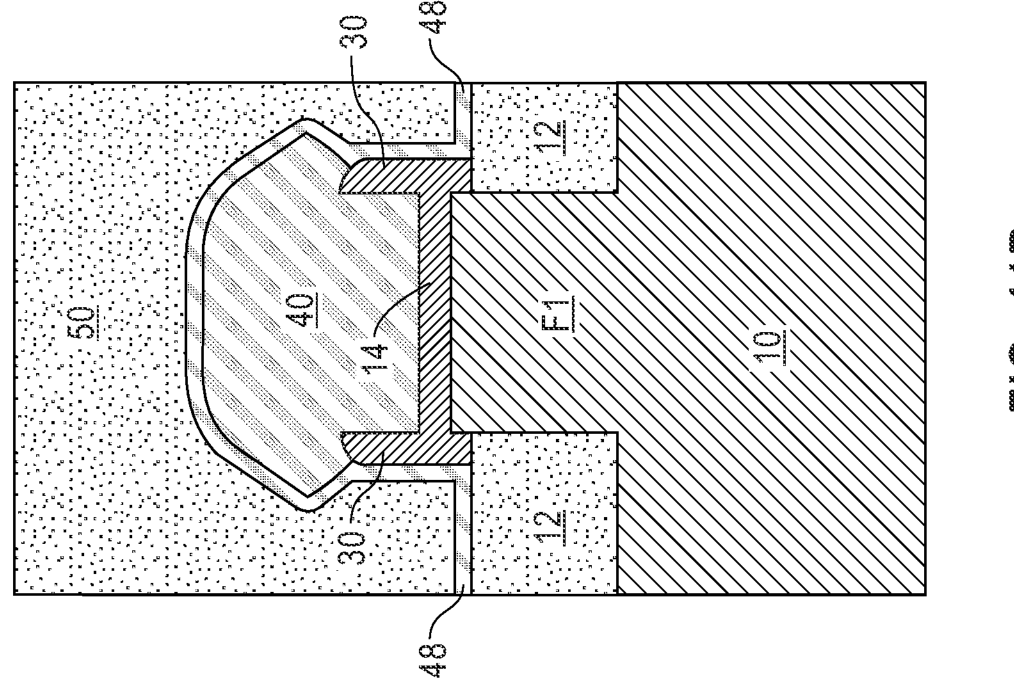
FIGS. 11A-11H are cross sectional views of the exemplary structures shown in FIGS. 10A-10H, respectively, after removing the hard mask capped sacrificial gate structure and each sacrificial semiconductor material nanosheet from the logic device region to provide a logic device gate opening, removing the hard mask capped sacrificial gate structure and each sacrificial semiconductor material nanosheet from the first resistor device region to provide a first nanosheet device gate opening, and removing the hard mask capped sacrificial gate structure and each sacrificial semiconductor material nanosheet from the second resistor device region to provide a second nanosheet device gate opening.
Figure 11A:
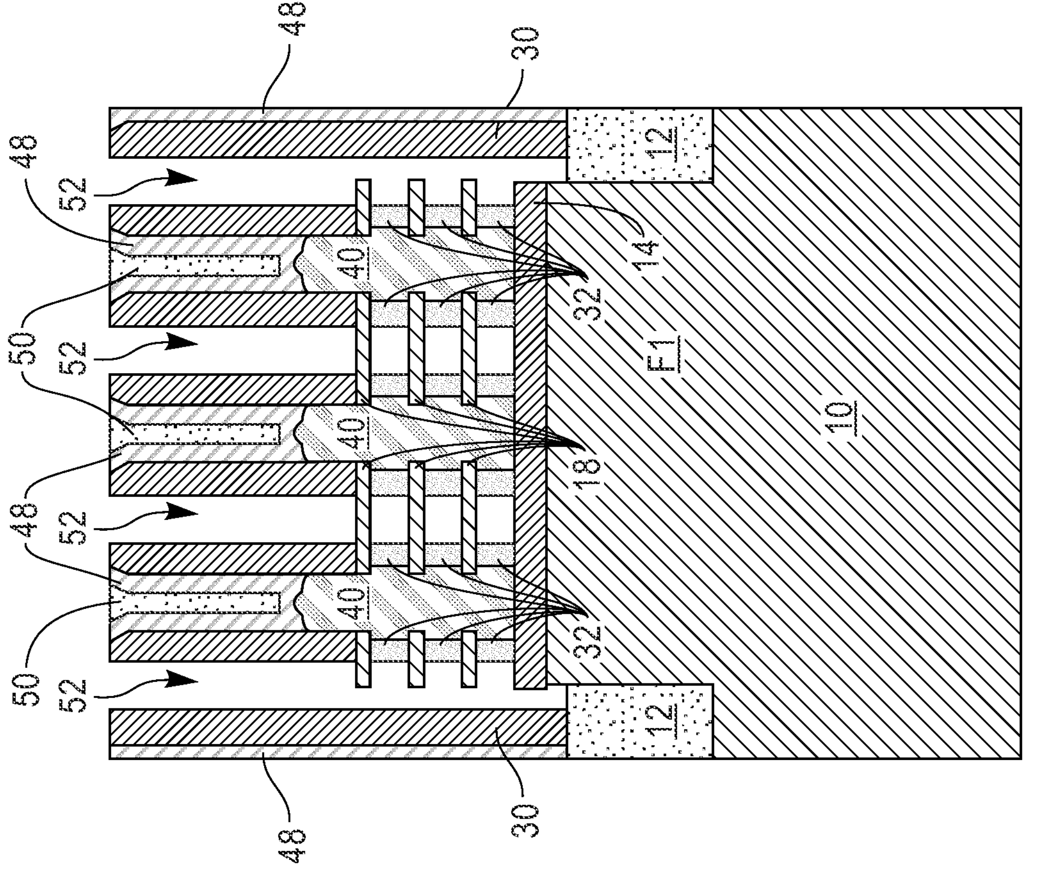
Figure 11C:
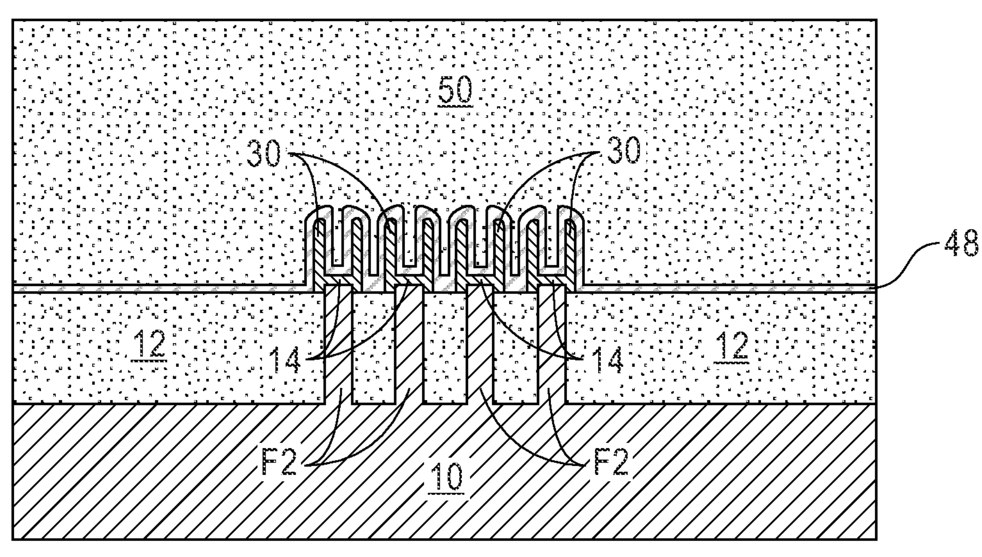
Figure 11D:
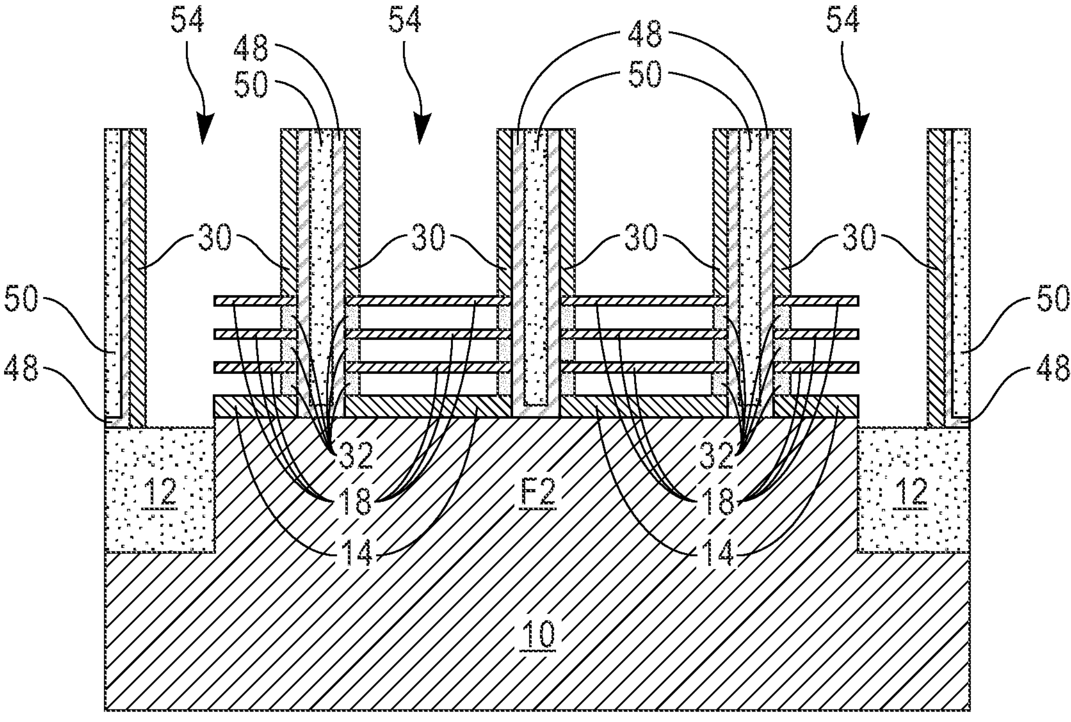
Figure 11E:
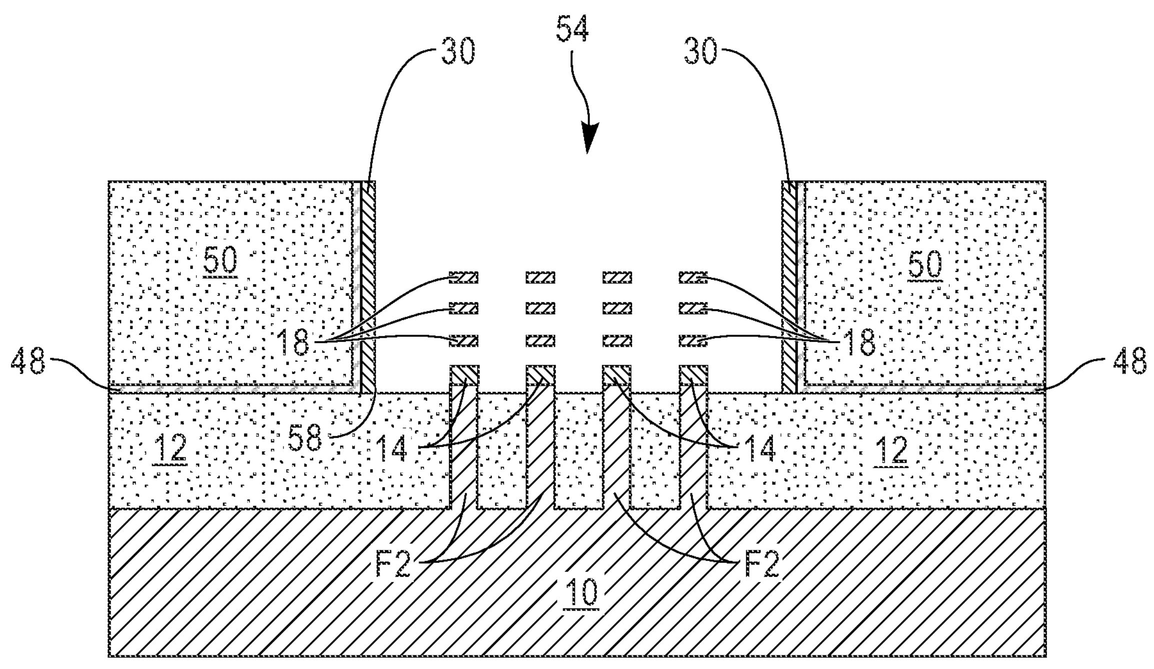
Figure 11F:
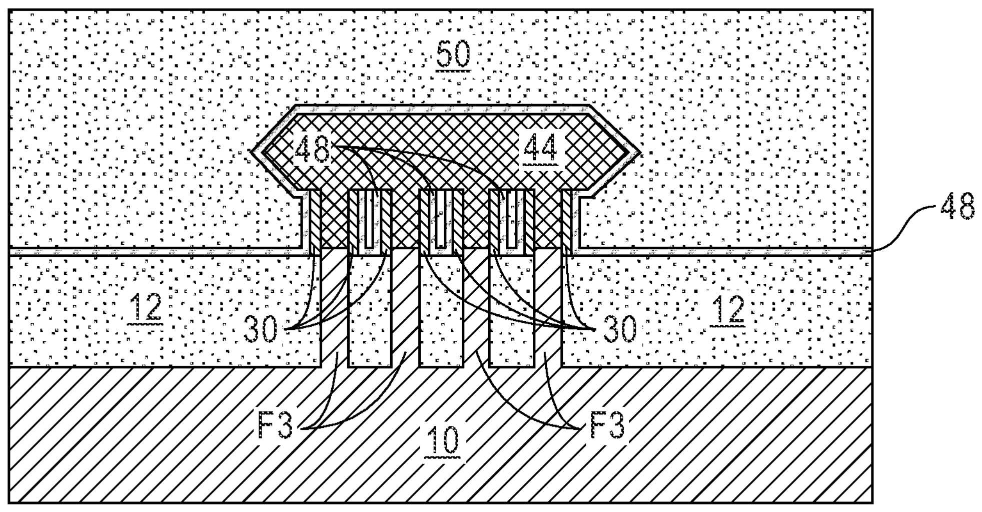
Figure 11G:
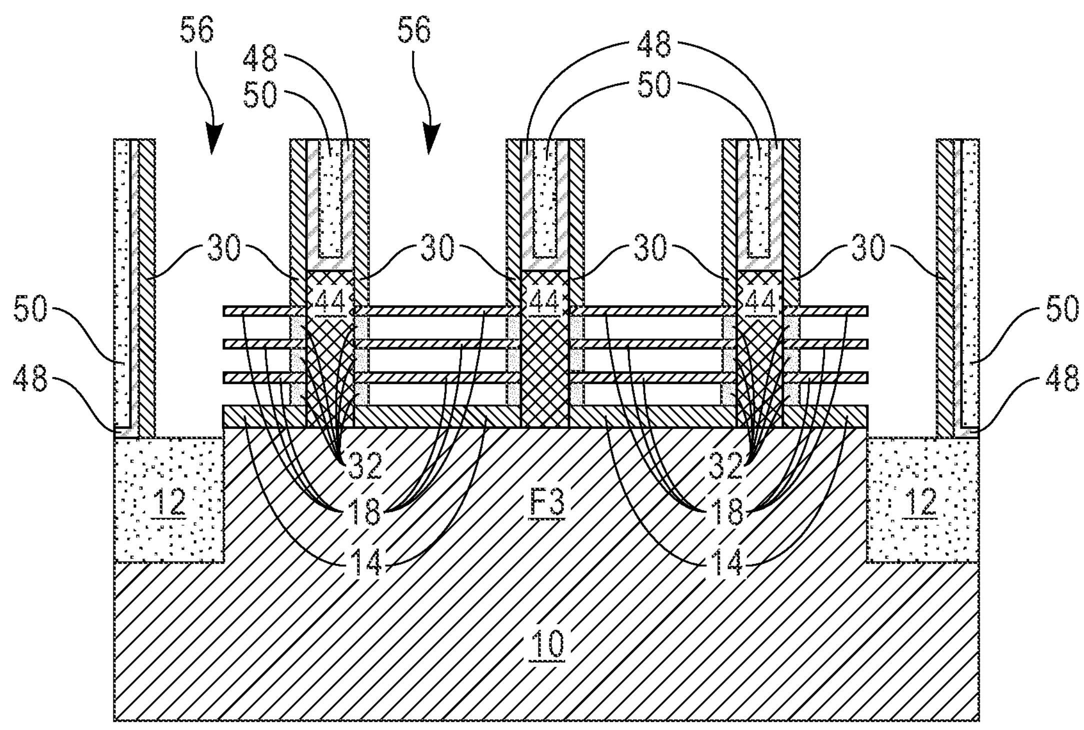
Figure 11H:
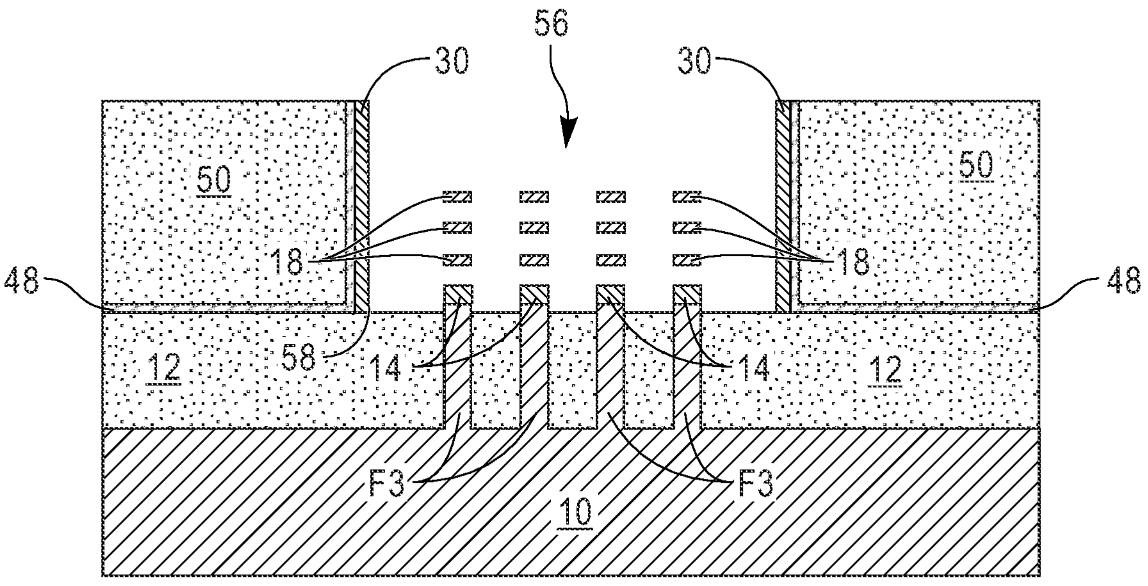
Figure 12B:
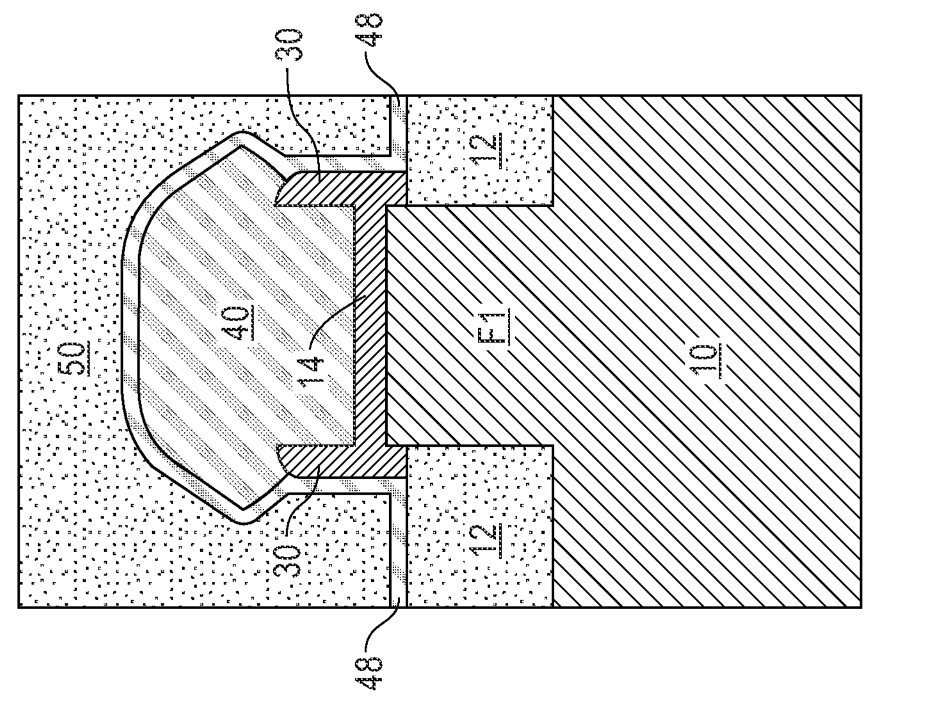
FIGS. 12A-12H are cross sectional views of the exemplary structures shown in FIGS. 11A-11H, respectively, after forming a gate structure containing a gate cap in the logic device gate opening, a gate structure containing a gate cap in the first nanosheet device gate opening, and a gate structure containing a gate cap in the second nanosheet device gate opening.
Figure 12A:
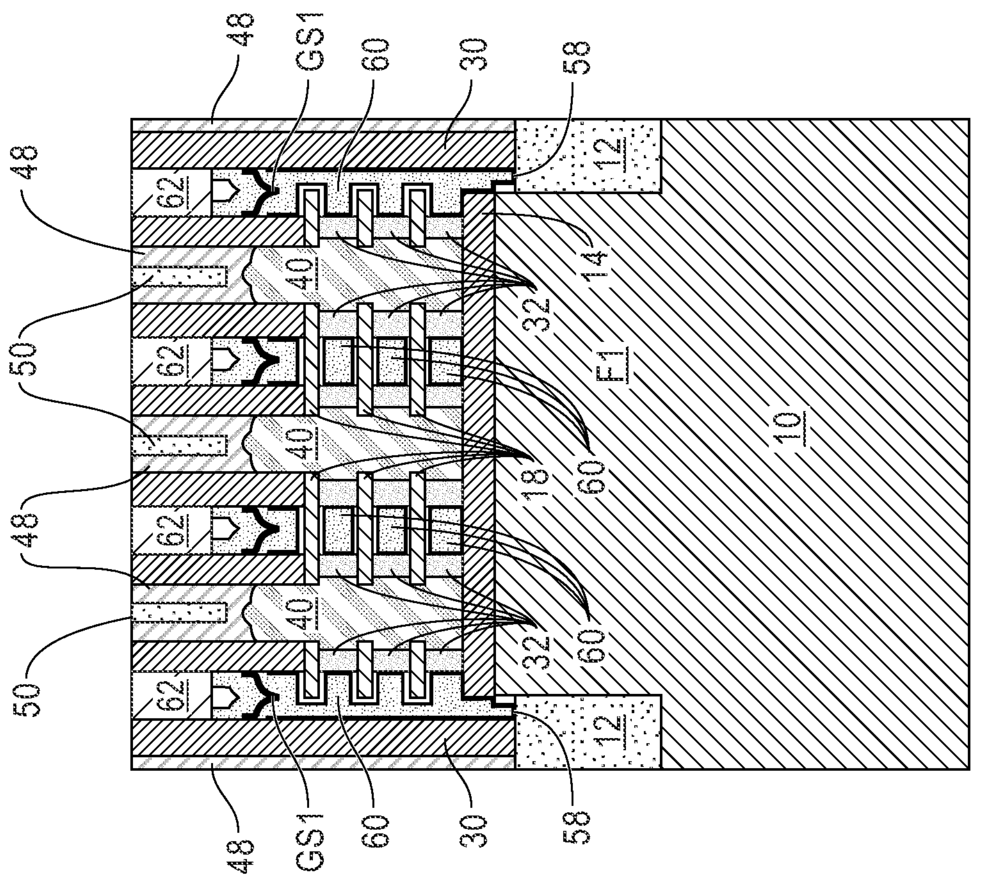
Figure 12C:
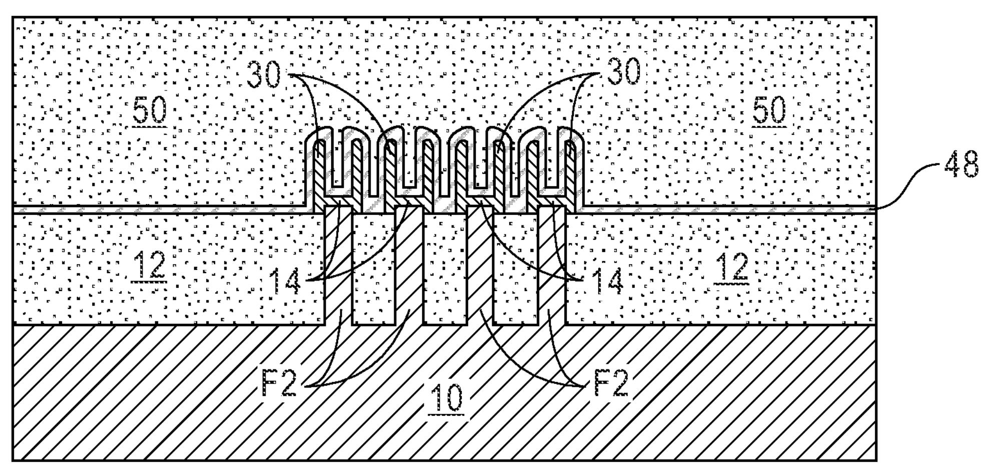
Figure 12D:
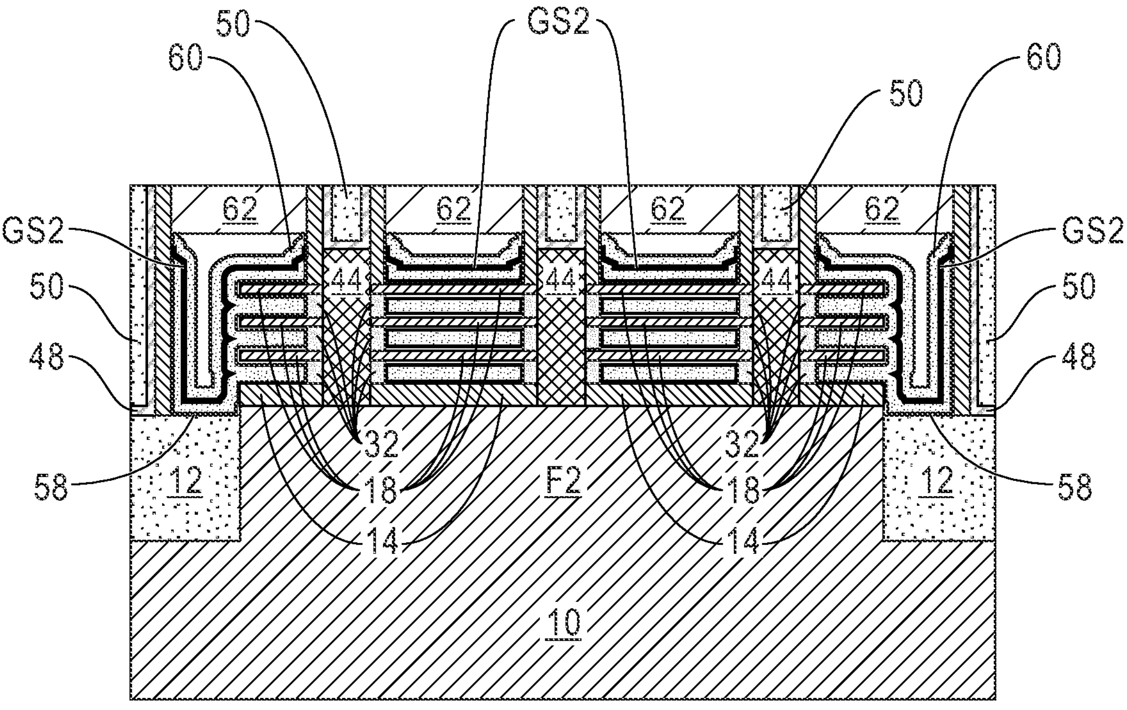
Figure 12E:
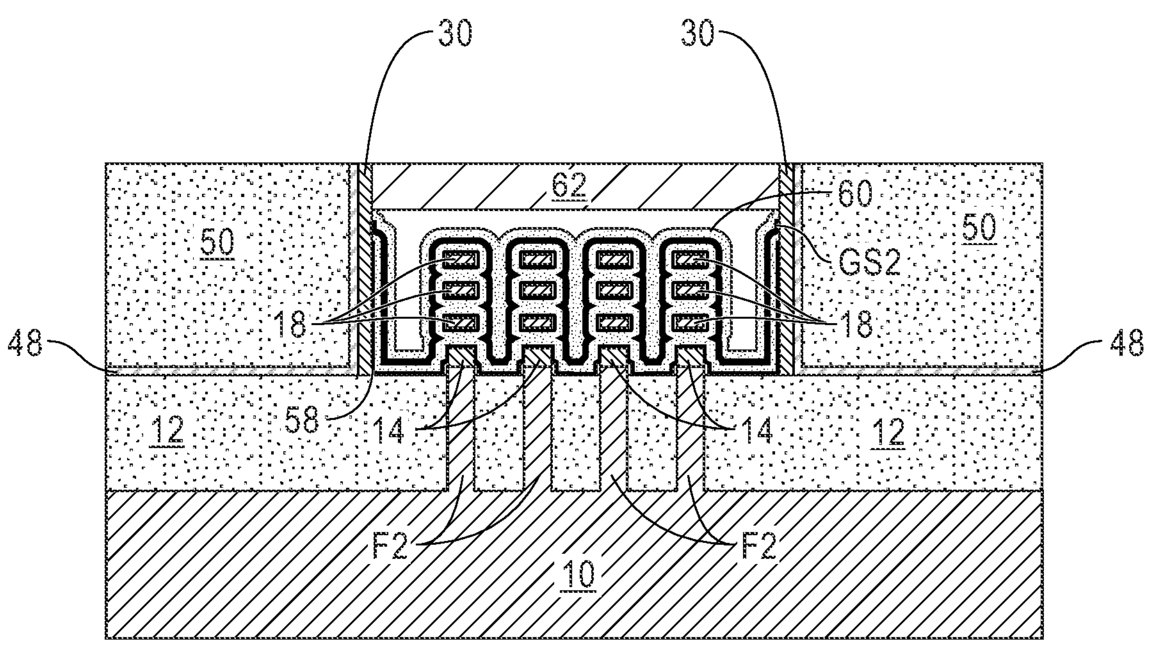
Figure 12F:
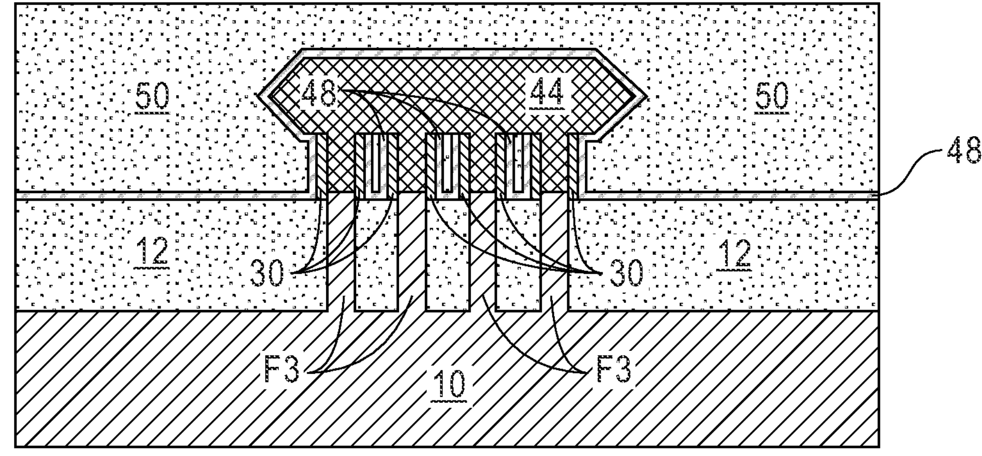
Figure 12G:
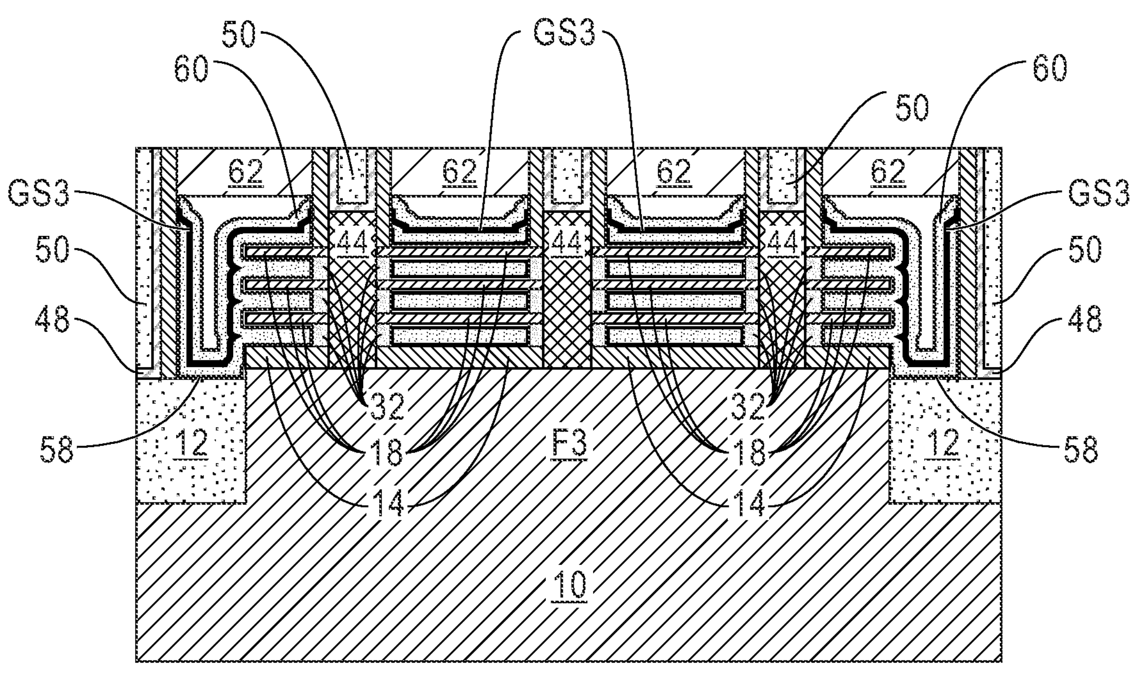
Figure 12H:
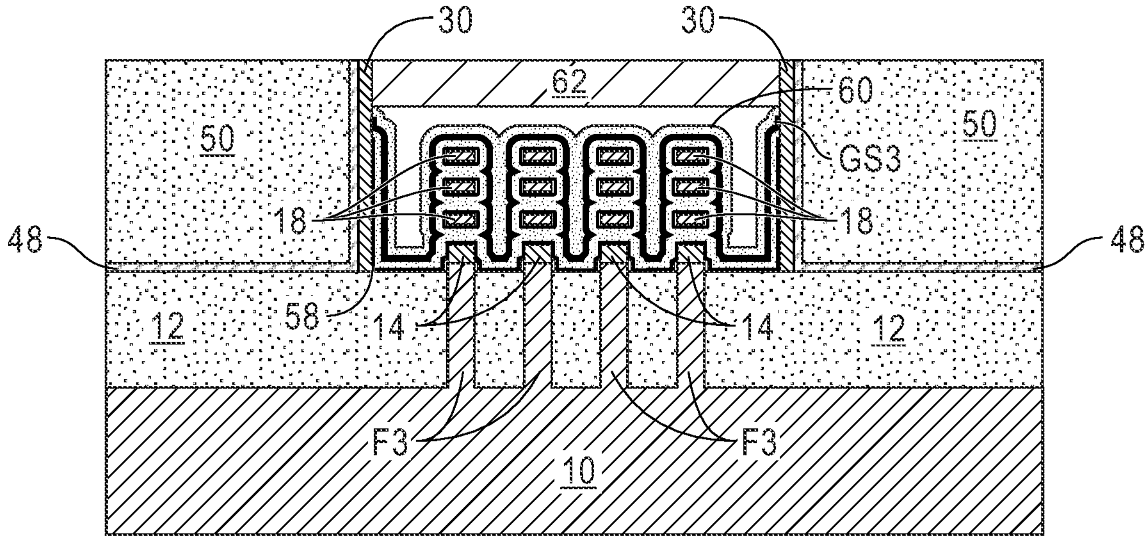
Figure 13B:
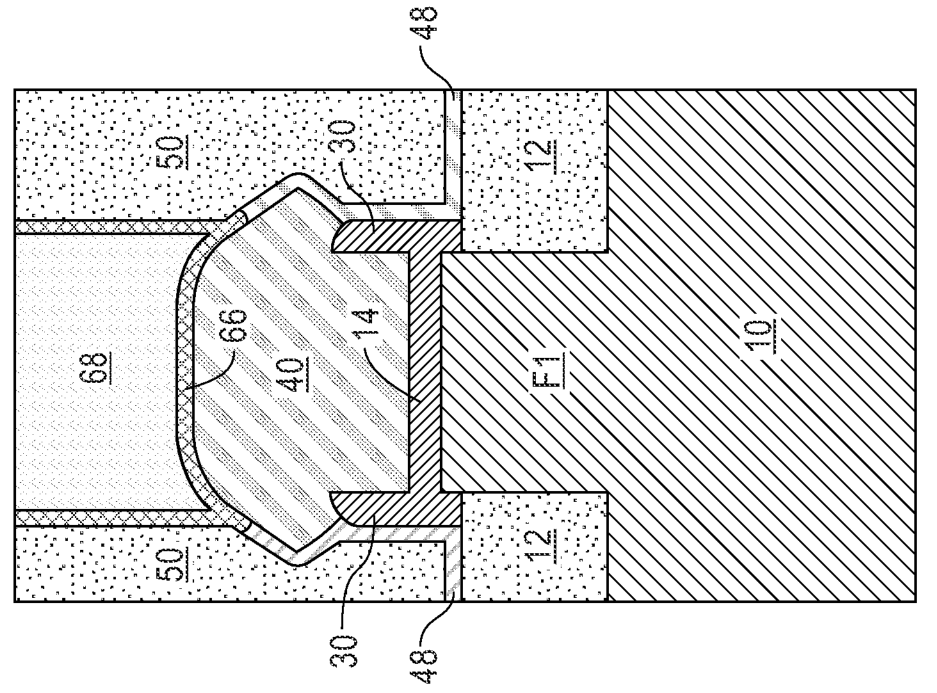
FIGS. 13A-13H are cross sectional views of the exemplary structures shown in FIGS. 12A-12H, respectively, after forming a S/D contact structure in the logic device region.
Figure 13A:
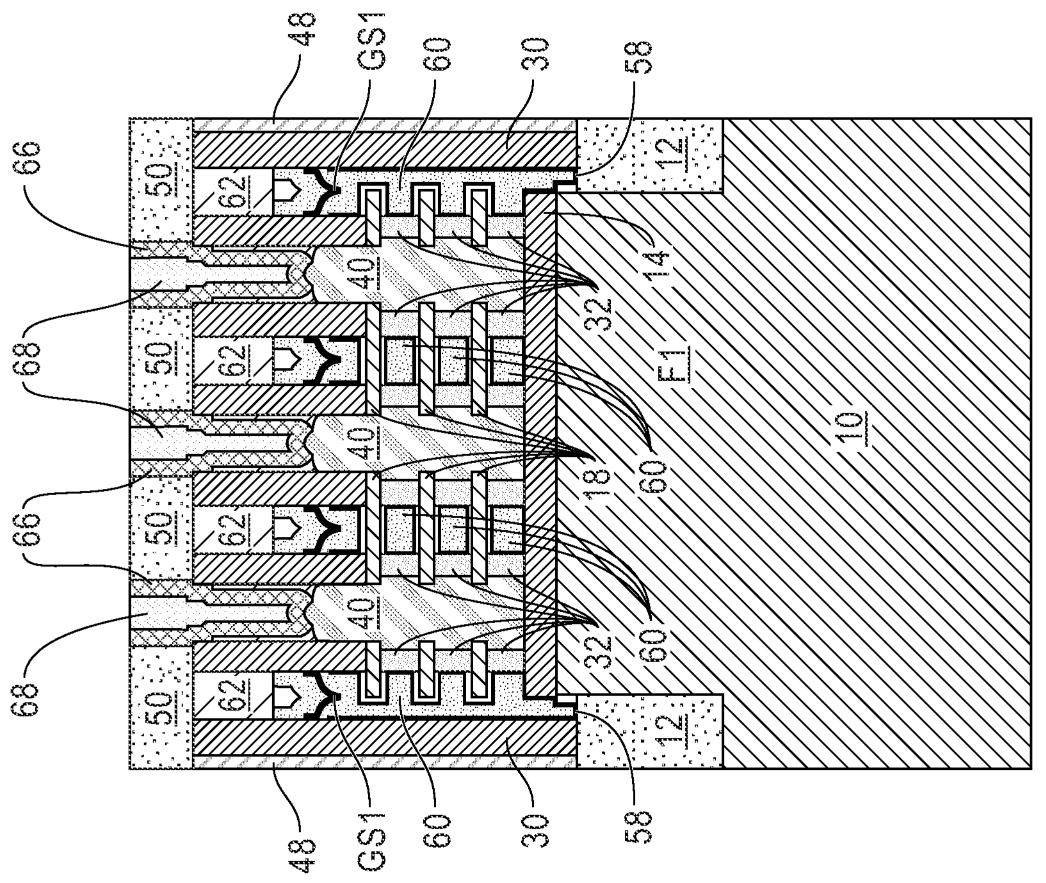
Figure 13C:
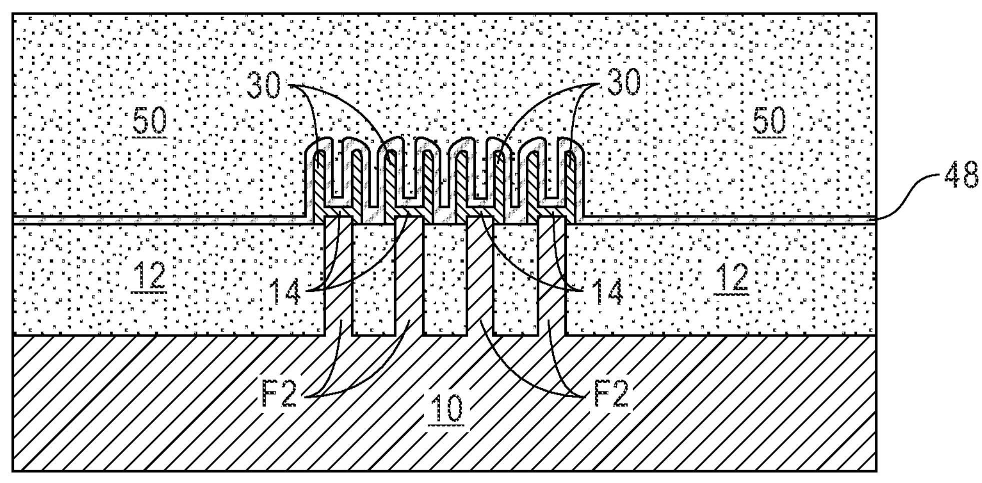
Figure 13D:
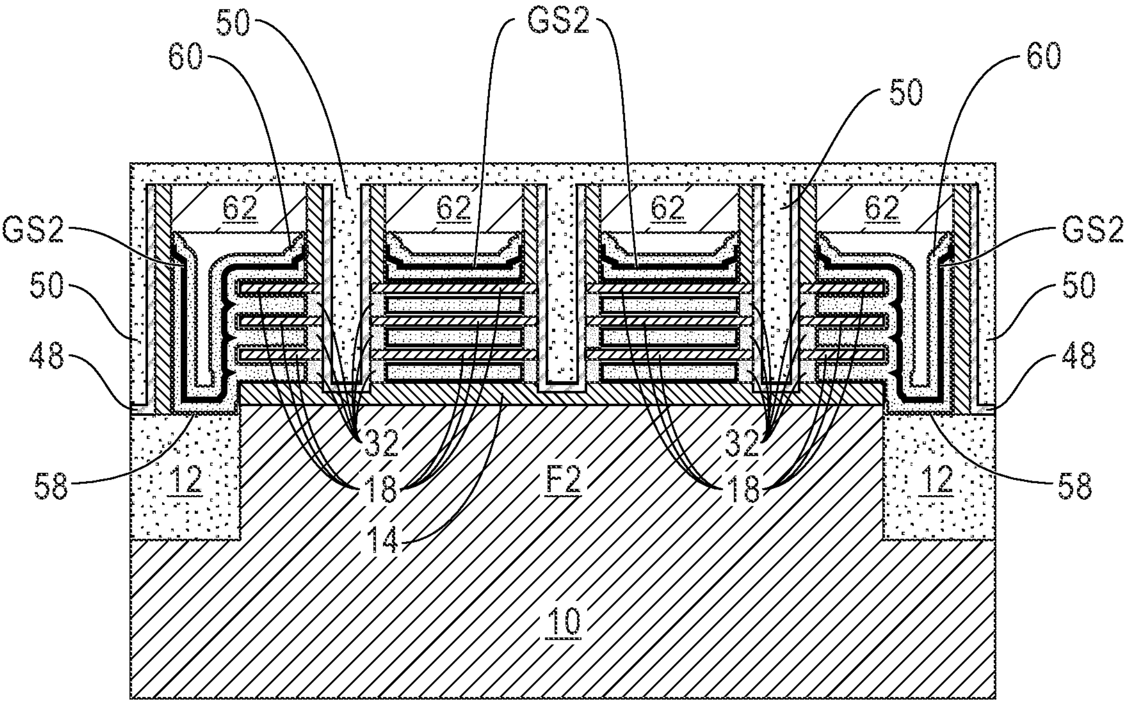
Figure 13E:
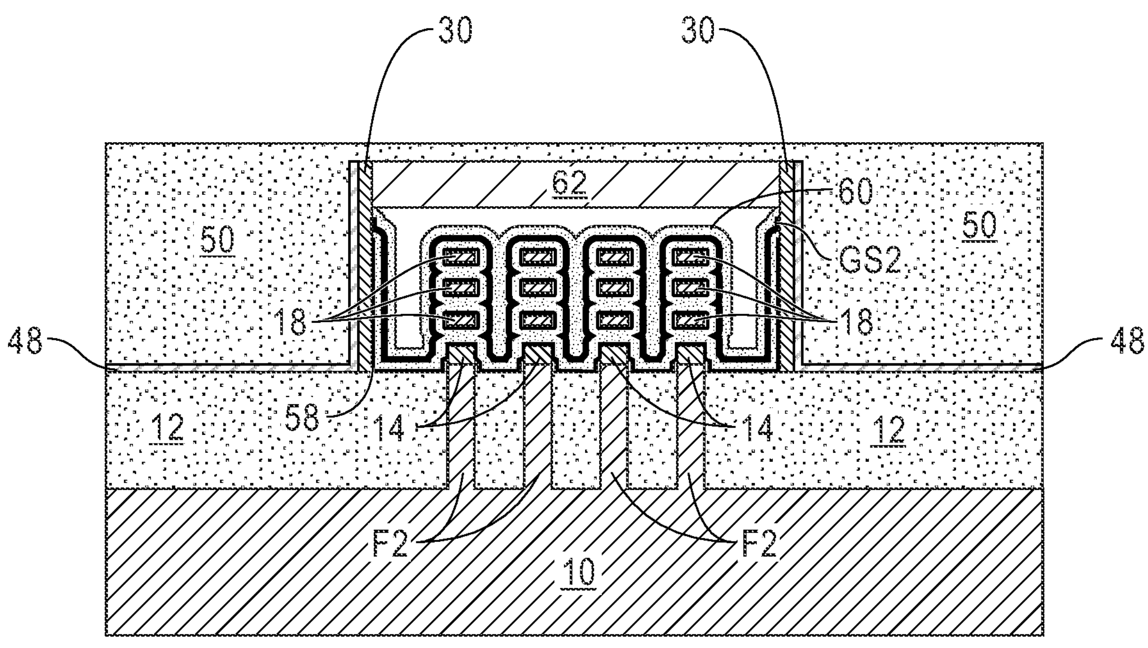
Figure 13F:
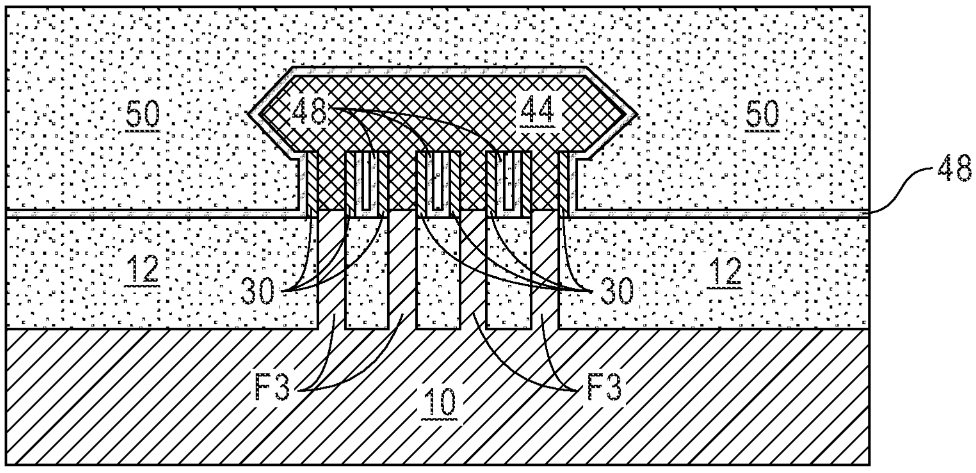
Figure 13G:
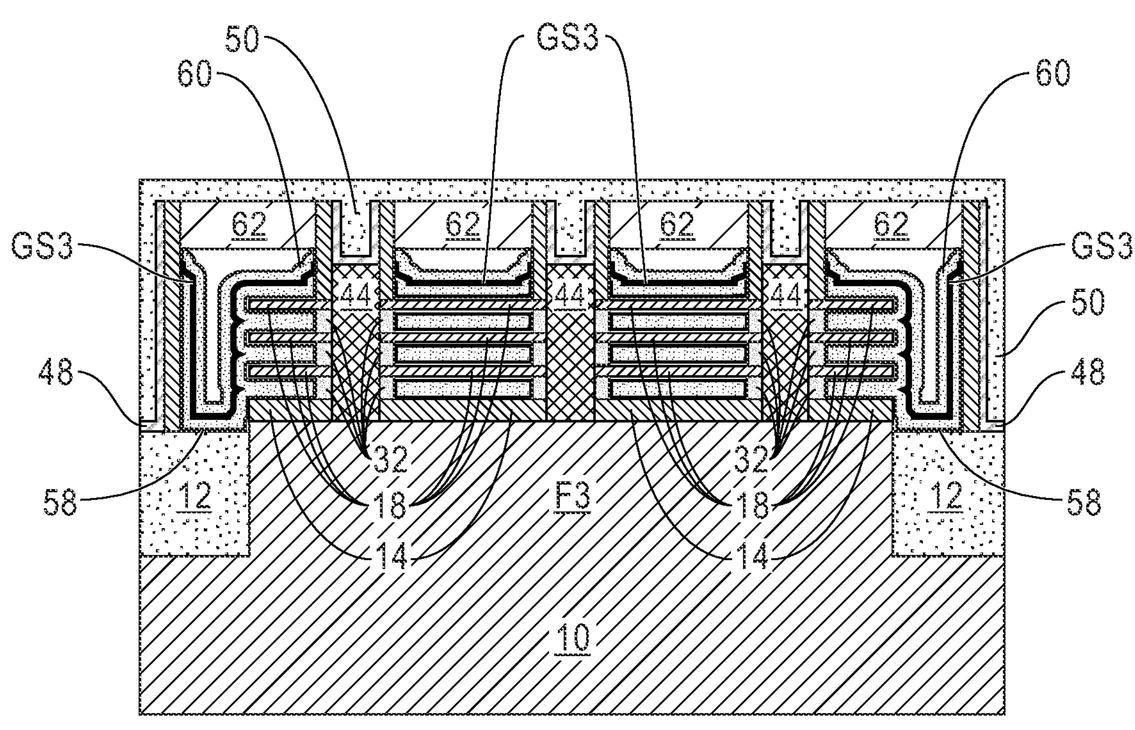
Figure 13H:
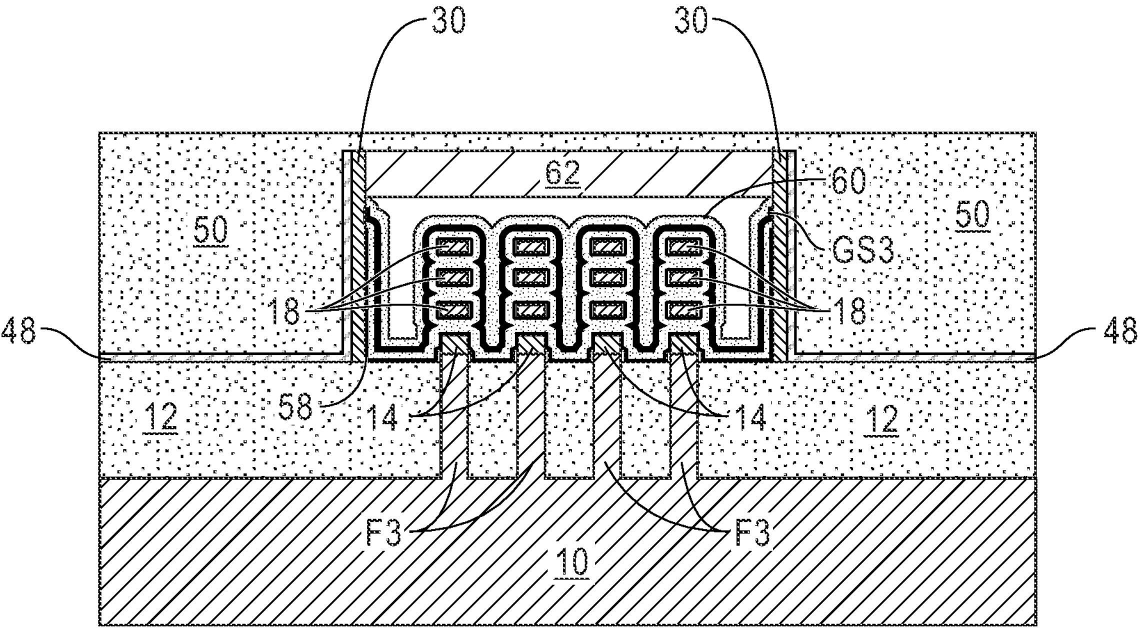
Figure 14B:
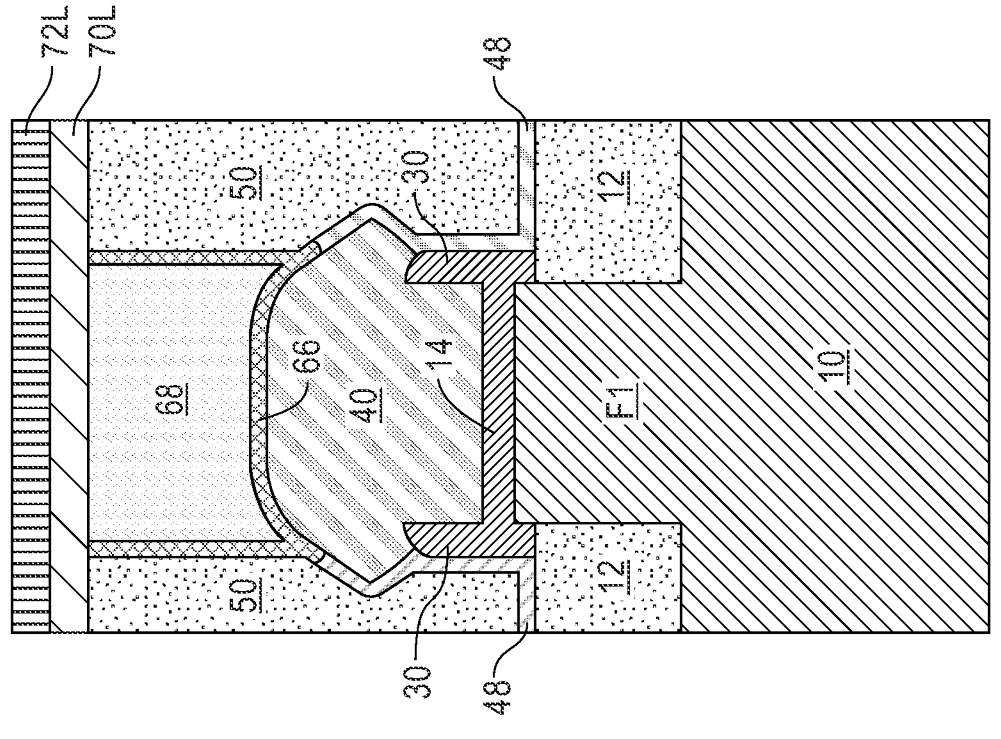
FIGS. 14A-14H are cross sectional views of the exemplary structures shown in FIGS. 13A-13H, respectively, after forming a first dielectric material layer and a metal resistor layer in each of the logic device region, the first resistor device region, and the second resistor device region.
Figure 14A:
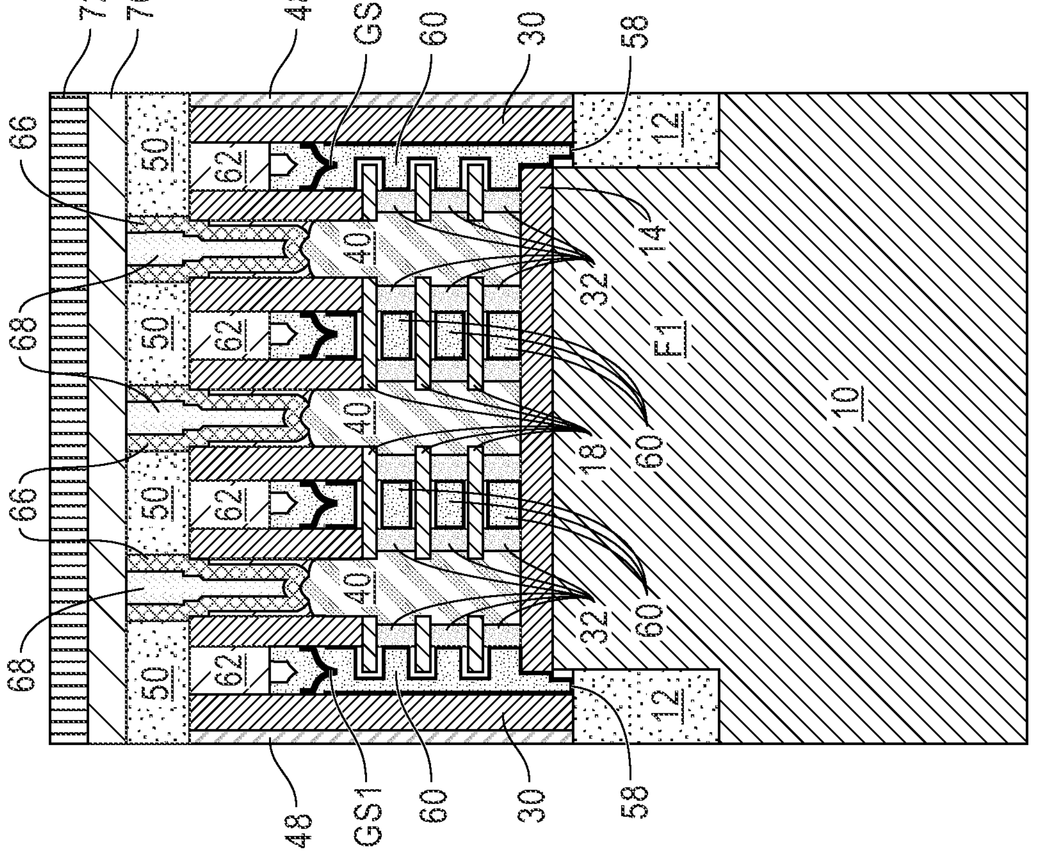
Figure 14C:
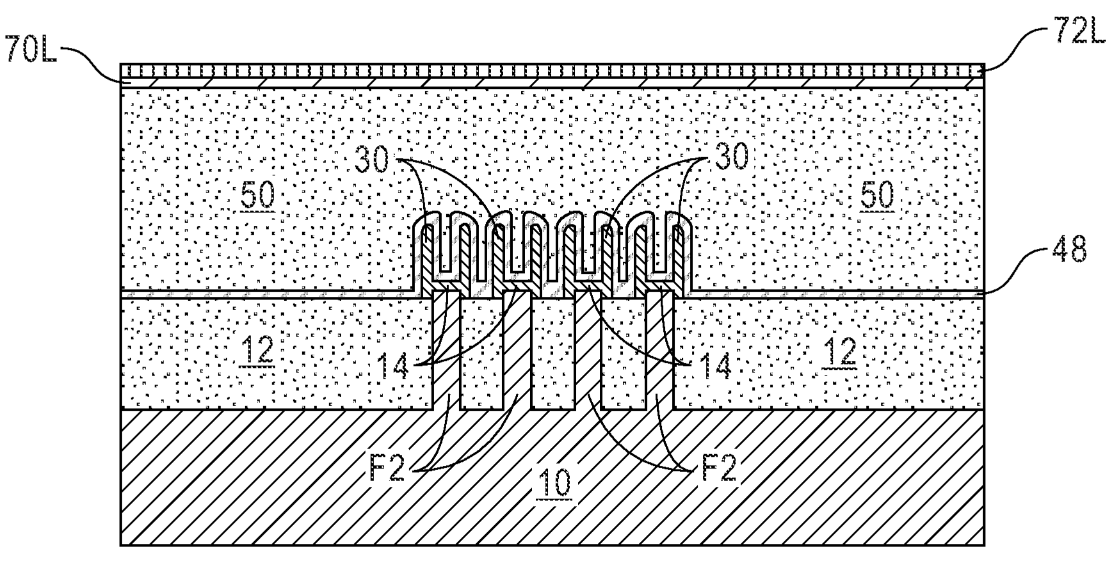
Figure 14D:
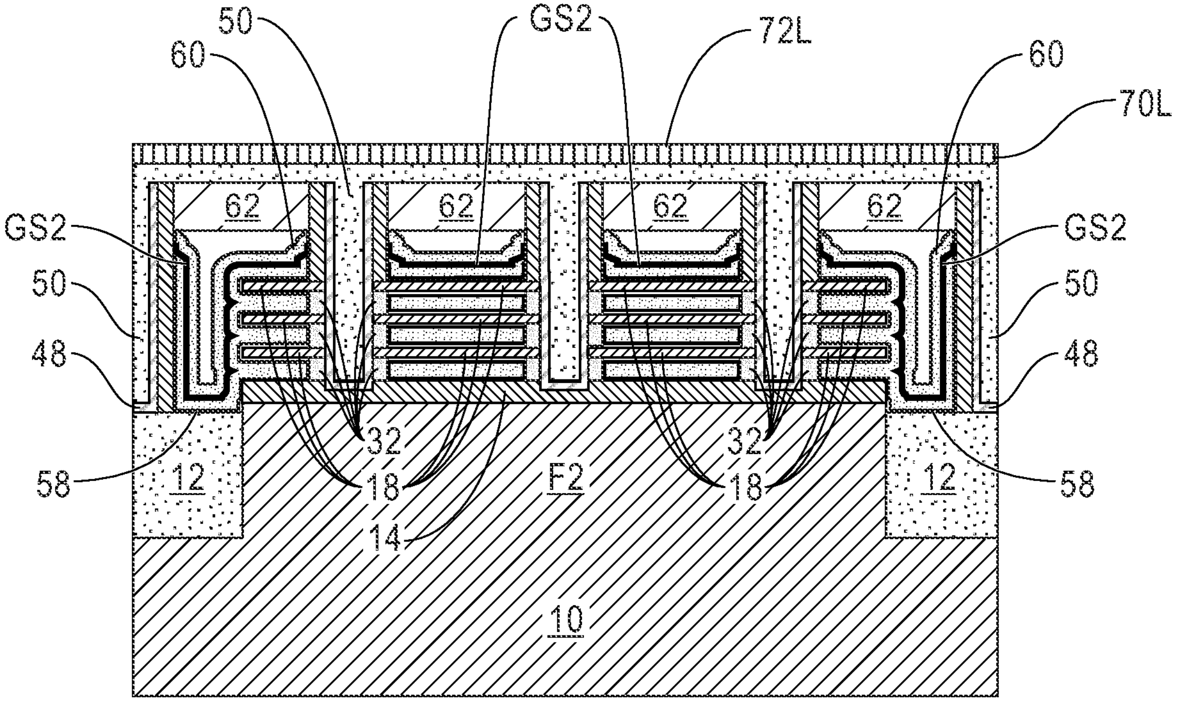
Figure 14E:
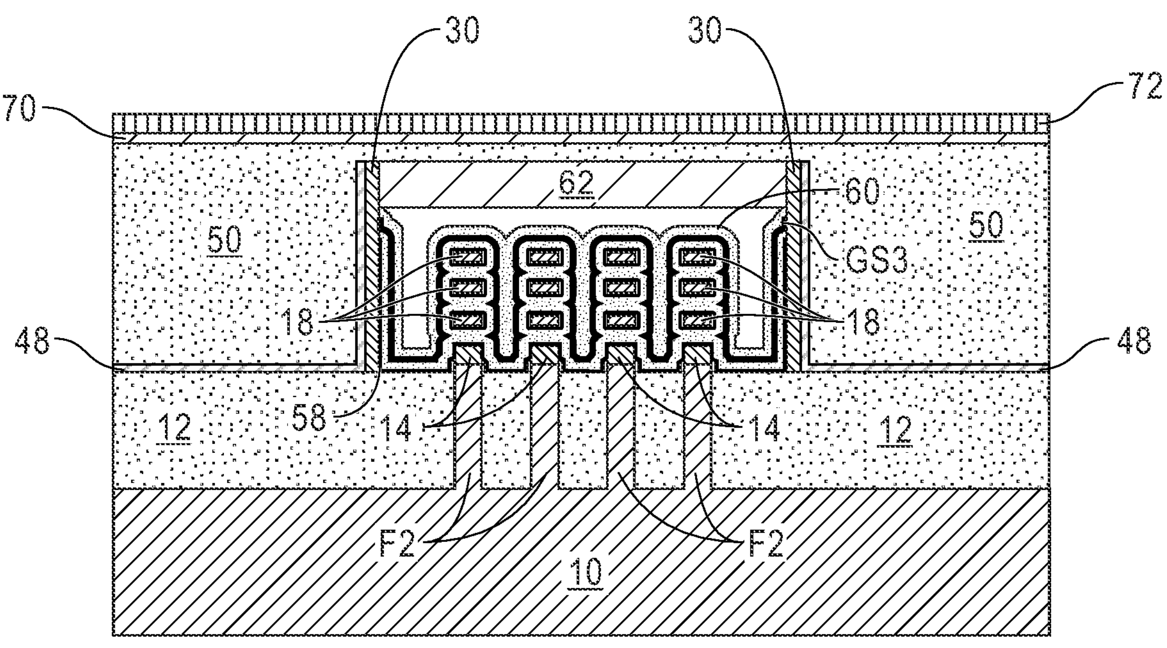
Figure 14F:
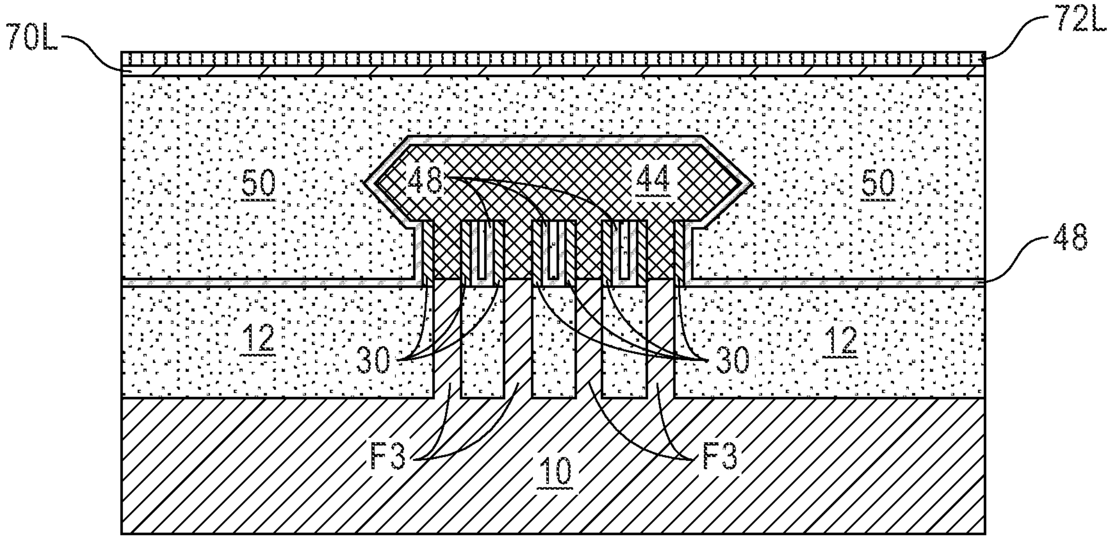
Figure 14G:
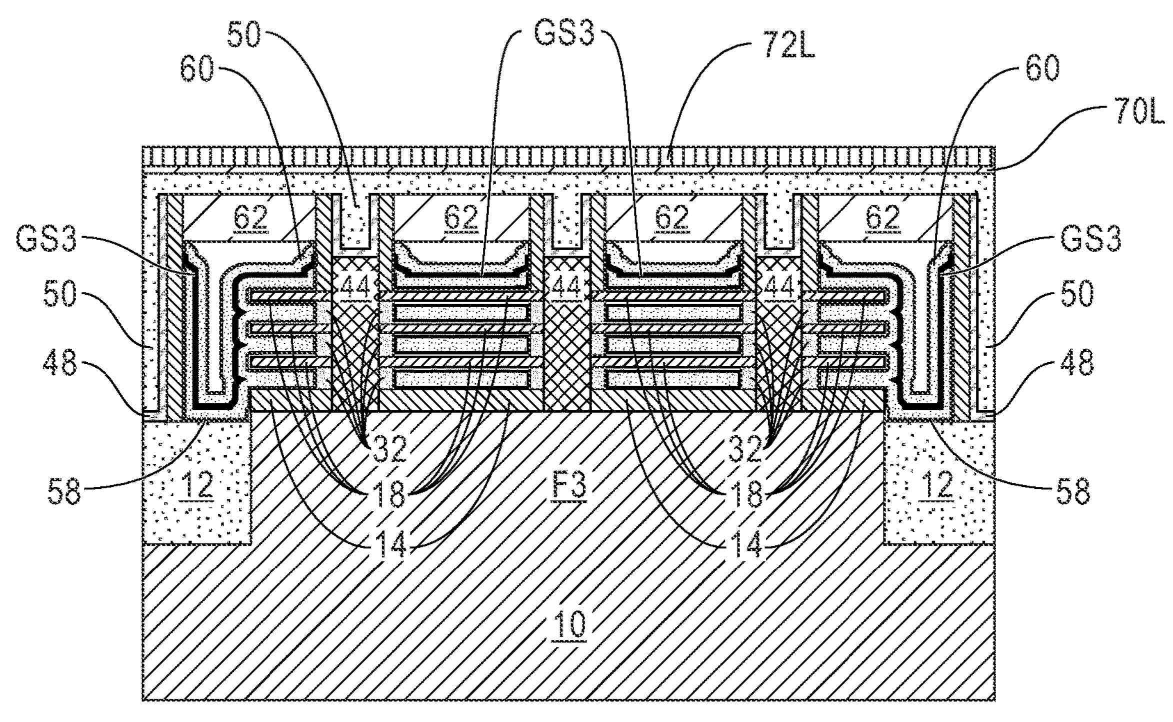
Figure 14H:
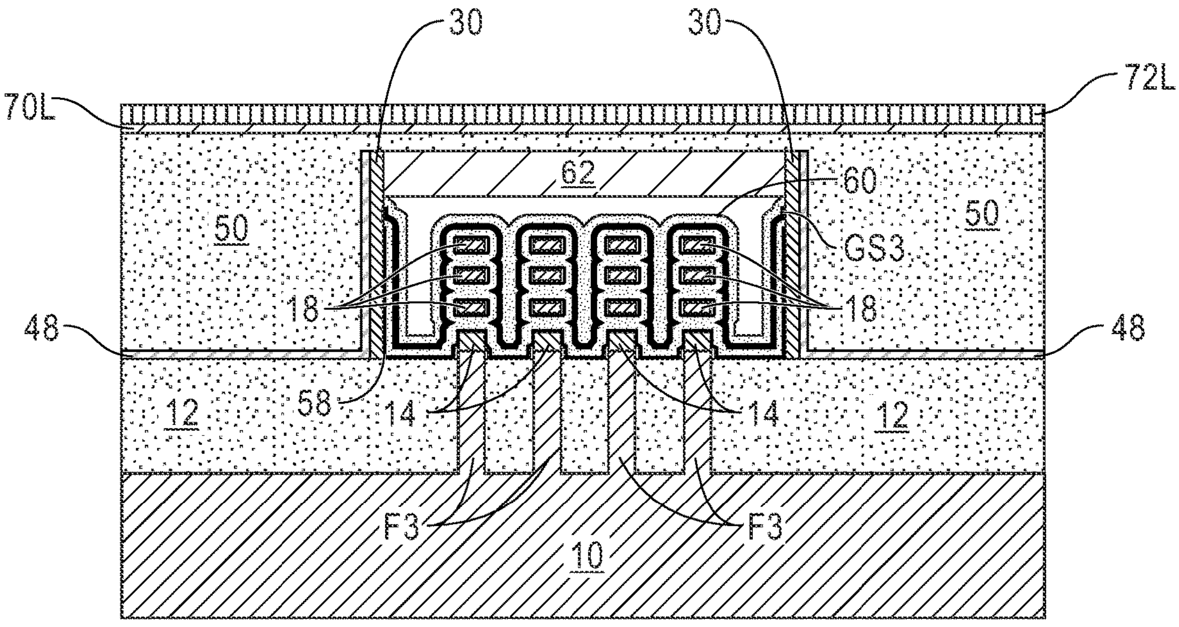

Referring now to FIGS. 7A-7H, there are illustrated the exemplary structures shown in FIGS. 6A-6H, respectively, after forming a second conformal dielectric material liner 36' for patterning of an nFET device. Note that FIGS. 7A and 7B show an nFET device region that is within the logic device region 100, the logic device region 100 also includes a pFET device region that includes the pFET device processed above. Also, note that the first and second resistor device regions shown in FIGS. 7C-7H, the conformal dielectric material liner 36 also includes the second conformal dielectric material liner 36' (not shown for clarity). The second conformal dielectric material liner 36' is composed of one of the dielectric materials mentioned above for conformal dielectric material liner 36. The second conformal dielectric material liner 36' can be formed utilizing one of the deposition process mentioned above for forming the conformal dielectric material liner 36. The second conformal dielectric material liner 36' can have a thickness within the thickness range mentioned above for conformal dielectric material liner 36.

Referring now to FIGS. 8A-8H, there are illustrated the exemplary structures shown in FIGS. 7A-7H after performing nFET S/D lithography and removing the second conformal dielectric material liner 36' in the logic device region 100 and the conformal dielectric material liner 36 from the second resistor device region; note a mask 42 is formed in the first resistor device region 102, but not the second resistor device region 104, during this step.

The FET S/D lithography includes forming mask 42 in the first resistor device region 102. Mask 42 includes an organic dielectric material as mentioned above for mask 33. Mask 42 can be formed utilizing the technique mentioned above for forming mask 33. The second conformal dielectric material liner 36' is removed from the logic device region 100 and the conformal dielectric material liner 36 is removed from the second resistor device region 104 by utilizing an etching process that is selective in removing the dielectric material that provides the conformal dielectric material liners.

Referring now to FIGS. 9A-9H, there are illustrated the exemplary structures shown in FIGS. 8A-8H, respectively, after forming an n-type source/drain (S/D) region 44 for the nFET device in the logic device region 100 and an n-type source/drain region 46 in the second resistor device region 104; note that the mask 42 is typically removed from the first resistor device region 102 prior to forming the n-type source/drain regions 44, 46. Mask 42 can be removed utilizing any material removal that removes the organic dielectric material that provides mask 42. In some embodiments, the formation of the p-type S/D region 40 and the n-type S/D regions 44, 46 can be reversed, i.e., the n-type S/D regions 44, 46 are formed prior to forming the p-type S/D region 40. In yet another embodiments, the processing of the present application can be altered such that source/drain regions 44, 46 are p-type and the source/drain region 40 is n-type.

The n-type source/drain region 44 in the logic device region 100, which extends outwards from each semiconductor channel material nanosheet 18 sidewall and atop the bottom dielectric isolation layer 14, and the n-type source/drain region 46 in the second device region, which extends outwards from each semiconductor channel material nanosheet 18 sidewall and upward from the third semiconductor sub-fin, F3, as defined above. In the second resistor device region 104, the n-type source/drain region 46 is formed in direct physical contact with the third semiconductor sub-fin, F3.

The n-type source/drain regions 44, 46 comprise a semiconductor material and an n-type dopant. The semiconductor material that provides the n-type source/drain regions 44, 46 can include one of the semiconductor materials mentioned above for the semiconductor substrate 10. The semiconductor material that provides the n-type source/drain regions 44,46 can be compositionally the same as, or compositionally different from, the semiconductor channel material nanosheets 18 of the nFET that is present in the logic device region 100 and the semiconductor channel material nanosheets 18 in the second resistor device region 104. The semiconductor material that provides the n-type source/drain regions 44, 46 is however compositionally different from each sacrificial semiconductor material nanosheet 16. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the n-type source/drain regions 44, 46 can have a dopant concentration of from $1\times10^{20}$ atoms/cm$^3$ to $3\times10^{21}$ atoms/cm$^3$. In one example, the n-type source/drain regions 44, 46 are composed of phosphorus doped silicon.

Referring now to FIGS. 10A-10H, there are illustrated the exemplary structures shown in FIGS. 9A-9H, respectively, after forming an etch stop liner 48 and forming an interlayer dielectric (ILD) material layer 50. The etch stop liner 48 is typically a conformal layer that includes one of the dielectric materials mentioned above for the conformal dielectric material liner 36; in the first resistor device region 102 the etch stop liner 48 also includes the conformal dielectric material liner 36. In embodiments, the conformal dielectric material liner 36 can be removed from the second resistor device region 104 prior to formation of etch stop liner 48. The dielectric material that provides the etch stop liner 48 can be formed utilizing one of the deposition processes mentioned above for forming the conformal dielectric material liner 36.

The ILD material layer 50 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the ILD material layer 50 can include a multilayered structure that includes at least two different dielectric materials stacked one atop the other such as, for example, silicon nitride and silicon dioxide. The ILD material layer 50 can be formed by a deposition process such as, for example, CVD, PECVD, or spin-on coating. A planarization process can be performed after the deposition of the dielectric material that provides the ILD material layer 50, note that the planarization process removes the ILD material layer 50 and the etch stop liner 48 from the topmost surface of each hard mask capped sacrificial gate structure. In embodiments and as is illustrated in FIGS. 10A-10H, the third hard mask material layer 28 can also be removed during this planarization process. An upper portion of dielectric spacer 30 can also be removed by this planarization step. In the illustrated example, the ILD material layer 50 has a topmost surface that is coplanar with a topmost surface of the second hard mask material layer 26.

Referring now to FIGS. 11A-11H, there are illustrated the exemplary structures shown in FIGS. 10A-10H, respectively, after removing the hard mask capped sacrificial gate structure 26/24/22/20 and each sacrificial semiconductor material nanosheet 16 from the logic device region 100 to provide a logic device gate opening 52, the hard mask capped sacrificial gate structure 26/24/22/20 and each sacrificial semiconductor material nanosheet 16 from the first resistor device region 102 to provide a first nanosheet device gate opening 54, and the hard mask capped sacrificial gate structure 26/24/22/20 and each sacrificial semiconductor material nanosheet 16 from the second resistor device region 104 to provide a second nanosheet device gate opening 56. After this processing step, each semiconductor channel material nanosheet 18 in the logic device region 100, the first resistor device region 102 and the second resistor device region 104 is suspended.

The removal of each hard mask capped sacrificial gate structure 26/24/22/20 and each sacrificial semiconductor material nanosheet 16 from the logic device region 100, the first resistor device region 102 and the second resistor device region 104 includes a first etching process that is selective in removing the hard mask capped sacrificial gate structures 26/24/22/20, and a second etching process that is selective in removing the sacrificial semiconductor material nanosheets 16 relative to the semiconductor channel material nanosheets 18. For example, the second etch can be used to selectively remove SiGe sacrificial semiconductor material nanosheets relative to Si semiconductor channel material nanosheets. Removal of the sacrificial semiconductor material nanosheets 16 provides a vertical nanosheet stack of semiconductor channel material nanosheets 18 in each of the device regions.

Referring now to FIGS. 12A-12H, there is illustrated the exemplary structures shown in FIGS. 11A-11H, respectively, after forming a gate structure 58/60 containing a gate cap 62 in the logic device gate opening 52, a gate structure 58/60 containing a gate cap 62 in the first nanosheet device gate opening 54, and a gate structure 58/56 containing a gate cap 62 in the second nanosheet device gate opening 56. In some embodiments, gate cap 62 can be omitted from atop each of the gate structures 58/60.

Each gate structure includes at least a gate dielectric material layer 58 and a gate electrode 60. With each device region, the gate structure wraps around the semiconductor channel material nanosheet 18 of a given vertical nanosheet stack of semiconductor channel material nanosheets 18. As is known, the gate dielectric material layer 58 of the gate structure is in direct contact with physically exposed portions of each semiconductor channel material nanosheet 18, and the gate electrode 60 is located on the gate dielectric material layer 58. In some embodiments, the gate structure includes a work function metal (WFM) layer (not shown) located between the gate dielectric material layer 58 and the gate electrode 60.

The forming of the gate structures includes forming a continuous layer of gate dielectric material and a gate electrode material inside and each of logic device gate opening 52, the first nanosheet device gate opening 54 and the second nanosheet device gate opening 56. The continuous layer of gate dielectric material can include silicon oxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb $(Sc,Ta)O_3$), and/or lead zinc niobite (Pb(Zn,Nb)O). The high-k gate dielectric material can further include dopants such as lanthanum (La), aluminum (Al) and/or magnesium (Mg). The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_X$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM (work function metal) can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. “N-type threshold voltage shift” as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, “threshold voltage” is the lowest attainable gate voltage that will turn on a semiconductor device, e.g., transistor, by making the channel of the device conductive. The term “p-type threshold voltage shift” as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The layer of WFM is a conformal layer which can be formed by a conformal deposition process such as, for example, ALD, CVD or PECVD. The layer of WFM layer can have a thickness in the range of 0.5 nm to 10 nm, although other thickness above or below this range may be used as desired for a particular application.

After forming the continuous layer of the gate dielectric material, the optional layer of WFM and the gate electrode material, a planarization process such as, for example, chemical mechanical polishing (CMP), is used to remove the continuous layer of the gate dielectric material, the optional layer of WFM and the gate electrode material from outside the logic device gate opening 52, the first nanosheet device opening 54 and the second nanosheet device opening 56. The remaining continuous layer of the gate dielectric material that is present inside each of the logic device gate opening 52, the first nanosheet device opening 54 and the second nanosheet device opening 56 can be referred to as gate dielectric material layer 58, the remaining optional layer of WFM that is present inside each of the logic device gate opening 52, the first nanosheet device opening 54 and the second nanosheet device opening 56 can be referred to a WFM layer, and remaining gate electrode material that is present inside each of the logic device gate opening 52, the first nanosheet device opening 54 and the second nanosheet device opening 56 provides gate electrode 60.

The gate structure 58/60 that is formed within the logic device gate opening 52 provides a FET logic device (i.e., pFET and/or nFET) in the logic device region 100; the gate structure 58/60 within the logic device region 100 can be referred to a first gate structure, GS1. The gate structure 58/60 within the first nanosheet device opening 54 provides a first nanosheet device which lacks (i.e., is devoid of) any source/drain region; the gate structure 58/60 within the first resistor device region 102 can be referred to a second gate structure, GS2. The gate structure 58/60 that is formed within the second nanosheet device opening 56 provides a second nanosheet device that includes the n-type source/drain region 44; the gate structure 58/60 within the second resistor device region 104 can be referred to a third gate structure, GS3.

As is illustrated in the drawings, GS1 wraps around a first vertical nanosheet stack of semiconductor channel material nanosheets 18 present in the logic device region 100, GS2 wraps around a second vertical nanosheet stack of semiconductor channel material nanosheets 18 present in the first resistor device region 102, and GS3 around a third vertical nanosheet stack of semiconductor channel material nanosheets 18 present in the second resistor device region 104. In the present application, the first and third gate structures GS1 and GS3 together with their respective source/drain regions provide a functional device, while the second gate structure GS2 without the source/drain region provides a non-functional device.

When present, gate cap 62 can be composed of a hard mask material such as, for example, silicon nitride with or without an air gap. The gate cap 62 can be formed by a deposition process, followed by a planarization process.

Although the present application describes and illustrates utilizing the same materials from the gate dielectric material layer 58, the gate electrode 60, and the gate cap 62 in each of the device region, block mask technology can be employed to allow for distinct types of materials (i.e., gate dielectric material, gate electrode material and gate cap material) to be formed into the various device regions.

Referring now to FIGS. 13A-13H, there are illustrated the exemplary structures shown in FIGS. 12A-12H, respectively, after forming a S/D contact structure 68 in the logic device region 100. In embodiments, a contact liner 66 can be present along a sidewall and a bottom wall of the S/D contact structure 68. No S/D contact structure 68 is formed in the first resistor device region 102 and the second resistor device region 104. In embodiments, an additional ILD material can be formed atop the ILD material layer 50. The additional ILD material is typically compositionally the same as the dielectric material that provides the ILD material layer 50. The additional ILD material is typically formed on the ILD material layer 50 providing a new ILD material layer which is also labeled as element 50 in the drawings. The optional contact liner 66 and the S/D contact structure 68 are formed in a contact opening that is formed into the ILD material layer 50 that is located atop the S/D regions that are present in the logic device region 100.

In one or more embodiments in which a contact liner 66 is present, the contact liner 66 can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner 66 can be formed utilizing a conformal deposition process including PVD, RFPVD, CVD or ALD. The contact liner 66 that is formed can have a thickness ranging from 1 nm to 8 nm, although lesser and greater thicknesses can also be employed.

The S/D contact structure 68 includes a contact conductor material such as, for example, W, Cu, Al, Co, Ru, Mo, Os, Jr, Rh or an alloy thereof. The contact conductor material can be formed by any suitable deposition method such as, for example, ALD, CVD, PVD or plating. A planarization process can be used to remove the contact conductor material and the contact liner (when provided) that are located above the contact opening that is formed into the ILD material layer 50. The remaining contact conductor material and if present, the contact liner provide the S/D contact structure 68 and contact liner 66 illustrated in FIGS. 13A and 13B of the present application. In this embodiment, the S/D contact structure 68 has a topmost surface that is coplanar with at least a topmost surface of the ILD material layer 50.

Referring now to FIGS. 14A-14H, there are illustrated the exemplary structures shown in FIGS. 13A-13H, respectively, after forming a first dielectric material layer 70L and a metal resistor layer 72L in each of the logic device region 100, the first resistor device region 102, and the second resistor device region 104. The first dielectric material layer 70L and the metal resistor layer 72L are formed atop the ILD material layer 50 that is present in each of the device regions.

The first dielectric material layer 70L is composed of any resistor dielectric material including, for example, silicon dioxide or silicon nitride. The first dielectric material layer 70L can be formed utilizing a deposition process such as, for example, CVD, PECVD, PVD, or ALD. The first dielectric material layer 70L can have a thickness from 5 nm to 15 nm; although thicknesses for the first dielectric material layer 70L can be used besides the thickness specified herein.

The metal resistor layer 72L is composed of any metal-containing resistor material such as, for example, tungsten silicide (WSi), TiN, or TaN. The metal resistor layer 72L can be formed utilizing a deposition process such as, for example, CVD, PECVD, PVD, or ALD. The metal resistor layer 72L can have a thickness from 5 nm to 30 nm; although thicknesses for the metal resistor layer 72L can be used besides the thickness specified herein.

Figure 15B:
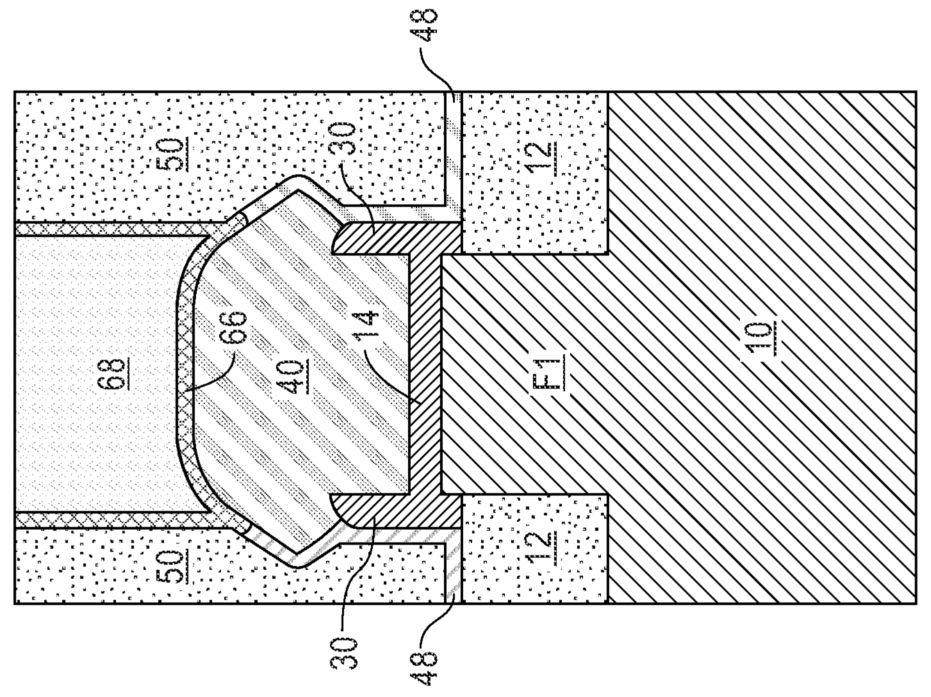
FIGS. 15A-15H are cross sectional views of the exemplary structures shown in FIGS. 14A-14H, respectively, after patterning the metal resistor layer and the first dielectric material layer in each of the logic device region, the first resistor device region, and the second resistor device region.
Figure 15A:
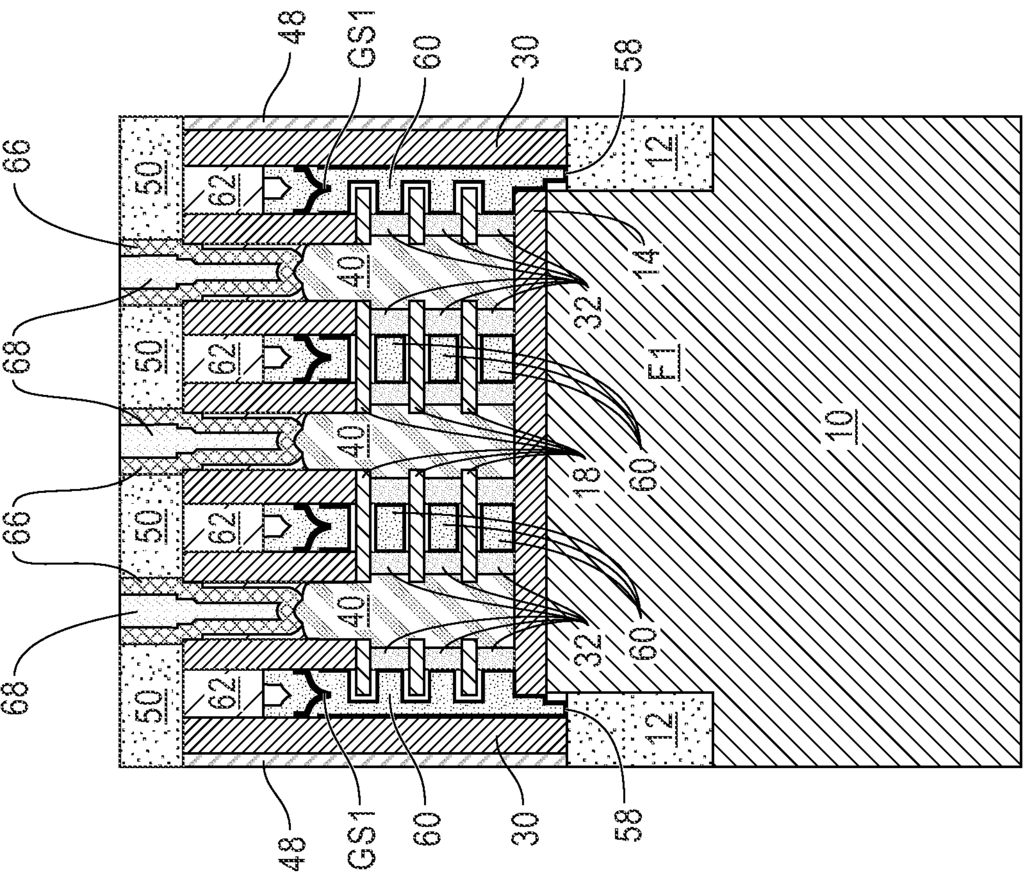
Figure 15C:
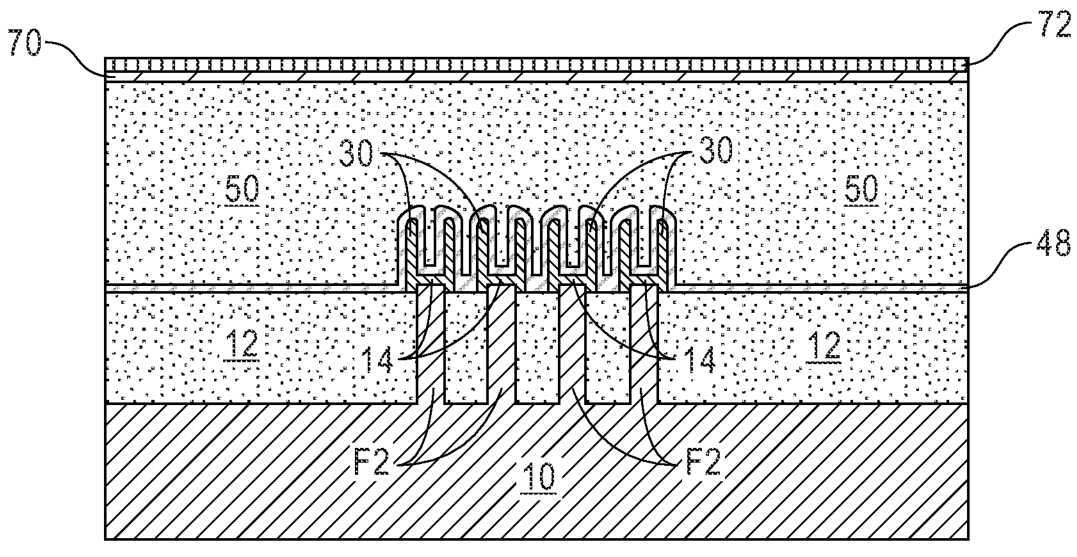
Figure 15D:
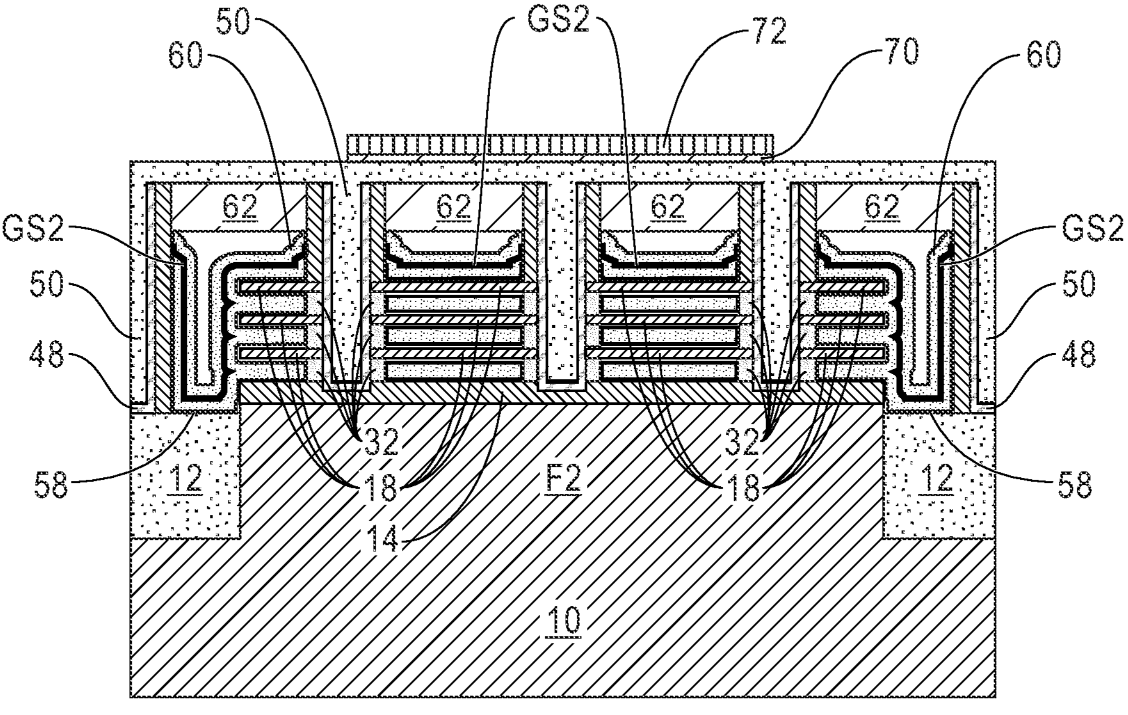
Figure 15E:
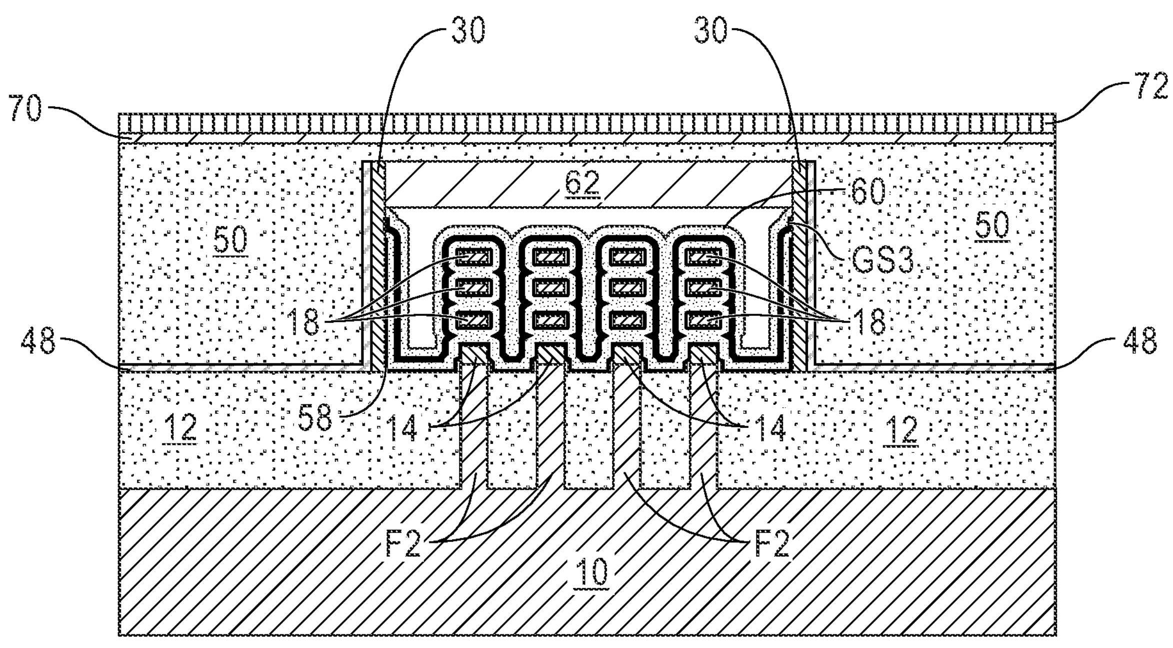
Figure 15F:
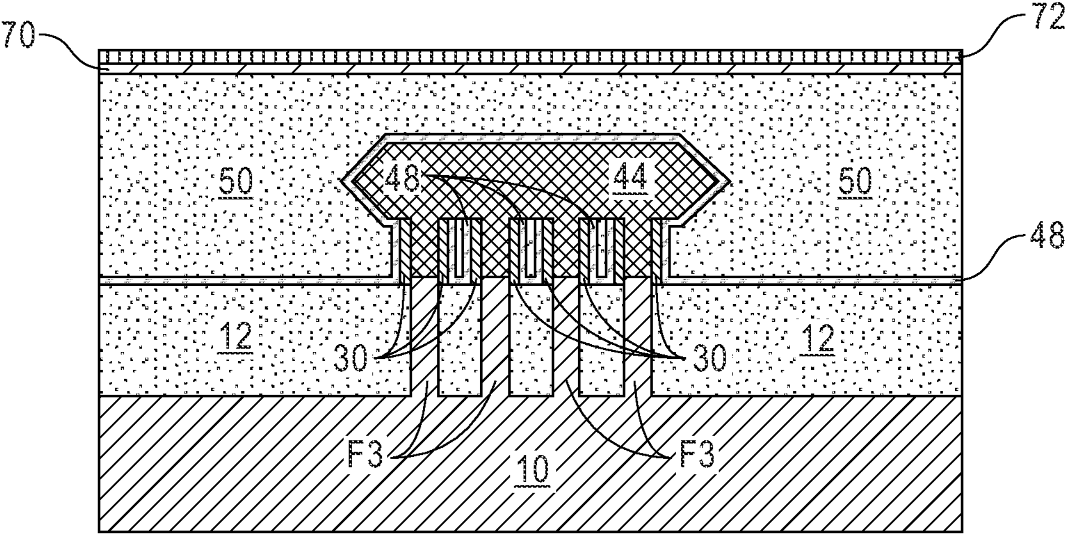
Figure 15G:
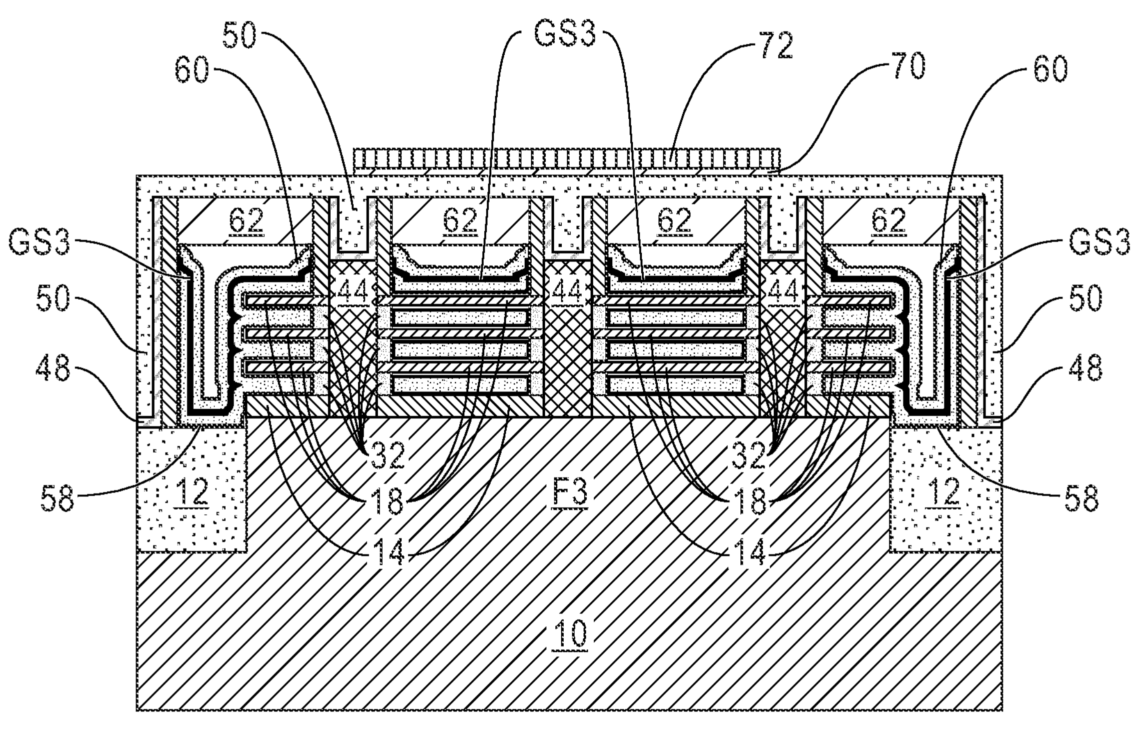
Figure 15H:
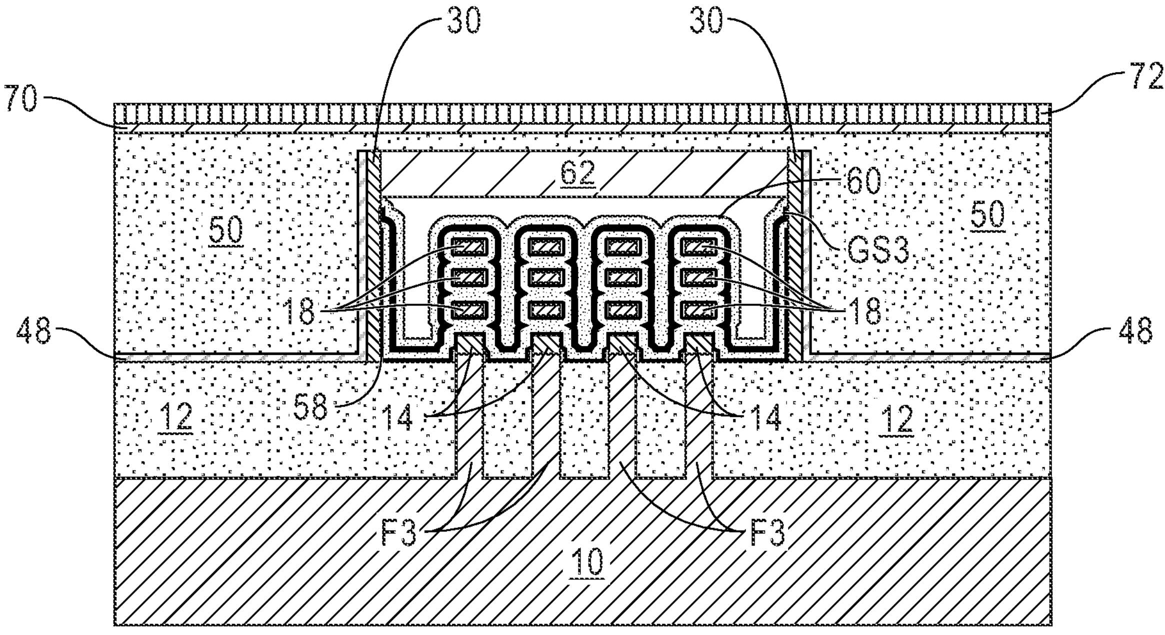
Figure 16B:
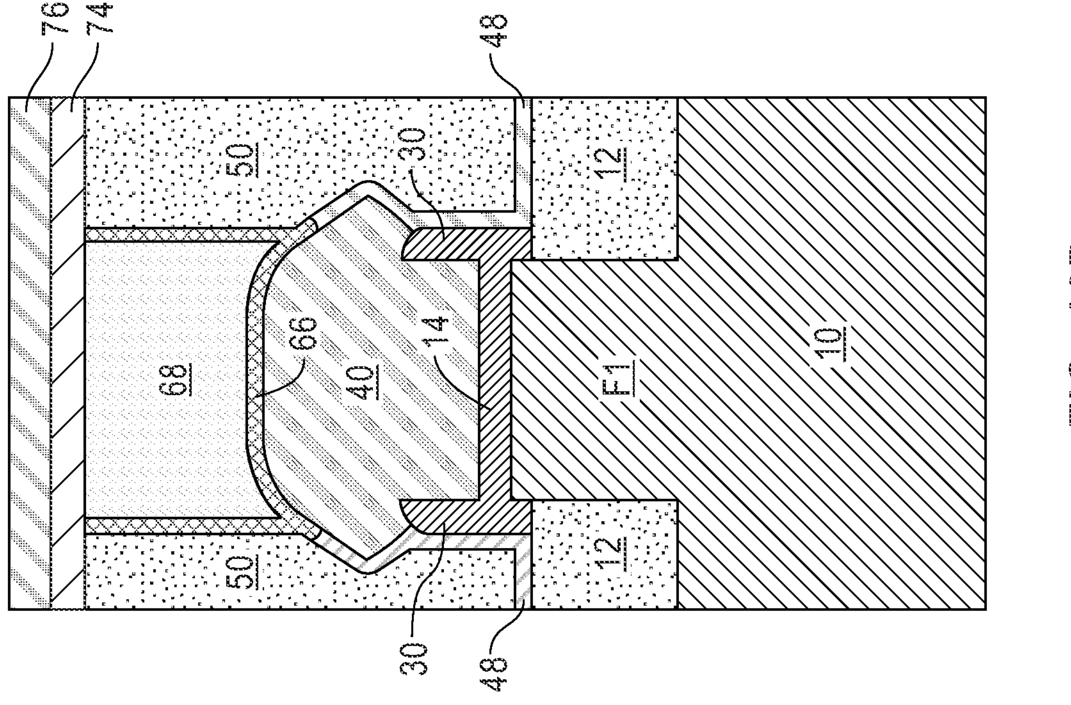
FIGS. 16A-16H are cross sectional views of the exemplary structures shown in FIGS. 15A-15H, respectively, after forming a dielectric material stack atop the patterned metal resistor layer and the patterned first dielectric material layer in each of the logic device region, the first resistor device region, and the second resistor device region.
Figure 16A:
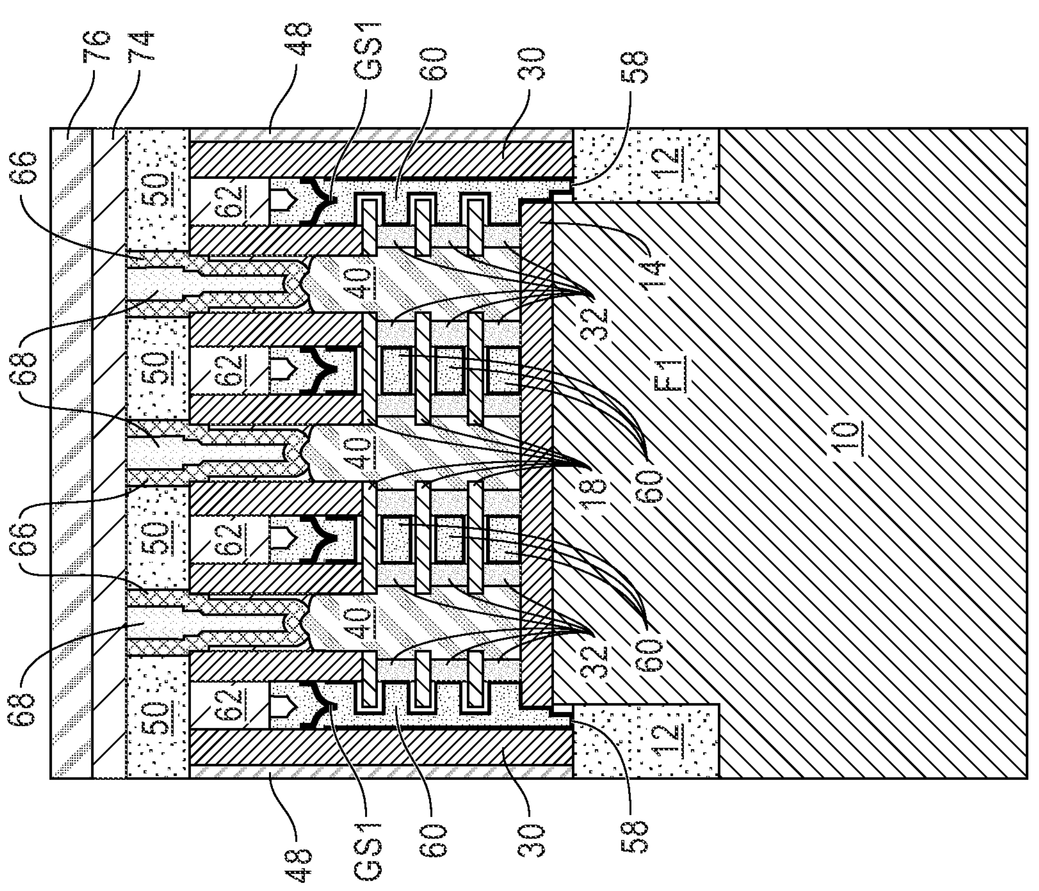
Figure 16C:
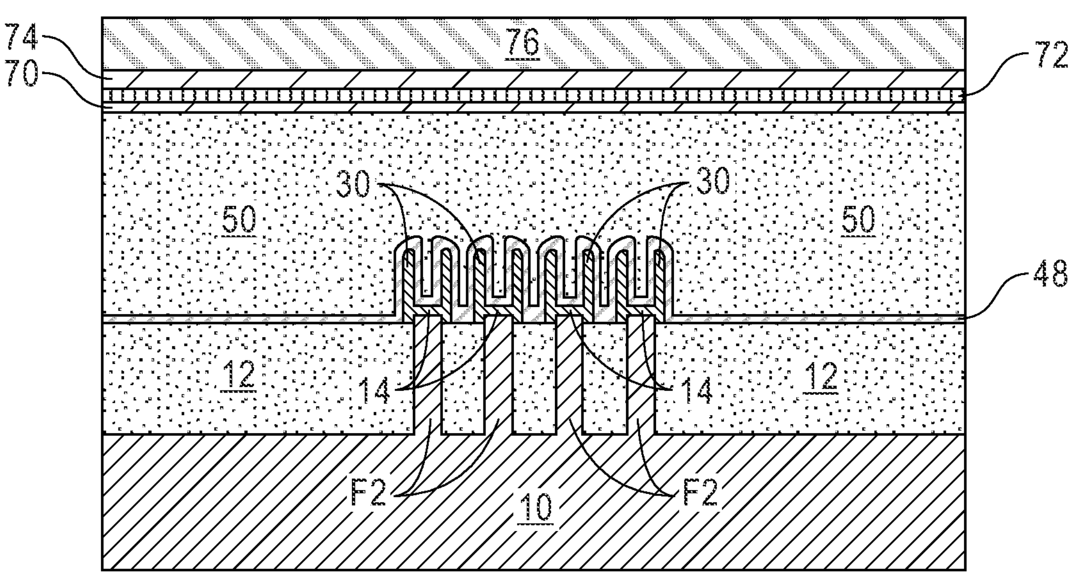
Figure 16D:
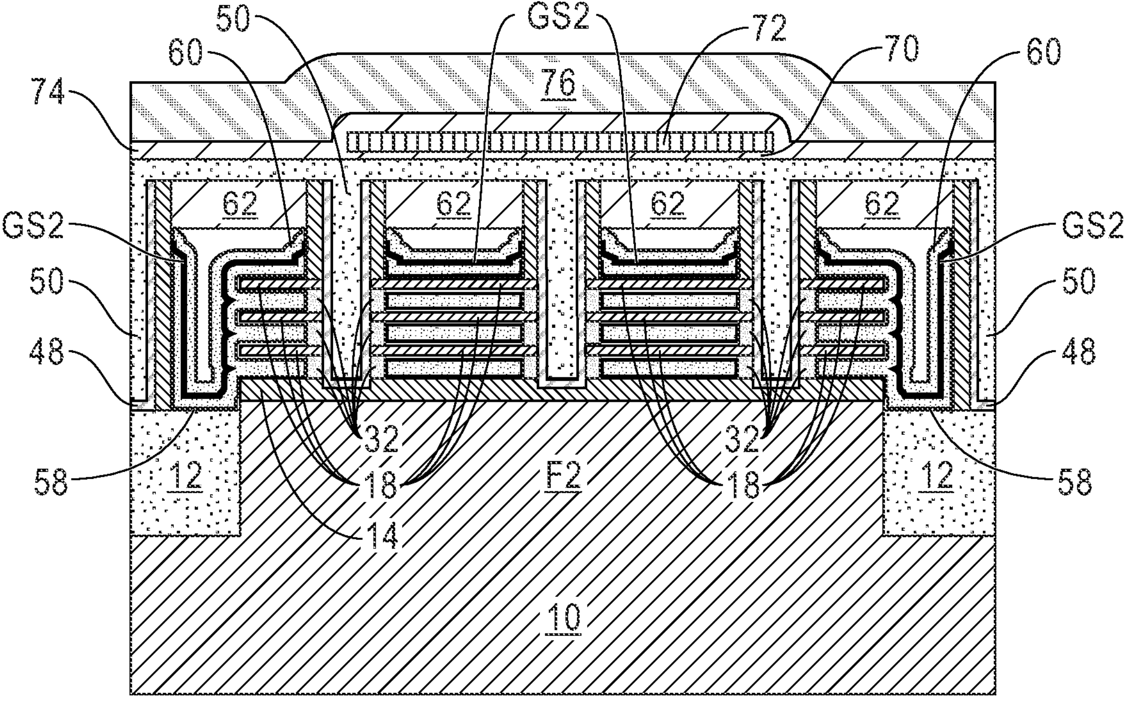
Figure 16E:
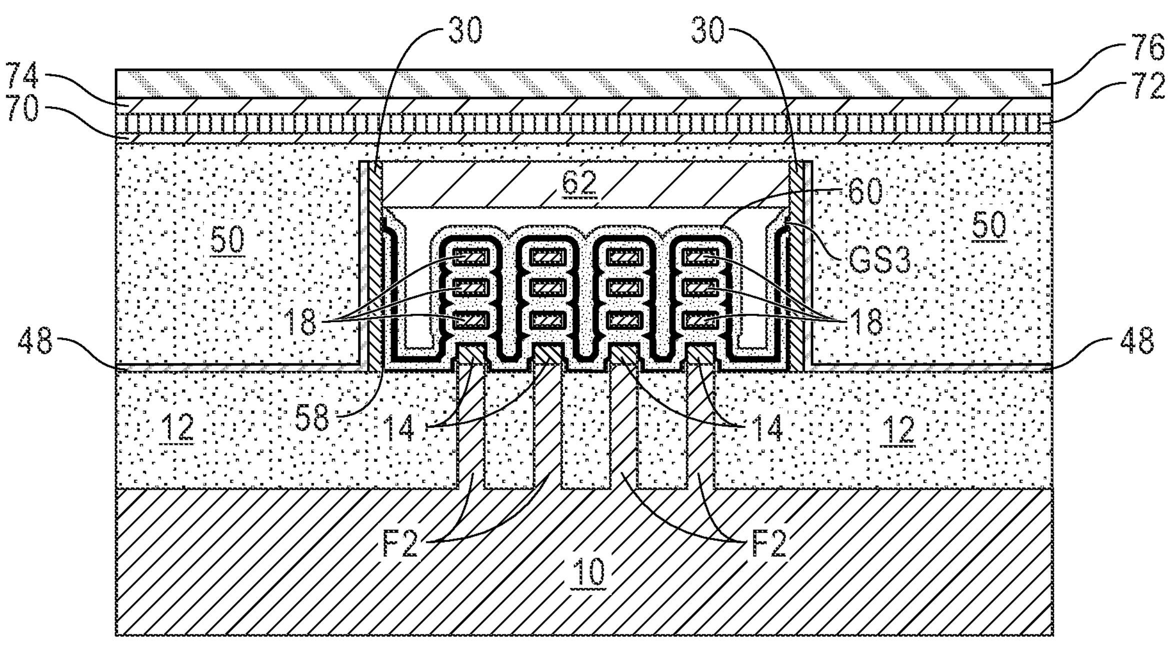
Figure 16F:
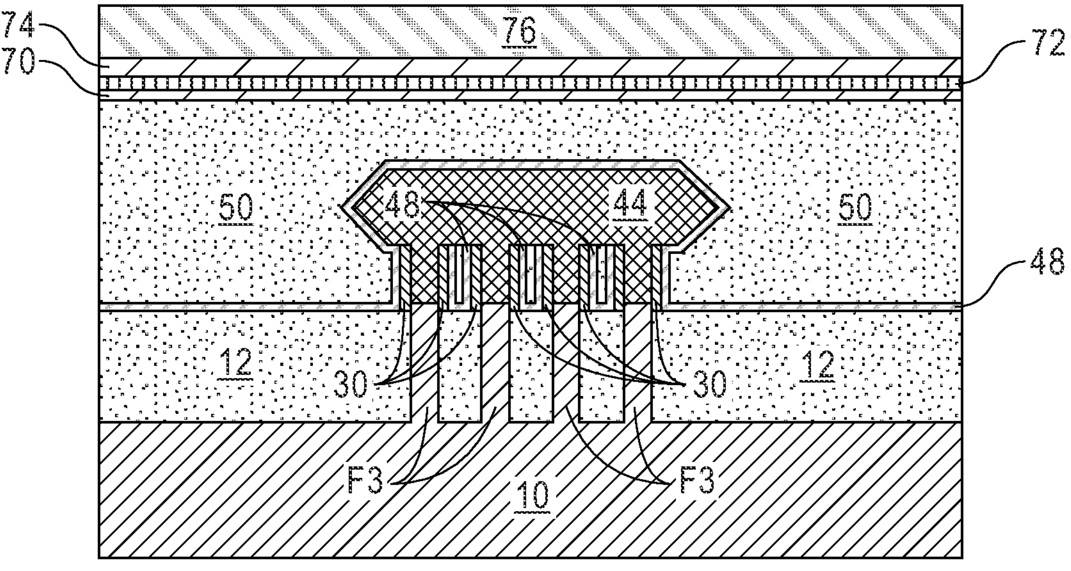
Figure 16G:
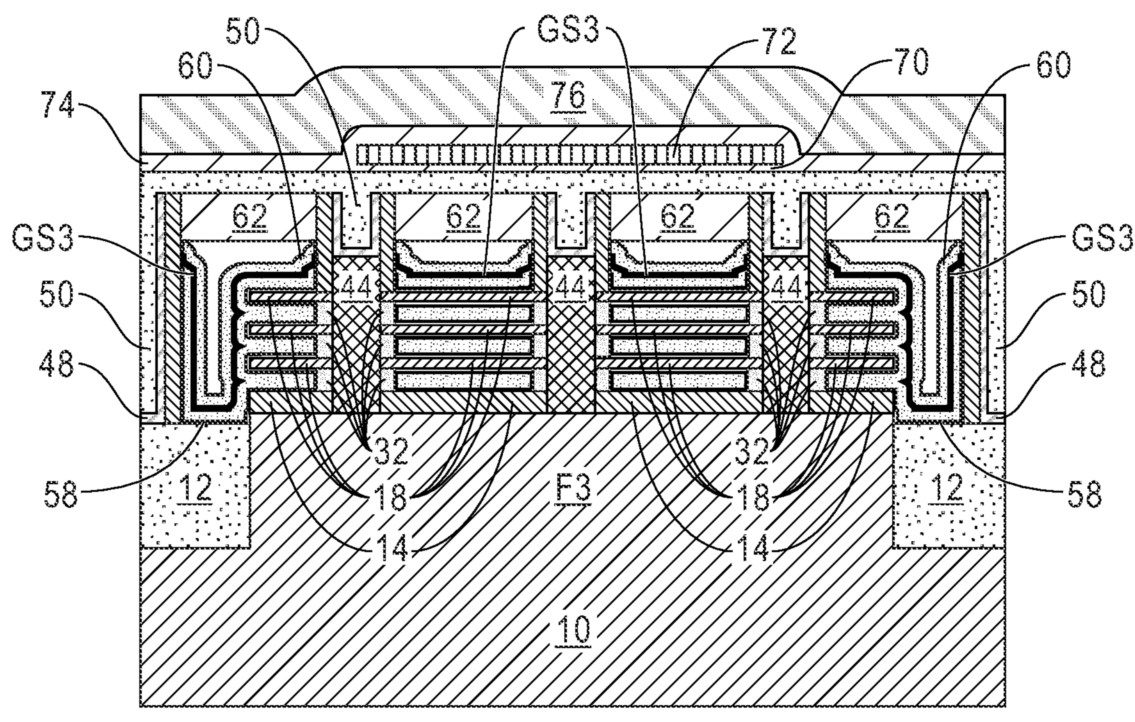
Figure 16H:
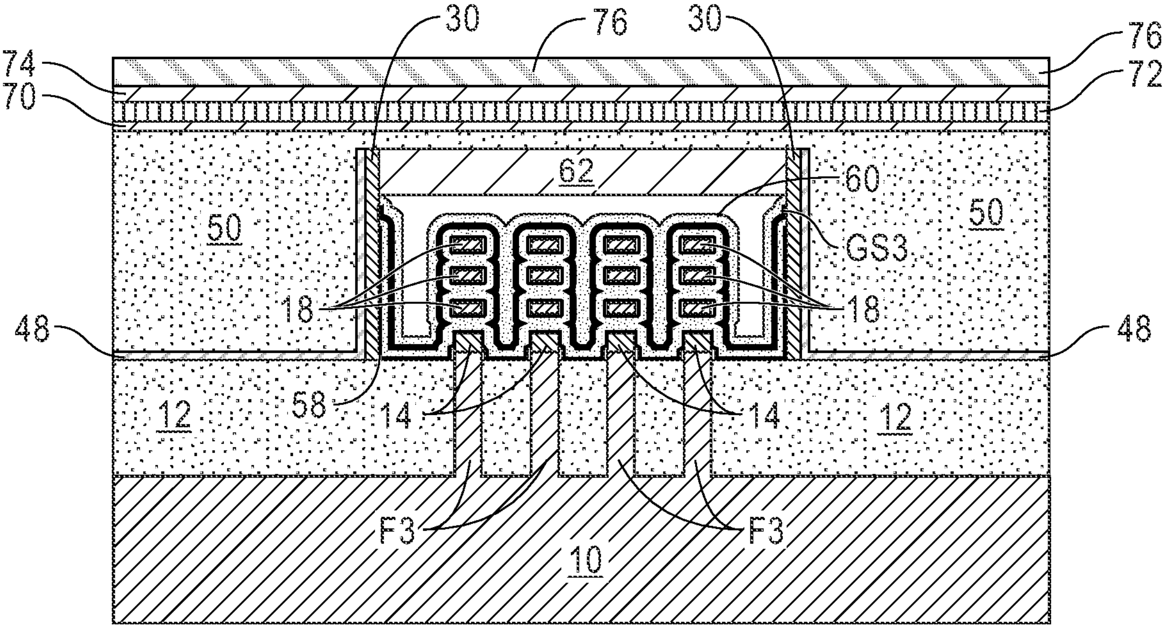

Referring now to FIGS. 15A-15H, there is illustrated the exemplary structures shown in FIGS. 14A-14H, respectively, after patterning the metal resistor layer 72L and the first dielectric material layer 70L in each of the logic device region 100, the first resistor device region 102, and the second resistor device region 104. Note that the patterning, which includes lithography and etching, completely removes the metal resistor layer 72L and the first dielectric material layer 70 from the logic device region 100 (See, FIGS. 15A and 15B), while a portion of the metal resistor layer 72L and a portion of the first dielectric material layer 70L remain in each of first resistor device region 102 and the second resistor device region 104. The portion of the metal resistor layer 72L that remains in the first resistor device region 102 and the second resistor device region 104 after this patterning process can be referred to as a metal resistor 72, while the portion of the first dielectric material layer 70L that remains in the first resistor device region and the second resistor device region 104 after this patterning process can be referred to as a first dielectric material base layer 70. As is shown, the first dielectric material base layer 70 is positioned entirely beneath the metal resistor 72. The metal resistor 72 and the first dielectric material base layer 70 are located above the first nanosheet device that is present in the first resistor device region 102, and above the second nanosheet device that is present in the second resistor device region 104. In the second resistor device region 104, and as is shown in FIG. 15F, the metal resistor 72 and the first dielectric material base layer 70 are also located above the n-type S/D region 44 that is present therein.

Referring now to FIGS. 16A-16H, there are illustrated the exemplary structures shown in FIGS. 15A-15H, respectively, after forming a dielectric material stack atop the patterned metal resistor layer and the patterned first dielectric material layer in each of the logic device region 100, the first resistor device region 102, and the second resistor device region 104. The dielectric material stack includes a second dielectric material layer 74 and a contact dielectric material layer 76. The second dielectric material layer 74 can include one of the dielectric materials mentioned above for the first dielectric material layer 70L, and the second dielectric material layer 74 can be formed utilizing one of the deposition processes mentioned above for forming the first dielectric material layer 70L. The second dielectric material layer 74 can have a thickness within the range mentioned above for the first dielectric material layer 70L. As well as being formed atop the metal resistor 72, the second dielectric material layer 74 contacts sidewalls of both the metal resistor 72 and the first dielectric material base layer 70.

The contact dielectric material layer 76 includes one of the dielectric materials mentioned above for the ILD material layer 50. The contact dielectric material layer 76 can be formed utilizing one of the deposition techniques mentioned above for forming the ILD material layer 50. The contact dielectric material layer 76 can have a thickness from 10 nm to 50 nm, although thicknesses are possible and can be used as the thickness of the contact dielectric material layer 76.

Figure 17B:
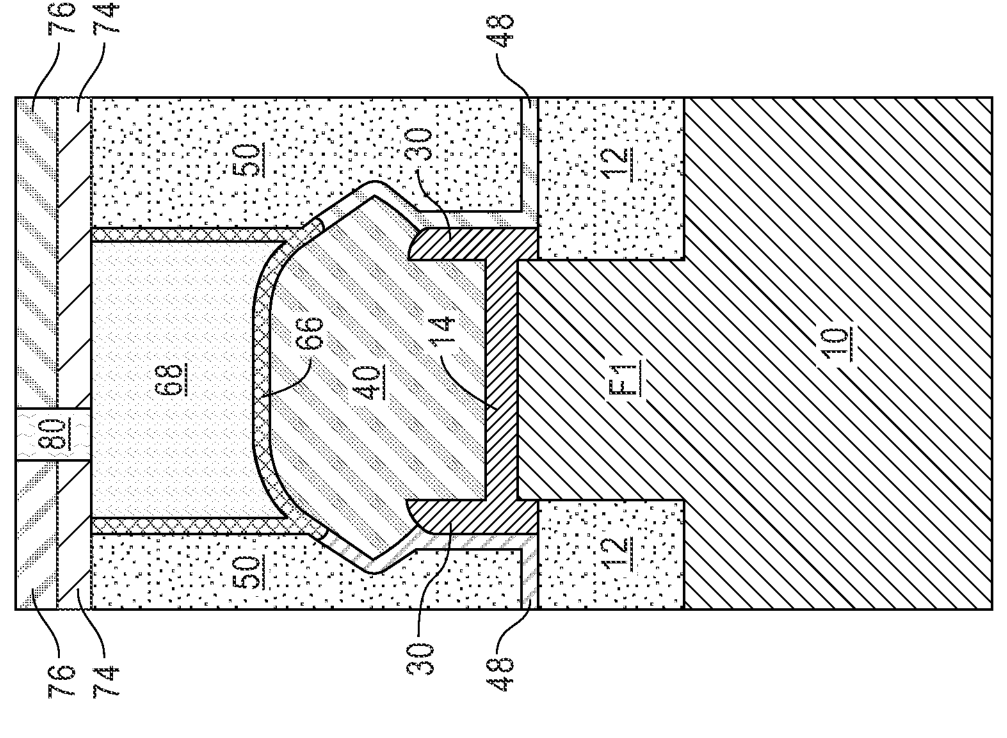
FIGS. 17A-17H are cross sectional views of the exemplary structures shown in FIGS. 16A-16H, respectively, after forming a contact structure in the dielectric material stack in each of logic device region, the first resistor device region and the second resistor device region.
Figure 17A:
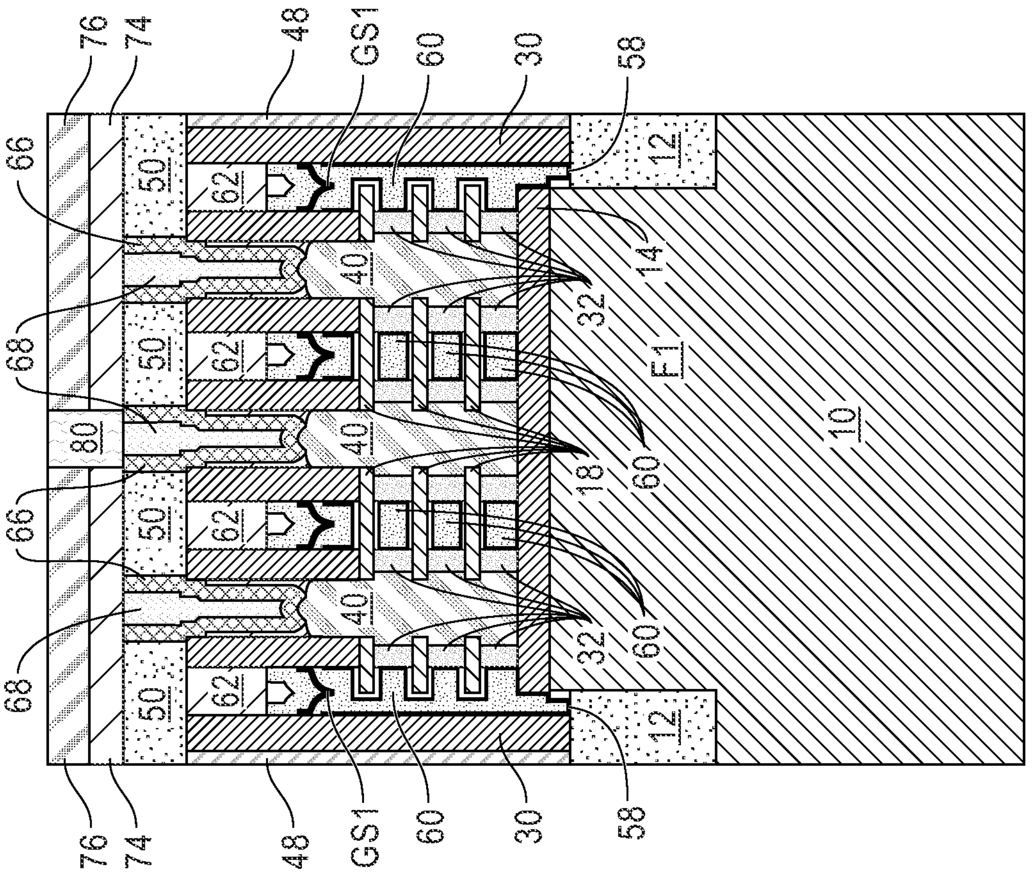
Figure 17C:
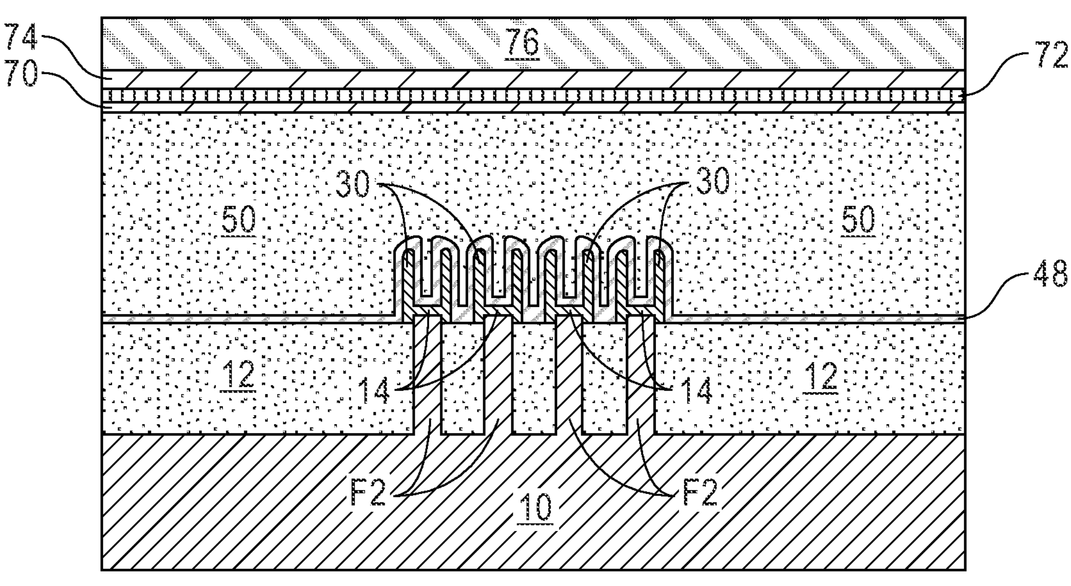
Figure 17D:
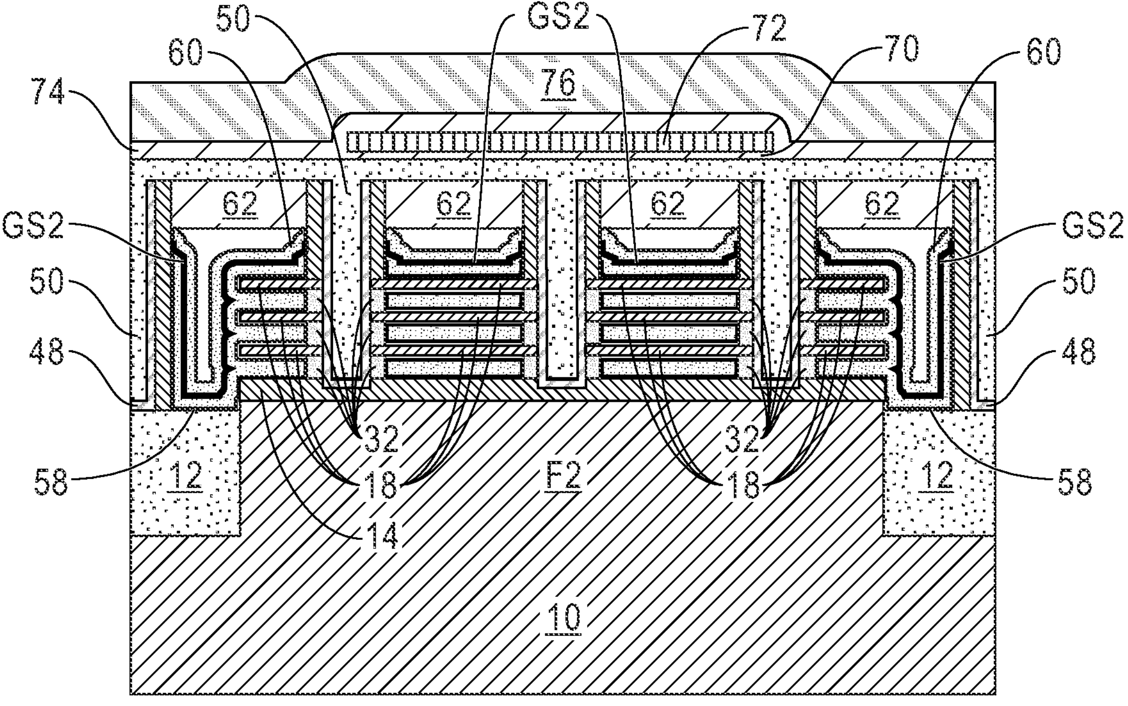
Figure 17E:
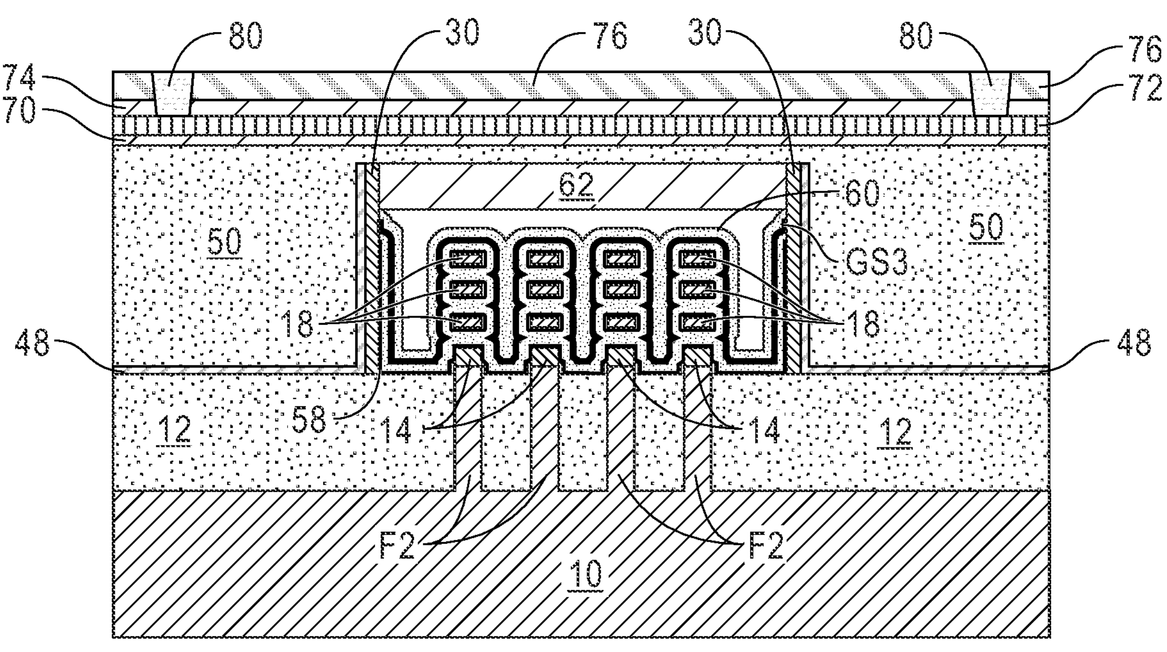
Figure 17F:
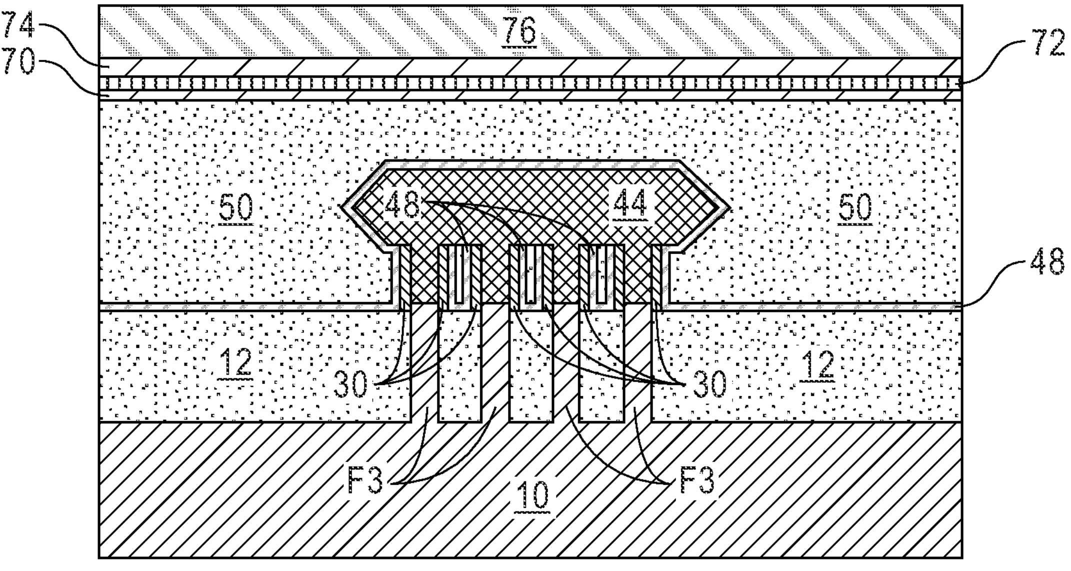
Figure 17G:
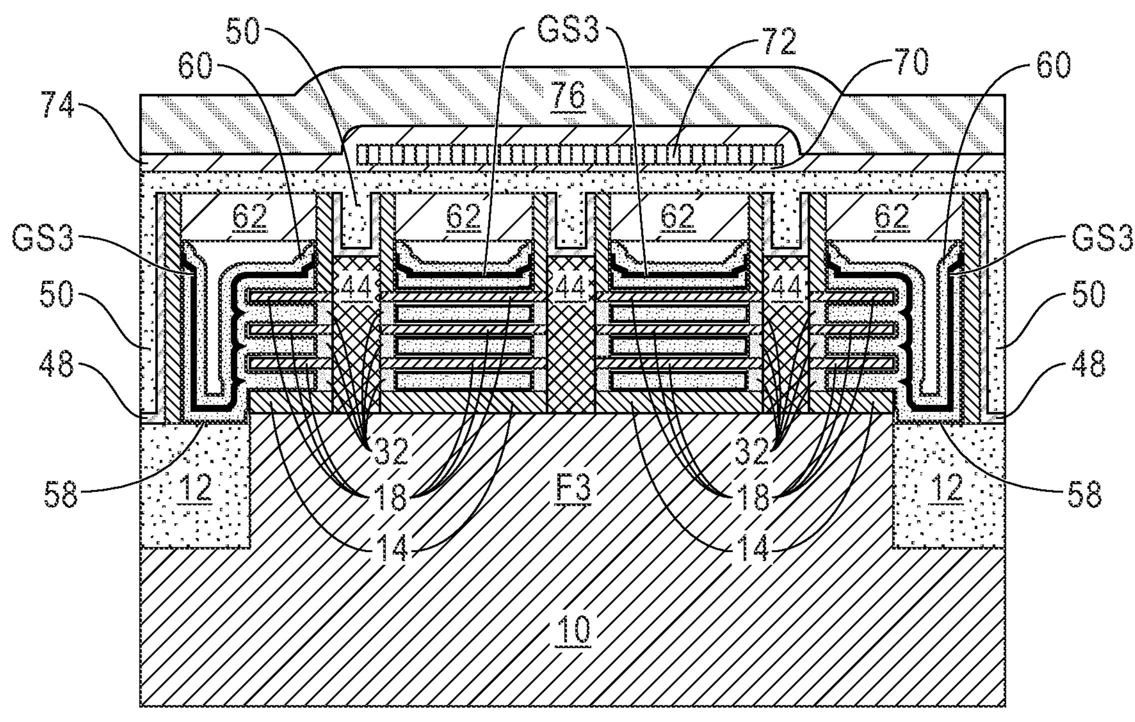
Figure 17H:
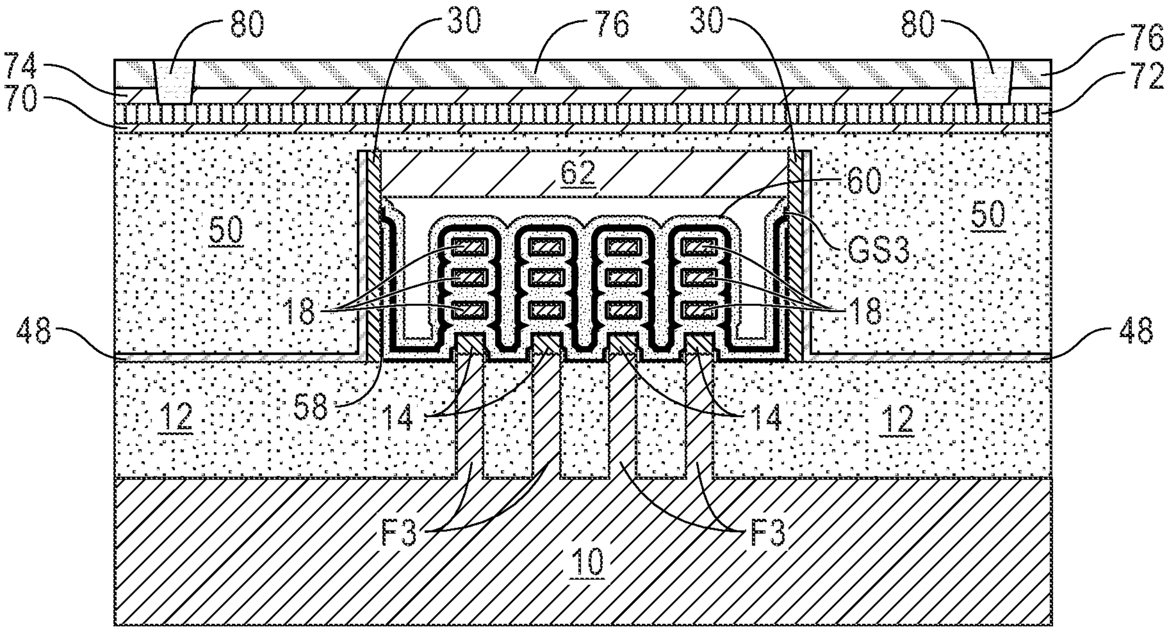

Referring now to FIGS. 17A-17H, there are illustrated the exemplary structures shown in FIGS. 16A-16H and 16B, respectively, after forming a contact structure 80 in the dielectric material stack 74/76 in each of logic device region 100, the first resistor device region 102 and the second resistor device region 104. The contact structure 80 in the logic device region contacts the S/D contact structure 68 as is shown in FIG. 17B, the contact structure 80 in the first resistor device region 102 contacts a surface of the metal resistor 72 that is present in the first resistor device region 102, while the contact structure in the second resistor device region 104 contact a surface of the metal resistor 72 that is present in the second resistor device region 104. Each contact structure 80 includes one of the contact metal conductor materials mentioned above for the S/D contact structure 68. A contact liner can be present along a sidewall and a bottom wall of each of the contact structures 80. The contact structures 80 with or without the contact liner can be formed utilizing the same technique as mentioned above for forming contact liner 66 and the S/D contact structure 68.

FIGS. 17A-17H illustrate a structure of the present application including a logic device region 100 located in a first portion of a semiconductor substrate 10, the logic device region 100 including a first gate structure, GS1 wrapped around a first vertical nanosheet stack of semiconductor channel material nanosheets 18 that is present in the logic device region 100, a source/drain region 40 extending from sidewalls of each of the semiconductor nanosheets 18 of the first vertical nanosheet stack, and a bottom dielectric isolation layer 14 separating the first gate structure GS1 and the source/drain region 40 from the first portion of the semiconductor substrate 10. The semiconductor structure further includes a first resistor device region 102 located in a second portion of the semiconductor substrate 10, the first resistor device region 102 including a second gate structure, GS2, wrapped around a second vertical nanosheet stack of semiconductor channel material nanosheets 18 that is present in the first resistor device region 102, a bottom dielectric isolation layer 14 separating the second gate structure GS2 from the second portion of the semiconductor substrate 10, and a first metal resistor 72 located above the second gate structure GS2, wherein the second gate structure is a component of a non-functional nanosheet device. The structure further includes a second resistor device region 104 located in a third portion of the semiconductor substrate 10, the second resistor device region 104 including a third gate structure, GS3, wrapped around a third vertical nanosheet stack of semiconductor channel material nanosheets 18 that is present in the second resistor device region 104, and a second metal resistor 72 located above the third gate structure, GS3, wherein the third gate structure, GS3, includes a source/drain region 44 located beneath the second metal resistor 72 that is present in the second resistor device region 104 and extending outward from sidewalls of each semiconductor channel material nanosheets 18 of the third vertical nanosheet stack. The first metal resistor 72 that is present in the first resistor device region 102 has a low capacitance defined above, while the second metal resistor 72 that is present in the second resistor device region 104 has low self-heating as defined above.

In a typical MOL resistor not of the present application, the parasitic capacitance is generated by the undesirable capacitor formed by the resistor and the semiconductor substrate along with the elements connect to the substrate. In the present application and in the first resistor device region 102, low capacitance is achieved by the presence of the bottom dielectric isolation layer 14 that isolates the semiconductor channel material nanosheets 18 from the second semiconductor sub-fins, F2. Furthermore, the absence of source/drain regions in the first resistor device region 102 also helps to reduce the parasitic capacitance in that resistor device region. In the present application, and in the second resistor device region 104, low self-heating is achieved by forming the punch through region 34 which permits the source/drain region (e.g., the n-type source/drain region 46) in the second resistor device region 104 to be in direct physical contact with a third semiconductor sub-fin, F3. This structural configuration helps to create a heat sink under the metal resistor 72 draining the heat through the source/drain region (e.g., the n-type source/drain region 46) that is present in the second resistor device region 104 and into the semiconductor substrate 10 via the third semiconductor sub-fin, F3. In the present application, the source/drain region (e.g., the n-type source/drain region 46) in the second resistor device region 104 will have a higher thermal conduction factor then the dielectric materials that surround the metal resistor 72.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a logic device region located in a first portion of a semiconductor substrate, the logic device region comprising a first gate structure wrapped around a first vertical nanosheet stack of semiconductor channel material nanosheets that is present in the logic device region, a source/drain region extending from sidewalls of each of the semiconductor channel material nanosheets of the first vertical nanosheet stack, and a bottom dielectric isolation layer separating the first gate structure and the source/drain region from the first portion of the semiconductor substrate;

a first resistor device region located in a second portion of the semiconductor substrate, the first resistor device region is entirely absent of any source/drain region and comprises a second gate structure wrapped around a second vertical nanosheet stack of semiconductor channel material nanosheets that is present in the first resistor device region, a bottom dielectric isolation layer separating the second gate structure from the second portion of the semiconductor substrate, and a first metal resistor located above the second gate structure, wherein the second gate structure is a component of a non-functional nanosheet device; and a second resistor device region located in a third portion of the semiconductor substrate, the second resistor device region comprising a third gate structure wrapped around a third vertical nanosheet stack of semiconductor channel material nanosheets that is present in the second resistor device region, and a second metal resistor located above the third gate structure, wherein the third gate structure includes a source/drain region located beneath the second metal resistor that is present in the second resistor device region and extending outward from sidewalls of each semiconductor channel material nanosheets of the third vertical nanosheet stack.

2. The semiconductor structure of claim 1, wherein the first metal resistor and the second metal resistor are both positioned between a first dielectric material base layer and a second dielectric material layer.

3. The semiconductor structure of claim 2, wherein the second dielectric material layer is present on sidewalls of the first metal resistor and the first dielectric material base layer, and on sidewalls of the second metal resistor and the first dielectric material base layer.

4. The semiconductor structure of claim 1, further comprising a source/drain contact structure contacting the source/drain region of the first gate structure.

5. The semiconductor structure of claim 4, further comprising a first contact structure contacting the source/drain region of the first gate structure, a second contact structure contacting the first metal resistor, and a third contact structure contacting the second metal resistor.

6. The semiconductor structure of claim 1, further comprising a first semiconductor sub-fin located beneath the first vertical nanosheet stack and a second semiconductor sub-fin located beneath the second vertical nanosheet stack.

7. The semiconductor structure of claim 6, wherein the first semiconductor sub-fin and the second semiconductor sub-fin are both in physical contact with the semiconductor substrate.

8. A semiconductor structure comprising:

a logic device region located in a first portion of a semiconductor substrate, the logic device region comprising a first gate structure wrapped around a first vertical nanosheet stack of semiconductor channel material nanosheets that is present in the logic device region, a source/drain region extending from sidewalls of each of the semiconductor channel material nanosheets of the first vertical nanosheet stack, and a bottom dielectric isolation layer separating the first gate structure and the source/drain region from the first portion of the semiconductor substrate;

a first resistor device region located in a second portion of the semiconductor substrate, the first resistor device region comprising a second gate structure wrapped around a second vertical nanosheet stack of semiconductor channel material nanosheets that is present in the first resistor device region, a bottom dielectric isolation layer separating the second gate structure from the second portion of the semiconductor substrate, and a first metal resistor located above the second gate structure, wherein the second gate structure is a component of a non-functional nanosheet device; and a second resistor device region located in a third portion of the semiconductor substrate, the second resistor device region comprising a third gate structure wrapped around a third vertical nanosheet stack of semiconductor channel material nanosheets that is present in the second resistor device region, and a second metal resistor located above the third gate structure, wherein the third gate structure includes a source/drain region located beneath the second metal resistor that is present in the second resistor device region and extending outward from sidewalls of each semiconductor channel material nanosheets of the third vertical nanosheet stack, wherein the source/drain region of the third gate structure extends upward from, and is in direct physical contact with, a surface of a semiconductor sub-fin that is located beneath the third gate structure and the third vertical nanosheet stack, and wherein the semiconductor fin is in contact with the semiconductor substrate.

9. The semiconductor structure of claim 8, wherein the source/drain region of the second gate structure drains heat generated by the second metal resistor into the semiconductor substrate that is connected to the semiconductor sub-fin.

10. The semiconductor structure of claim 8, wherein the third gate structure is spaced apart from the semiconductor sub-fin by a discontinuous bottom dielectric isolation layer that is present in the second resistor device region.

11. A semiconductor structure comprising:

a logic device region located in a first portion of a semiconductor substrate, the logic device region comprising a first gate structure wrapped around a first vertical nanosheet stack of semiconductor channel material nanosheets that is present in the logic device region, a source/drain region extending from sidewalls of each of the semiconductor channel material nanosheets of the first vertical nanosheet stack, and a bottom dielectric isolation layer separating the first gate structure and the source/drain region from the first portion of the semiconductor substrate; and a resistor device region located in a second portion of the semiconductor substrate, the resistor device region comprising a second gate structure wrapped around a second vertical nanosheet stack of semiconductor channel material nanosheets that is present in the resistor device region, and a metal resistor located above the second gate structure, wherein the second gate structure includes a source/drain region located beneath the metal resistor that is present in the resistor device region and extending outward from sidewalls of each semiconductor channel material nanosheets of the second vertical nanosheet stack, wherein the source/drain region of the second gate structure extends upward from, and is in direct physical contact with, a surface of a semiconductor sub-fin that is located beneath the second gate structure and the second vertical nanosheet stack, and wherein the semiconductor sub-fin is in contact with the semiconductor substrate.

12. The semiconductor structure of claim 11, wherein the source/drain region of the second gate structure drains heat generated by the metal resistor into the semiconductor substrate that is connected to the semiconductor sub-fin.

13. The semiconductor structure of claim 12, wherein the second gate structure is spaced apart from the semiconductor sub-fin by a discontinuous bottom dielectric isolation layer that is present in the resistor device region.

14. The semiconductor structure of claim 11, wherein the metal resistor is sandwiched between a first dielectric material base layer and a second dielectric material layer.

15. The semiconductor structure of claim 14, wherein the second dielectric material layer is present on sidewalls of the metal resistor and the first dielectric material base layer.

16. The semiconductor structure of claim 11, further comprising a source/drain contact structure contacting the source/drain region of the first gate structure.

17. The semiconductor structure of claim 16, further comprising a first contact structure contacting the source/drain region of the first gate structure, and a second contact structure contacting the metal resistor present in the resistor device region.

18. The semiconductor structure of claim 11, further comprising a logic device region semiconductor sub-fin located beneath the first vertical nanosheet stack.

* * * * *